United States Patent
Kim et al.

(10) Patent No.: US 12,256,564 B2
(45) Date of Patent: Mar. 18, 2025

(54) SEMICONDUCTOR DEVICE HAVING A LINER LAYER AND METHOD OF FABRICATING THE SAME

(71) Applicant: Samsung Electronics Co., Ltd., Suwon-si (KR)

(72) Inventors: Jinbum Kim, Seoul (KR); Dahye Kim, Seoul (KR); Seokhoon Kim, Suwon-si (KR); Jaemun Kim, Seoul (KR); Ilgyou Shin, Seoul (KR); Haejun Yu, Osan-si (KR); Kyungin Choi, Seoul (KR); Kihyun Hwang, Seongnam-si (KR); Sangmoon Lee, Suwon-si (KR); Seung Hun Lee, Hwaseong-si (KR); Keun Hwi Cho, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/415,765

(22) Filed: Jan. 18, 2024

(65) Prior Publication Data

US 2024/0162293 A1 May 16, 2024

Related U.S. Application Data

(63) Continuation of application No. 17/862,453, filed on Jul. 12, 2022, now Pat. No. 11,888,028, which is a
(Continued)

(30) Foreign Application Priority Data

May 25, 2020 (KR) .................. 10-2020-0062026

(51) Int. Cl.
*H10D 62/13* (2025.01)
*H10D 30/60* (2025.01)
(Continued)

(52) U.S. Cl.
CPC ............ *H10D 62/151* (2025.01); *H10D 30/60* (2025.01); *H10D 30/6735* (2025.01);
(Continued)

(58) Field of Classification Search
CPC ......... H01L 21/823814; H01L 29/7848; H01L 21/823418; H01L 29/0847; H01L 27/092;
(Continued)

(56) References Cited

U.S. PATENT DOCUMENTS 8,497,177 B1 7/2013 Chang et al.
8,785,285 B2 * 7/2014 Tsai .................... H01L 29/45
257/E21.409
(Continued)

FOREIGN PATENT DOCUMENTS

KR 1020180112897 A 10/2018
KR 1020190053426 A 5/2019
(Continued)

OTHER PUBLICATIONS

Examination report dated Jan. 22, 2025 from the Korean Patent Office for corresponding Korean Application No. 10-2020-0062026.

*Primary Examiner* — Sonya McCall-Shepard
(74) *Attorney, Agent, or Firm* — Muir Patent Law, PLLC

(57) ABSTRACT

A semiconductor device includes an active pattern on a substrate, a pair of source/drain patterns on the active pattern, a channel pattern between the pair of source/drain patterns, the channel pattern including semiconductor patterns stacked to be spaced apart from each other, and a gate electrode crossing the channel pattern and extending in a first direction. One of the pair of source/drain patterns includes a first semiconductor layer and a second semiconductor layer thereon. The first semiconductor layer is in contact with a first semiconductor pattern, which is one of
(Continued)

the stacked semiconductor patterns. The largest widths of the first semiconductor pattern, the first semiconductor layer, and the second semiconductor layer in the first direction are a first width, a second width, a third width, respectively, and the second width is larger than the first width and smaller than the third width.

20 Claims, 63 Drawing Sheets

Related U.S. Application Data continuation of application No. 17/128,153, filed on Dec. 20, 2020, now Pat. No. 11,417,731.

(51) Int. Cl.
| | | |
|---|---|---|
| *H10D 30/67* | (2025.01) | |
| *H10D 30/69* | (2025.01) | |
| *H10D 62/822* | (2025.01) | |
| *H10D 64/01* | (2025.01) | |
| *H10D 64/23* | (2025.01) | |
| *H10D 84/01* | (2025.01) | |
| *H10D 84/03* | (2025.01) | |
| *H10D 84/85* | (2025.01) | |
| *H10D 84/90* | (2025.01) | |

(52) U.S. Cl.
CPC ....... *H10D 30/6757* (2025.01); *H10D 30/797* (2025.01); *H10D 62/822* (2025.01); *H10D 64/017* (2025.01); *H10D 84/017* (2025.01); *H10D 84/0172* (2025.01); *H10D 84/038* (2025.01); *H10D 84/85* (2025.01)

(58) Field of Classification Search
CPC ............... H01L 29/42392; H01L 29/78; H01L 29/78696; H01L 21/8238; H01L 21/823412; H01L 21/823807; H01L 29/66545; H10D 30/6735; H10D 30/797; H10D 84/017
See application file for complete search history.

(56) References Cited

U.S. PATENT DOCUMENTS

| | | |
|---|---|---|
| 9,741,811 B2 | 8/2017 | Hatcher et al. |
| 10,062,782 B2 | 8/2018 | Cheng et al. |
| 10,217,816 B2 | 2/2019 | Bhuwalka et al. |
| 10,243,040 B1 | 3/2019 | Park et al. |
| 10,269,646 B2 | 4/2019 | More et al. |
| 10,381,479 B2 | 8/2019 | Sadana et al. |
| 10,522,616 B2 | 12/2019 | Cho et al. |
| 2019/0067441 A1 | 2/2019 | Yang et al. |
| 2019/0067490 A1 | 2/2019 | Yang et al. |
| 2019/0122937 A1 | 4/2019 | Cheng et al. |
| 2019/0157420 A1 | 5/2019 | Cheng et al. |
| 2019/0221483 A1 | 7/2019 | Mulfinger et al. |
| 2019/0341448 A1 | 11/2019 | Bourjot et al. |
| 2019/0341450 A1 | 11/2019 | Lee et al. |
| 2020/0006479 A1 | 1/2020 | Reznicek et al. |
| 2020/0006577 A1 | 1/2020 | Ching et al. |
| 2020/0044087 A1 | 2/2020 | Guha et al. |
| 2020/0161297 A1* | 5/2020 | Chen ................. H01L 21/02068 |
| 2020/0176565 A1* | 6/2020 | Ting ................... H01L 21/0262 |

FOREIGN PATENT DOCUMENTS

| | | |
|---|---|---|
| KR | 1020200009848 A | 1/2020 |
| TW | 202006953 A | 2/2020 |

* cited by examiner

SEMICONDUCTOR DEVICE HAVING A LINER LAYER AND METHOD OF FABRICATING THE SAME

CROSS-REFERENCE TO RELATED APPLICATIONS

This U.S. non-provisional patent application is a continuation of U.S. patent application Ser. No. 17/862,453, filed Jul. 12, 2022, which is a continuation of U.S. patent application Ser. No. 17/128,153, filed Dec. 20, 2020, in the U.S. Patent and Trademark Office, now U.S. Pat. No. 11,417,731, which claims priority under 35 U.S.C. § 119 to Korean Patent Application No. 10-2020-0062026, filed May 25, 2020, in the Korean Intellectual Property Office, the entire contents of all of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

An embodiment of the inventive concept provides a semiconductor device with improved reliability and electric characteristics.

An embodiment of the inventive concept provides a method of fabricating a semiconductor device with improved reliability and electric characteristics.

According to an embodiment of the inventive concept, a semiconductor device may include an active pattern on a substrate, a pair of source/drain patterns on the active pattern, a channel pattern interposed between the pair of source/drain patterns, the channel pattern including semiconductor patterns, which are stacked to be spaced apart from each other, and a gate electrode crossing the channel pattern and extending lengthwise in a first direction. One of the pair of source/drain patterns may include a first semiconductor layer and a second semiconductor layer on the first semiconductor layer. The first semiconductor layer may be in contact with a first semiconductor pattern, which is one of the stacked semiconductor patterns. The largest widths of the first semiconductor pattern, the first semiconductor layer, and the second semiconductor layer in the first direction may be a first width, a second width, a third width, respectively, and the second width may be larger than the first width and may be smaller than the third width.

According to an embodiment of the inventive concept, a semiconductor device may include an active pattern on a substrate, a pair of channel patterns on the active pattern, each of the pair of channel patterns including semiconductor patterns, which are stacked to be spaced apart from each other, a source/drain pattern interposed between the pair of channel patterns, a pair of gate electrodes crossing the pair of channel patterns, respectively, and a pair of gate spacers, which are respectively provided on both side surfaces of the pair of gate electrodes. The stacked semiconductor patterns may include a first semiconductor pattern. When viewed in a plan view taken at a level of the first semiconductor pattern, the source/drain pattern may be extended lengthwise from the first semiconductor pattern into a space between the pair of gate spacers, the source/drain pattern may cover at least a portion of an end of each of the pair of gate spacers, and the semiconductor device may further include a remnant semiconductor pattern interposed between a remaining portion of the end and the source/drain pattern.

According to an embodiment of the inventive concept, a semiconductor device may include a substrate including a PMOSFET region and an NMOSFET region, which are adjacent to each other in a first direction, first and second active patterns provided on the PMOSFET and NMOSFET regions, respectively, a pair of first source/drain patterns and a pair of second source/drain patterns provided on the first active pattern and the second active pattern, respectively, a first channel pattern interposed between the pair of first source/drain patterns and a second channel pattern interposed between the pair of second source/drain patterns, each of the first and second channel patterns including first, second, and third semiconductor patterns, which are sequentially stacked to be spaced apart from each other, first and second gate electrodes crossing the first and second channel patterns respectively and extending lengthwise in the first direction, first and second gate insulating layers, which are respectively interposed between the first channel pattern and the first gate electrode and between the second channel pattern and the second gate electrode, first and second gate spacers provided on side surfaces of the first and second gate electrodes, respectively, first and second gate capping patterns provided on top surfaces of the first and second gate electrodes, respectively, a first interlayer insulating layer on the first and second gate capping patterns, active contacts penetrating the first interlayer insulating layer and being coupled to the first and second source/drain patterns, respectively, gate contacts penetrating the first interlayer insulating layer and being coupled to the first and second gate electrodes, respectively, a second interlayer insulating layer on the first interlayer insulating layer, a first metal layer provided in the second interlayer insulating layer, a third interlayer insulating layer on the second interlayer insulating layer, and a second metal layer provided in the third interlayer insulating layer. Each of the first and second gate electrodes may include a first portion interposed between the substrate and the first semiconductor pattern, a second portion interposed between the first and second semiconductor patterns, a third portion interposed between the second and third semiconductor patterns, and a fourth portion on the third semiconductor pattern. The first metal layer may include first interconnection lines, which are electrically and respectively connected to the active and gate contacts and are extended lengthwise in a second direction crossing the first direction to be parallel to each other. The second metal layer may include second interconnection lines, which are electrically and respectively connected to the first interconnection lines and are extended lengthwise in the first direction to be parallel to each other. One of the pair of first source/drain patterns may include a first semiconductor layer and a second semiconductor layer on the first semiconductor layer. The first semiconductor layer may be in contact with the first semiconductor pattern of the first channel pattern. The largest widths of the first semiconductor pattern of the first channel pattern, the first semiconductor layer, and the second semiconductor layer in the first direction may be first, second, and third widths, respectively, and the second width may be larger than the first width and may be smaller than the third width.

According to an embodiment of the inventive concept, a semiconductor device may include an active pattern on a substrate, a pair of source/drain patterns on the active pattern, a channel pattern interposed between the pair of source/drain patterns, the channel pattern including semiconductor patterns, which are stacked to be spaced apart from each other, a gate electrode crossing the channel pattern, the gate electrode including a first portion filling a space between adjacent ones of the semiconductor patterns, and a liner layer provided in the space and interposed between the first portion and the adjacent ones of the semiconductor patterns. The liner layer may include the same semiconductor material as the semiconductor patterns, and the liner layer may be interposed between the first portion and one of the pair of source/drain patterns to cover a side surface of the one of the pair of source/drain patterns.

DETAILED DESCRIPTION

Figure 1:
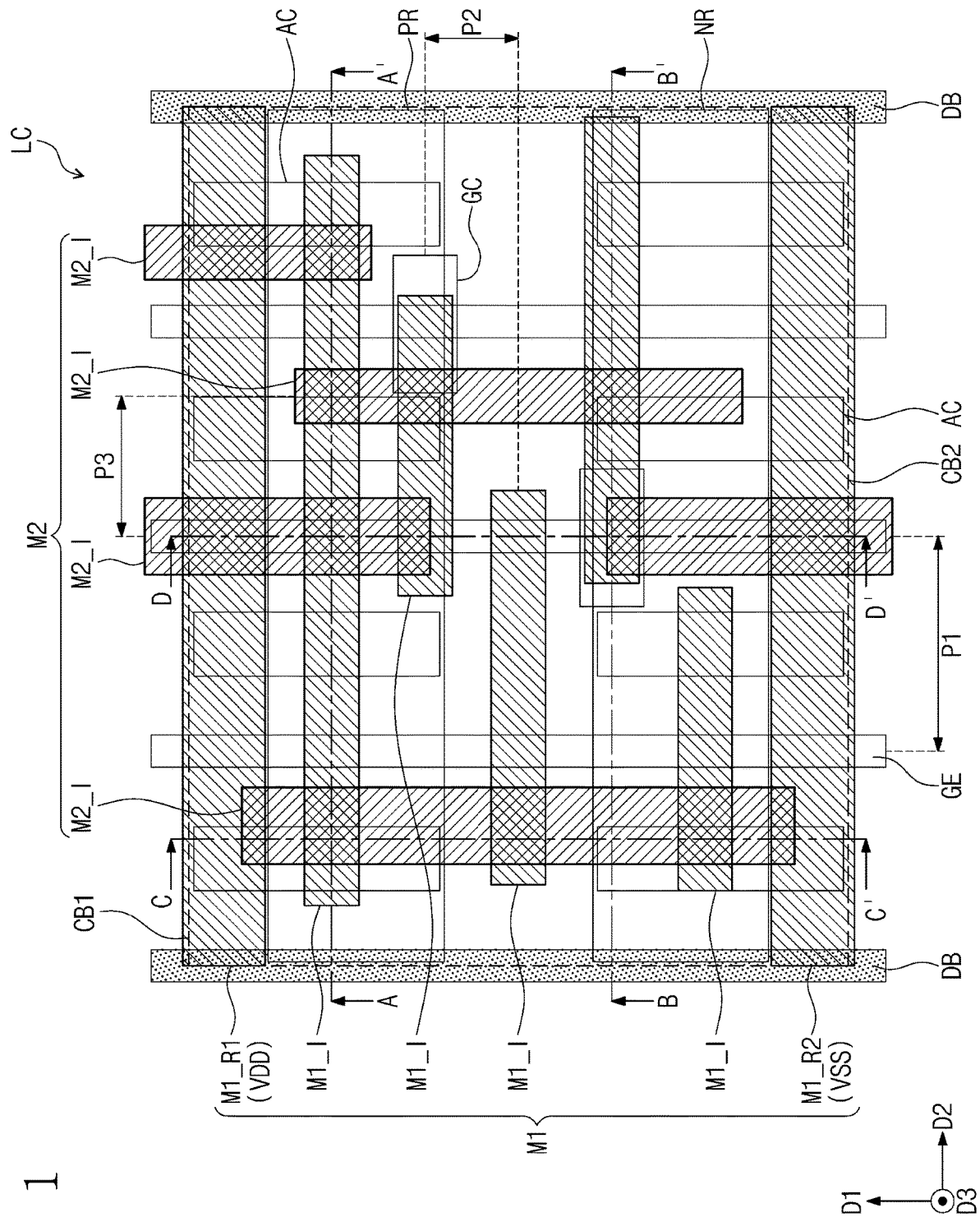
FIG. 1 is a plan view illustrating a semiconductor device according to an example embodiment of the inventive concept.

The present disclosure will now be described more fully hereinafter with reference to the accompanying drawings, in which various embodiments are shown. In the drawings, like numbers refer to like elements throughout. Herein, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 2A:
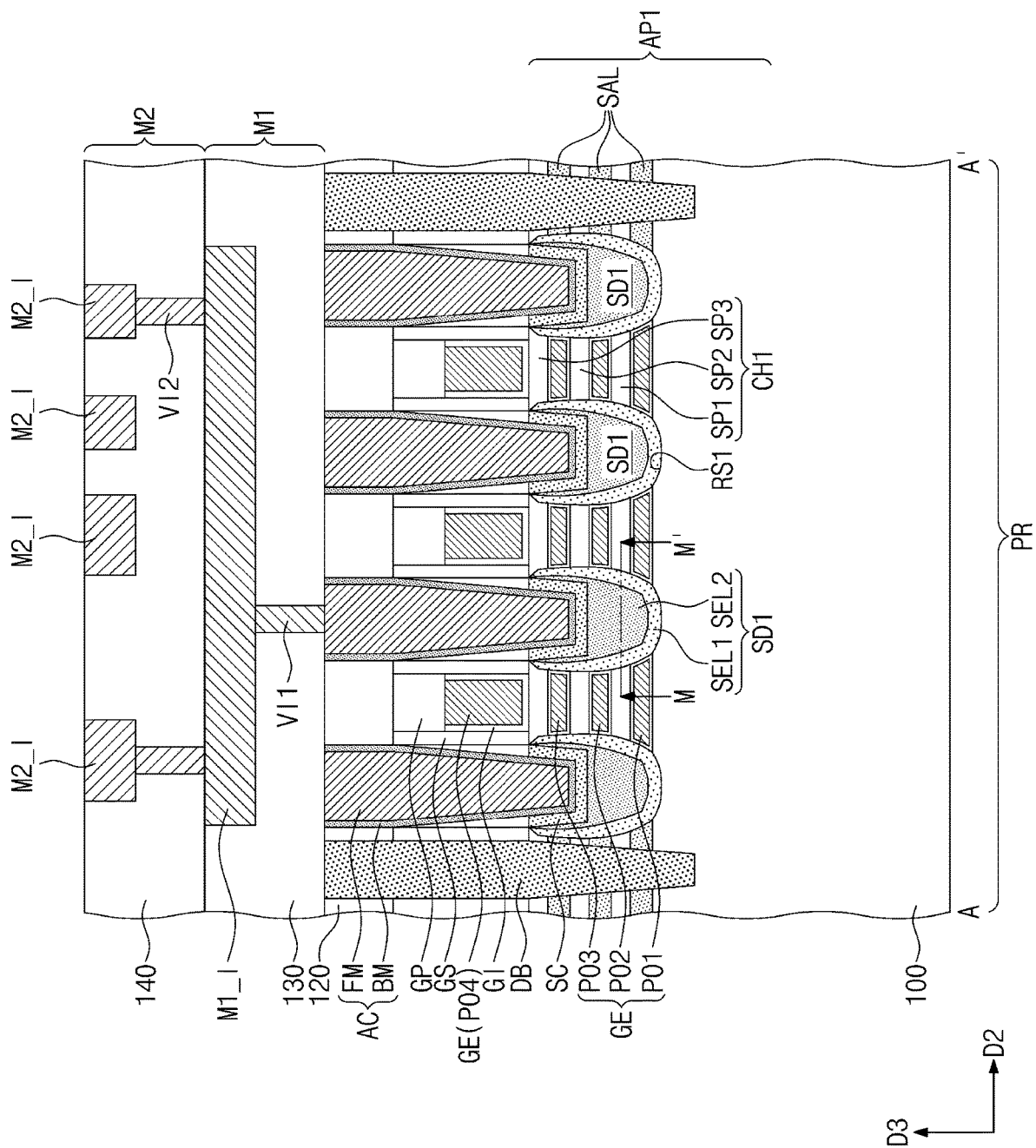
FIGS. 2A to 2D are sectional views respectively taken along lines A-A', B-B', C-C', and D-D' of FIG. 1.
Figure 2B:
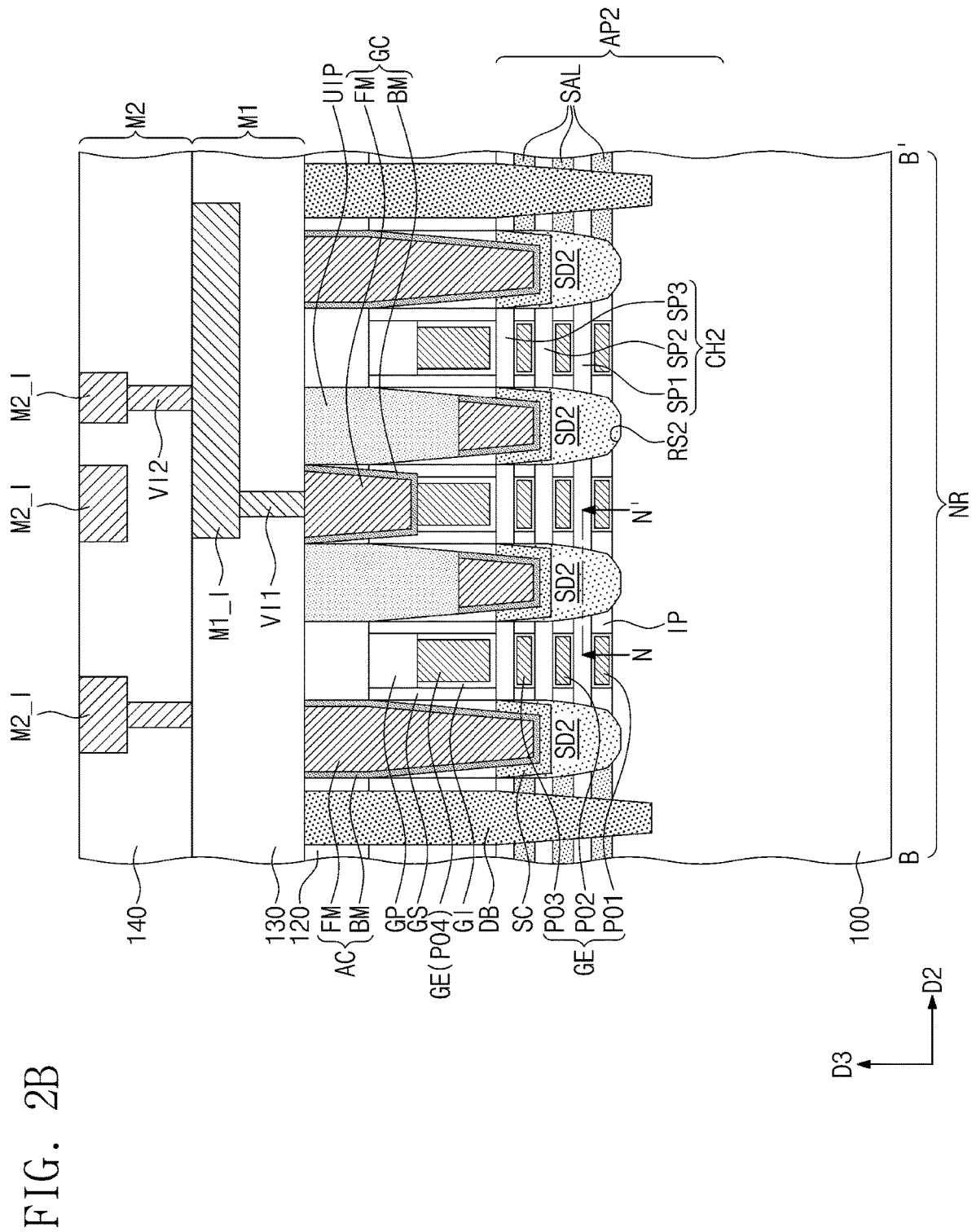
Figure 2C:
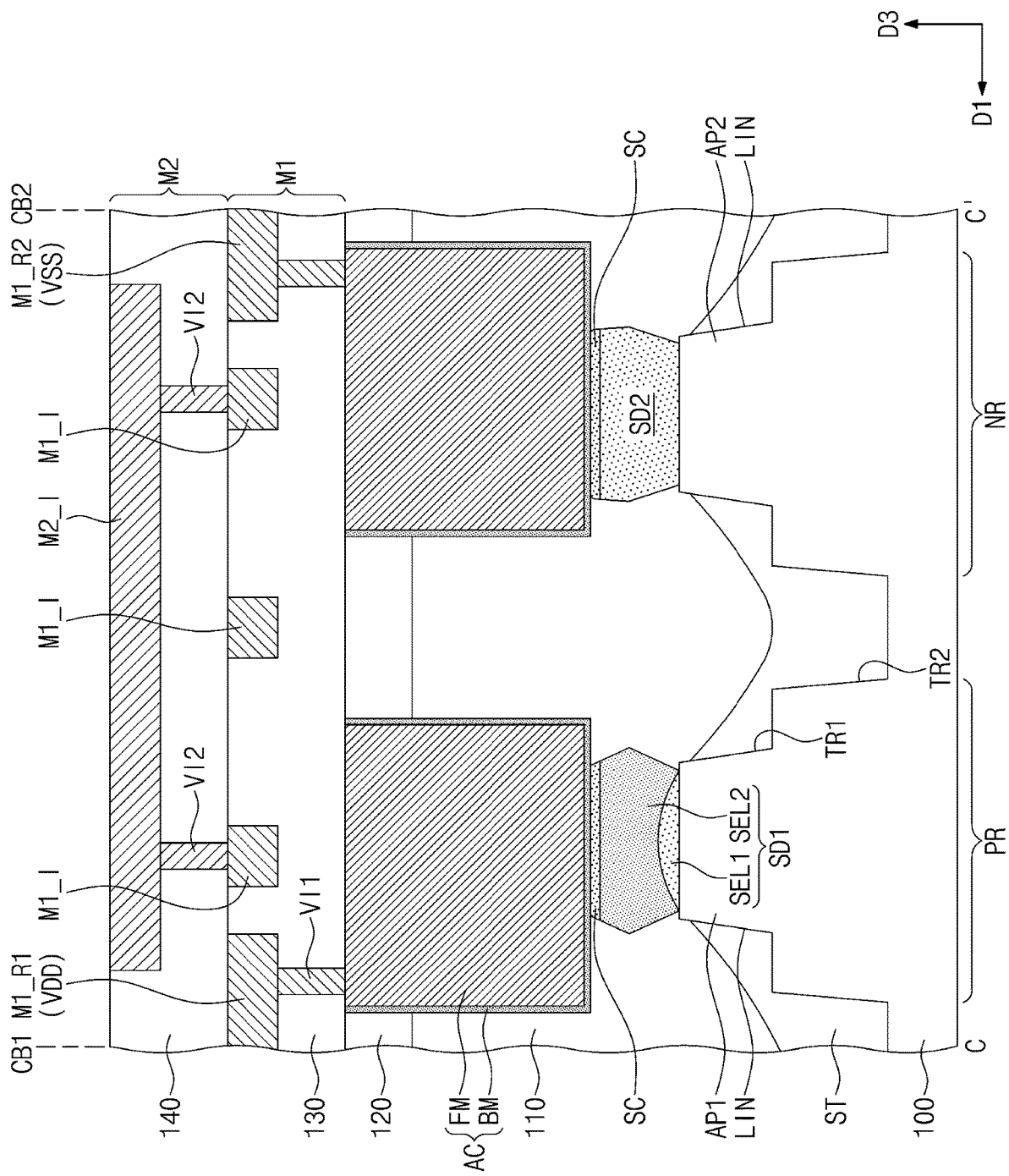
Figure 2D:
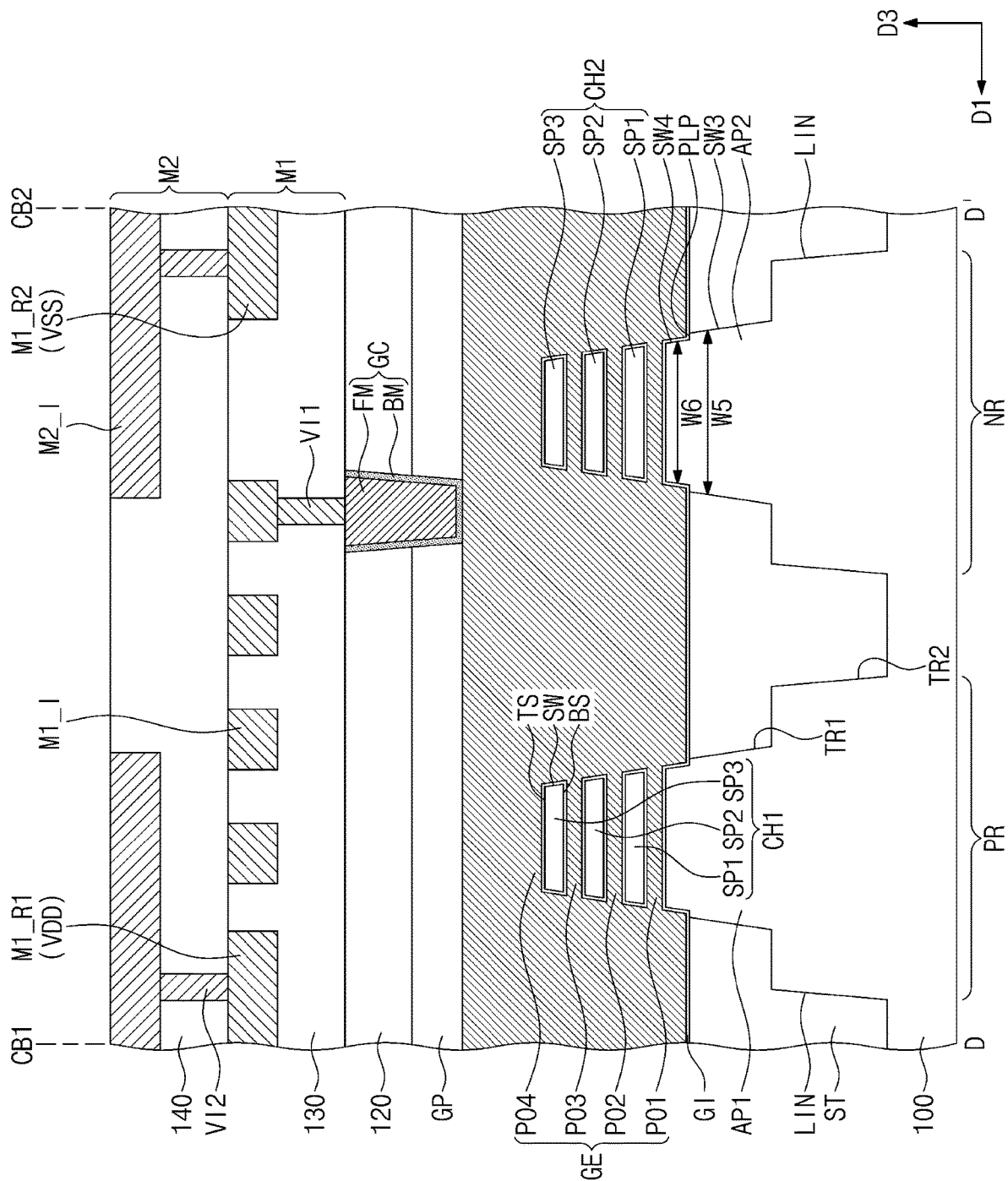
Figure 3A:
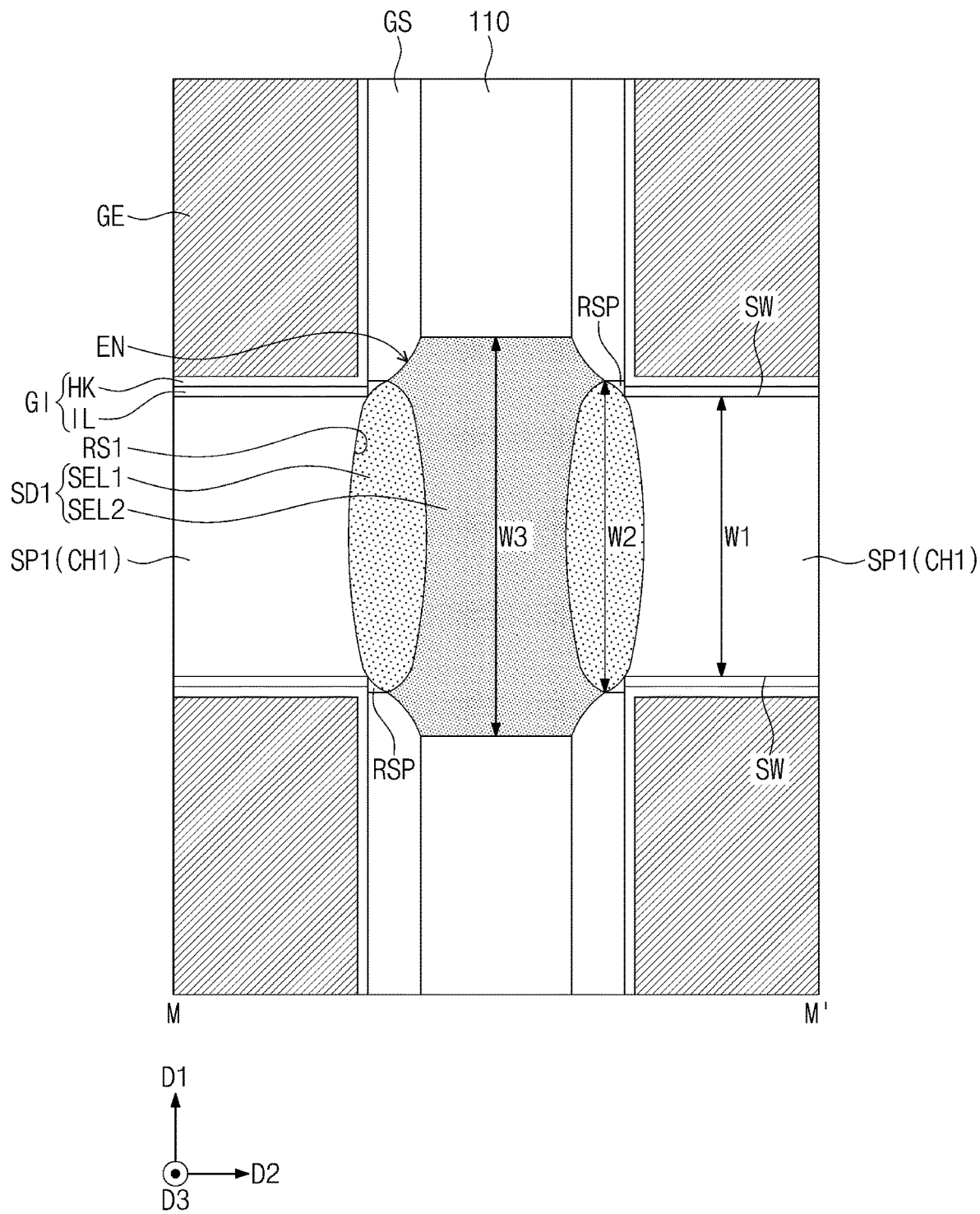
FIG. 3A is a top plan view taken at a level M-M' of FIG. 2B.
Figure 3B:
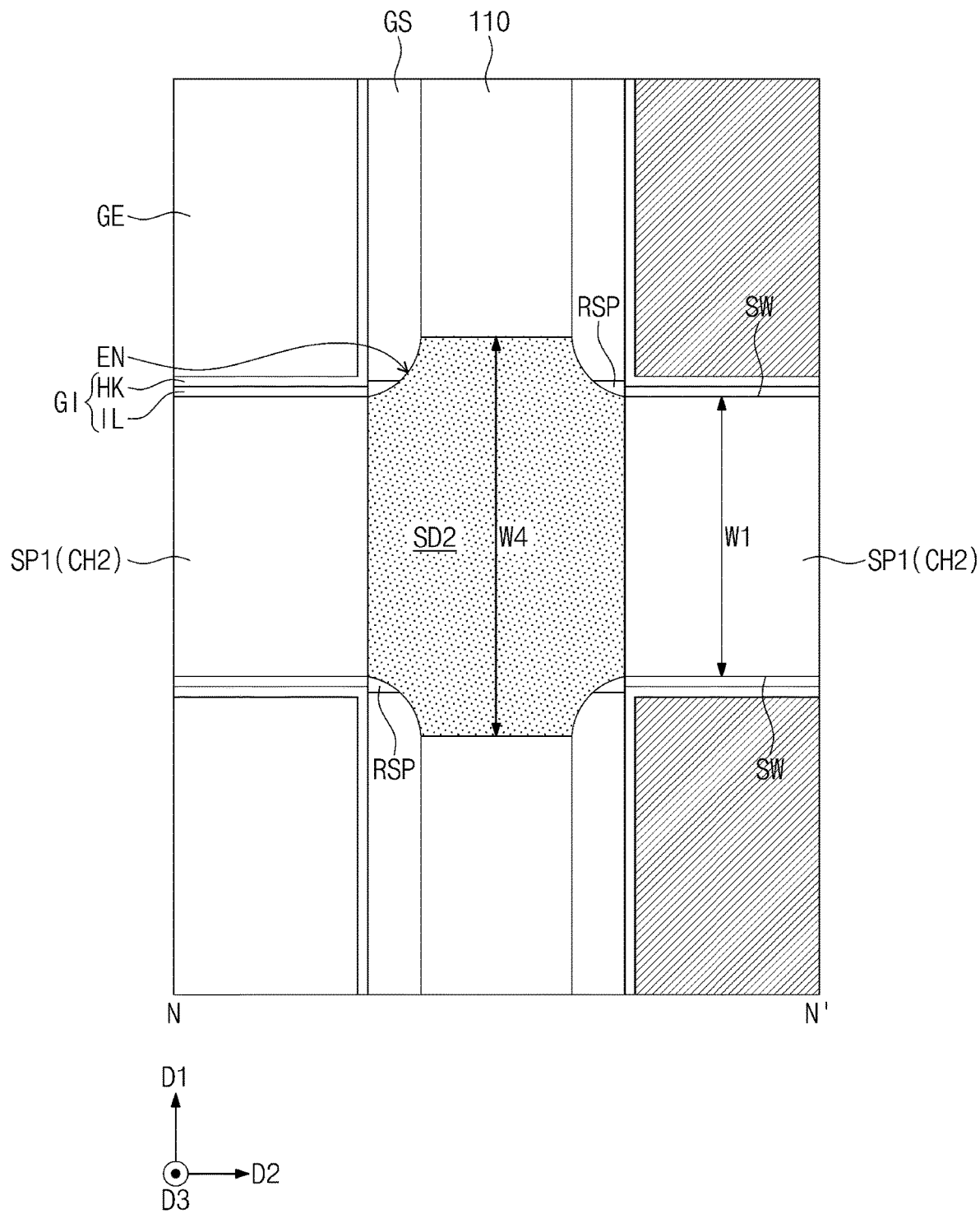
FIG. 3B is a top plan view taken at a level N-N' of FIG. 2B.

FIG. 1 is a plan view illustrating a semiconductor device according to an example embodiment of the inventive concept. FIGS. 2A to 2D are sectional views respectively taken along lines A-A', B-B', C-C', and D-D' of FIG. 1. FIG. 3A is a top plan view taken at a level M-M' of FIG. 2B. FIG. 3B is a top plan view taken at a level N-N' of FIG. 2B.

Referring to FIGS. 1 and 2A to 2D, a logic cell LC may be provided on a substrate 100. Logic transistors constituting a logic circuit may be disposed on the logic cell LC. The substrate 100 may be a semiconductor substrate, which is formed of or includes silicon, germanium, silicon-germanium, or the like, or a compound semiconductor substrate. As an example, the substrate 100 may be a silicon wafer.

The logic cell LC may include a PMOSFET region PR and an NMOSFET region NR. The PMOSFET and NMOSFET regions PR and NR may be defined by a second trench TR2, which is formed in an upper portion of the substrate 100. For example, the second trench TR2 may be placed between the PMOSFET and NMOSFET regions PR and NR. The PMOSFET and NMOSFET regions PR and NR may be spaced apart from each other, in a first direction D1, with the second trench TR2 interposed therebetween.

A first active pattern AP1 and a second active pattern AP2 may be defined by a first trench TR1, which is formed in an upper portion of the substrate 100. The first and second active patterns AP1 and AP2 may be provided on the PMOSFET and NMOSFET regions PR and NR, respectively. The first trench TR1 may be shallower than the second trench TR2. The first and second active patterns AP1 and AP2 may be extended lengthwise in a second direction D2. The first and second active patterns AP1 and AP2 may be vertically-protruding portions of the substrate 100 (e.g., protruding in a third direction D3).

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 2D). For example, top surfaces of the first and second active patterns AP1 and AP2 may be at a higher vertical level (e.g., in the third direction D3) than a top surface of the device isolation layer ST. The device isolation layer ST may not cover the upper portions of the first and second active patterns AP1 and AP2. The device isolation layer ST may cover lower side surfaces of the first and second active patterns AP1 and AP2.

Referring back to FIG. 2D, a width, in the first direction D1, of each of the first and second active patterns AP1 and AP2 may be abruptly decreased at a level of the top surface of the device isolation layer ST. For example, the second active pattern AP2 covered with the device isolation layer ST may have a fifth width W5. The second active pattern AP2, which is exposed above the device isolation layer ST, may have a sixth width W6. The sixth width W6 may be smaller than the fifth width W5.

At the same level as the top surface of the device isolation layer ST, a side surface of the second active pattern AP2 may be gently inclined. For example, the second active pattern AP2 may have a third side surface SW3, which is covered with the device isolation layer ST, and a fourth side surface SW4, which is covered with a gate insulating layer GI. The second active pattern AP2 may further have a flat surface PLP between the third and fourth side surfaces SW3 and SW4, connecting the third and fourth side surfaces SW3 and SW4. The flat surface PLP may be provided at the same level as the top surface of the device isolation layer ST. A slope of the flat surface PLP may be smaller than that of each of the third and fourth side surfaces SW3 and SW4. For example, in some embodiments, the flat surface PLP may be substantially coplanar with the top surface of the device isolation layer ST. Referring back to FIGS. 1 and 2A to 2D, the first active pattern AP1 may include an upper portion serving as a first channel pattern CH1. The second active pattern AP2 may include an upper portion serving as a second channel pattern CH2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include silicon (Si), germanium (Ge), or silicon-germanium (SiGe). In an embodiment, each of the first to third semiconductor patterns SP1, SP2, and SP3 may be formed of or may include silicon (Si).

A plurality of first recesses RS1 may be formed in the upper portion of the first active pattern AP1. First source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3 of the first channel pattern CH1.

A plurality of second recesses RS2 may be formed in the upper portion of the second active pattern AP2. Second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. For example, each pair of the second source/drain patterns SD2 may be connected to each other by the stacked first to third semiconductor patterns SP1, SP2, and SP3 of the second channel pattern CH2.

The first and second source/drain patterns SD1 and SD2 may be epitaxial patterns, which are formed by a selective epitaxial growth process. As an example, each of the first and second source/drain patterns SD1 and SD2 may have a top surface that is located at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or may include the same semiconductor material (e.g., Si) as the substrate 100.

Each of the first source/drain patterns SD1 may include a first semiconductor layer SEL1 and a second semiconductor layer SEL2, which are sequentially stacked. A sectional shape of the first source/drain pattern SD1 taken parallel to the second direction D2 will be described with reference to FIG. 2A.

The first semiconductor layer SEL1 may cover an inner surface of a first recess RS1. The first semiconductor layer SEL1 may have a decreasing thickness in an upward direction. For example, the thickness of the first semiconductor layer SEL1, which is measured in the third direction D3 at the bottom level of the first recess RS1, may be larger than the thickness of the first semiconductor layer SEL1, which is measured in the second direction D2 at the top level of the first recess RS1. The first semiconductor layer SEL1 may have a 'U'-shaped section, due to a sectional profile of the first recess RS1.

The second semiconductor layer SEL2 may fill a remaining space of the first recess RS1 excluding the first semiconductor layer SEL1. A volume of the second semiconductor layer SEL2 may be larger than a volume of the first semiconductor layer SEL1. For example, a ratio of a volume of the second semiconductor layer SEL2 to a total volume of the first source/drain pattern SD1 may be greater than a ratio of a volume of the first semiconductor layer SEL1 to the total volume of the first source/drain pattern SD1.

Each of the first and second semiconductor layers SEL1 and SEL2 may be formed of or may include a semiconductor material whose lattice constant is greater than that of the semiconductor material of the substrate 100. As an example, in the case where the substrate 100 is formed of or includes silicon (Si), the first and second semiconductor layers SEL1 and SEL2 may be formed of or may include silicon-germanium (SiGe). A lattice constant of germanium (Ge) may be larger than that of silicon (Si).

In an embodiment, the first semiconductor layer SEL1 may be provided to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

The second semiconductor layer SEL2 may be provided to have a relatively high germanium concentration. As an example, the germanium concentration of the second semiconductor layer SEL2 may range from 30 at % to 70 at %. The germanium concentration of the second semiconductor layer SEL2 may increase in the third direction D3. For example, the germanium concentration of the second semiconductor layer SEL2 may be about 40 at % near the first semiconductor layer SEL1 but may be about 60 at % at its top level.

The first and second semiconductor layers SEL1 and SEL2 may include impurities (e.g., boron), allowing the first source/drain pattern SD1 to have the p-type conductivity. In an embodiment, a concentration of impurities in the second semiconductor layer SEL2 (in at %) may be greater than that in the first semiconductor layer SEL1.

The first semiconductor layer SEL1 may prevent a stacking fault from occurring between the substrate 100 and the second semiconductor layer SEL2 and between the first to third semiconductor patterns SP1, SP2, and SP3 and the second semiconductor layer SEL2. The stacking fault may lead to an increase of a channel resistance. The stacking fault may occur on the bottom of the first recess RS1. Thus, if the first semiconductor layer SEL1 adjacent to the first recess RS1 is provided to have a relatively large thickness, the stacking fault may be prevented. For example, if the first semiconductor layer SEL1 has a relatively large thickness near the bottom of the first recess RS1, the stacking fault may not occur.

The first semiconductor layer SEL1 may protect the second semiconductor layer SEL2 in a process of replacing sacrificial layers SAL with first to third portions PO1, PO2, and PO3 of a gate electrode GE. For example, the first semiconductor layer SEL1 may prevent the second semiconductor layer SEL2 from being undesirably etched by an etching material, which is used to remove the sacrificial layers SAL.

The gate electrodes GE may be provided to cross the first and second active patterns AP1 and AP2 and to extend lengthwise in the first direction D1. The gate electrodes GE may be arranged with a first pitch P1 in the second direction D2. Each of the gate electrodes GE may be overlapped with the first and second channel patterns CH1 and CH2 when viewed in a plan view.

The gate electrode GE may include a first portion PO1 interposed between the substrate 100 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 2A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 2D, the gate electrode GE may be provided on a top surface TS, a bottom surface BS, and both side surfaces SW of each of the first to third semiconductor patterns SP1, SP2, and SP3. For example, the logic transistor according to the present embodiment may be a three-dimensional field-effect transistor (e.g., multi-bridge channel field-effect transistor (MBCFET)), in which the gate electrode GE is provided to three-dimensionally surround the channel pattern.

Referring back to FIGS. 1 and 2A to 2D, a pair of gate spacers GS may be respectively disposed on both side surfaces of the fourth portion PO4 of the gate electrode GE. The gate spacers GS may be extended lengthwise along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The top surfaces of the gate spacers GS may contact a bottom surface of the second interlayer insulating layer 120, which will be described below. The gate spacers GS may be formed of or may include at least one of SiCN, SiCON, or SiN. In an embodiment, the gate spacers GS may have a multi-layered structure including at least two layers, each of which is made of SiCN, SiCON, or SiN.

A gate capping pattern GP may be provided on the gate electrode GE. The gate capping pattern GP may be extended lengthwise along the gate electrode GE and in the first direction D1. The top surfaces of the gate capping pattern GP may be coplanar with the top surfaces of the gate spacers GS. The gate capping pattern GP may be formed of or may include a material having an etch selectivity with respect to first and second interlayer insulating layers 110 and 120, which will be described below. For example, the gate capping patterns GP may be formed of or may include at least one of SiON, SiCN, SiCON, or SiN.

The gate insulating layer GI may be interposed between the gate electrode GE and the first channel pattern CH1 and between the gate electrode GE and the second channel pattern CH2. The gate insulating layer GI may cover the top surface TS, the bottom surface BS, and the both side surfaces SW of each of the first to third semiconductor patterns SP1, SP2, and SP3. The gate insulating layer GI may cover the top surface of the device isolation layer ST below the gate electrode GE (e.g., see FIG. 2D).

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work function metal.

The first metal pattern may include a metal nitride layer. For example, the first metal pattern may include at least one metal, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

Referring back to FIG. 2B, insulating patterns IP may be provided on the NMOSFET region NR. Each of the insulating patterns IP may be interposed between the second source/drain pattern SD2 and a corresponding one of the first to third portions PO1, PO2, and PO3 of the gate electrode GE. The insulating patterns IP may be in direct contact with the second source/drain pattern SD2. Each of the first to third portions PO1, PO2, and PO3 of the gate electrode GE may be spaced apart from the second source/drain pattern SD2 by the insulating pattern IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. In an embodiment, at least one of the first and second interlayer insulating layers 110 and 120 may include a silicon oxide layer.

A pair of dividing structures DB, which are opposite to each other in the second direction D2, may be provided at both sides of the logic cell LC. The dividing structure DB may be extended lengthwise in the first direction D1 and parallel to the gate electrodes GE. A pitch between the dividing structure DB and the gate electrode GE adjacent to each other may be equal to the first pitch P1.

The dividing structure DB may be provided to penetrate the first and second interlayer insulating layers 110 and 120 and may be extended into the first and second active patterns AP1 and AP2. The dividing structure DB may penetrate an upper portion of each of the first and second active patterns AP1 and AP2. Top surfaces of the dividing structures DB may be coplanar with the top surface of the 120. The dividing structure DB may separate the PMOSFET and NMOSFET regions PR and NR of the logic cell LC from an active region of another logic cell adjacent thereto.

The upper portion of each of the first and second active patterns AP1 and AP2 may further include sacrificial layers SAL adjacent to the dividing structures DB. The sacrificial layers SAL may be stacked to be spaced apart from each other. Each of the sacrificial layers SAL may be located at the same level as a corresponding one of the first to third portions PO1, PO2, and PO3 of the gate electrode GE. The dividing structures DB may be provided to penetrate the sacrificial layers SAL.

The sacrificial layers SAL may be formed of or may include silicon-germanium (SiGe). A germanium concentration of each of the sacrificial layers SAL may range from at % to 30 at %. The germanium concentration of the sacrificial layers SAL may be higher than the germanium concentration of the first semiconductor layer SEL1 described above.

Active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, each of the active contacts AC may have a bar shape elongated in the first direction D1.

The active contact AC may be a self-aligned contact. For example, the active contact AC may be formed by a self-alignment process using the gate capping pattern GP and the gate spacer GS. In an embodiment, the active contact AC may cover at least a portion of a side surface of the gate spacer GS. For example, the active contact AC may contact at least the portion of the side surface of the gate spacer GS. Although not shown, the active contact AC may be provided to cover a portion of the top surface of the gate capping pattern GP.

Silicide patterns SC may be respectively interposed between the active contact AC and the first source/drain pattern SD1 and between the active contact AC and the second source/drain pattern SD2. The active contact AC may be electrically connected to the source/drain pattern SD1 or SD2 through the silicide pattern SC. For example, the active contact AC may be coupled to the source/drain pattern SD1 or SD2. The silicide pattern SC may be formed of or may include at least one of metal silicide materials (e.g., titanium silicide, tantalum silicide, tungsten silicide, nickel silicide, and cobalt silicide).

A gate contact GC, which is electrically connected or coupled to the gate electrode GE, may be provided to penetrate the second interlayer insulating layer 120 and the gate capping pattern GP. For example, a top surface of the gate contact GC may be coplanar with a top surface of the second interlayer insulating layer 120 and a bottom surface of the gate contact GC may be coplanar with a bottom surface of the gate capping pattern GP. Referring to FIG. 2B, an upper region of each of the active contacts AC adjacent to the gate contact GC may be filled with an upper insulating pattern UIP. Accordingly, it may be possible to prevent a process failure (e.g., a short circuit), which may occur when the gate contact GC is in contact with the active contact AC adjacent thereto.

Each of the active and gate contacts AC and GC may include a conductive pattern FM and a barrier pattern BM enclosing the conductive pattern FM. For example, the conductive pattern FM may be formed of or may include at least one metal of aluminum, copper, tungsten, molybdenum, or cobalt. The barrier pattern BM may be provided to cover side and bottom surfaces of the conductive pattern FM. Top and side surfaces of the barrier pattern BM may contact the side and bottom surfaces of the conductive pattern FM. In an embodiment, the barrier pattern BM may include a metal layer and a metal nitride layer. The metal layer may be formed of or may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in a third interlayer insulating layer 130. The first metal layer M1 may include a first lower power line M1_R1(VDD), a second lower power line M1_R2(VSS), and lower interconnection lines M1_I.

Each of the first and second lower power lines M1_R1 and M1_R2 may be extended lengthwise in the second direction D2 to cross the logic cell LC. In detail, a first cell border CB1 extending lengthwise in the second direction D2 may be defined in the logic cell LC. A second cell border CB2 extending lengthwise in the second direction D2 may be defined in a region of the logic cell LC opposite to the first cell border CB1. The first lower power line M1_R1 may be disposed on the first cell border CB1. The first lower power line M1_R1 may be extended lengthwise along the first cell border CB1 and in the second direction D2. The second lower power line M1_R2 may be disposed on the second cell border CB2. The second lower power line M1_R2 may be extended lengthwise along the second cell border CB2 and in the second direction D2.

The lower interconnection lines M1_I may be disposed between the first and second lower power lines M1_R1 and M1_R2. The lower interconnection lines M1_I may be line-shaped or bar-shaped patterns extending lengthwise in the second direction D2. The lower interconnection lines M1_I may be arranged with a second pitch P2 in the first direction D1. The second pitch P2 may be smaller than the first pitch P1.

The first metal layer M1 may further include lower vias VI1. The lower vias VI1 may be provided below the interconnection lines M1_R1, M1_R2, and M1_I of the first metal layer M1. The lower vias VI1 may be respectively interposed between the active contacts AC and the interconnection lines M1_R1, M1_R2, and M1_I of the first metal layer M1. In addition, the lower vias VI1 may be respectively interposed between the gate contacts GC and the interconnection lines M1_R1, M1_R2, and M1_I of the first metal layer M1. Top surfaces of the interconnection lines M1_R1, M1_R2, and M1_I may be coplanar with a top surface of the third interlayer insulating layer 130, and bottom surfaces of the lower vias VI1 may be coplanar with a bottom surface of the third interlayer insulating layer 130.

The interconnection line M1_R1, M1_R2, or M1_I of the first metal layer M1 and the lower via VI1 thereunder may be formed by separate processes. For example, each of the interconnection line M1_R1, M1_R2, or M1_I and the lower via VI1 may be formed by a single damascene process. The semiconductor device according to the present embodiment may be fabricated using a sub-20 nm process.

A second metal layer M2 may be provided in a fourth interlayer insulating layer 140. The second metal layer M2 may include upper interconnection lines M2_I. Each of the upper interconnection lines M2_I of the second metal layer M2 may be a line-shaped or bar-shaped pattern extending in the first direction D1. For example, the upper interconnection lines M2_I may be extended lengthwise in the first direction D1 to be parallel to each other. When viewed in a plan view, the upper interconnection lines M2_I may be parallel to the gate electrodes GE. The upper interconnection lines M2_I may be arranged with a third pitch P3 in the second direction D2. The third pitch P3 may be smaller than the first pitch P1. The third pitch P3 may be greater than the second pitch P2.

The second metal layer M2 may further include upper vias VI2. The upper vias VI2 may be provided below the upper interconnection lines M2_I. The upper vias VI2 may be respectively interposed between the upper interconnection lines M2_I and the interconnection lines M1_R1, M1_R2, and M1_I of the first metal layer M1. Top surfaces of the upper interconnection lines M2_I may be coplanar with a top surface of the fourth interlayer insulating layer 140, and bottom surfaces of the upper vias VI2 may be coplanar with a bottom surface of the fourth interlayer insulating layer 140. The upper vias VI2 of the second metal layer M2 may contact respective top surfaces of the interconnection lines M1_R1, M1_R2, and M1_I of the first metal layer M1.

The upper interconnection line M2_I of the second metal layer M2 and the upper via VI2 thereunder may be a single pattern that is formed by the same process. For example, the upper interconnection line M2_I and the upper via VI2 may be formed concurrently by a dual damascene process.

The interconnection lines of the first metal layer M1 may be formed of or may include a conductive material that is the same as or different from that of the second metal layer M2. For example, the interconnection lines of the first and second metal layers M1 and M2 may be formed of or may include at least one of aluminum, copper, tungsten, molybdenum, or cobalt. Although not shown, a plurality of stacked metal layers (e.g., metal layers M3, M4, M5, and so forth) may be further disposed on the fourth interlayer insulating layer 140. Each of the stacked metal layers may include routing lines.

The first semiconductor pattern SP1, the first source/drain pattern SD1, and the gate electrode GE on the PMOSFET region PR will be described in more detail with reference to FIG. 3A. For example, FIG. 3A illustrates a planar structure of a semiconductor device at a level of the first semiconductor pattern SP1 (for example, obtained by planarizing the semiconductor device to the level depicted by the line M-M').

The largest width of the first semiconductor pattern SP1 in the first direction D1 may be a first width W1. The first source/drain pattern SD1 may be interposed between an adjacent pair of first semiconductor patterns SP1. The first source/drain pattern SD1 may include the first semiconductor layer SEL1, which is located adjacent to the pair of first semiconductor patterns SP1, and the second semiconductor layer SEL2, which is located at its center.

The first semiconductor layer SEL1 of the first source/drain pattern SD1 may be in direct contact with the first semiconductor pattern SP1. The largest width of the first semiconductor layer SEL1 in the first direction D1 may be a second width W2. The second width W2 may be larger than the first width W1.

The second semiconductor layer SEL2 may cover an end EN of the gate spacer GS. At least a portion of the second semiconductor layer SEL2 may be interposed between an adjacent pair of the gate spacers GS. The largest width of the second semiconductor layer SEL2 in the first direction D1 may be a third width W3. The third width W3 may be larger than the second width W2.

A remnant semiconductor pattern RSP may be interposed between the gate spacer GS and the first semiconductor layer SEL1. The remnant semiconductor pattern RSP may be formed of or may include at least one of silicon (Si), germanium (Ge), or silicon-germanium (SiGe). In an embodiment, the remnant semiconductor pattern RSP may be formed of or may include the same material (e.g., silicon (Si)) as the first semiconductor pattern SP1. In the case where the remnant semiconductor pattern RSP includes silicon-germanium (SiGe), a germanium concentration of the remnant semiconductor pattern RSP may be lower than that of the first semiconductor layer SEL1.

FIG. 3A illustrates an example, in which the remnant semiconductor pattern RSP is spaced apart from the first semiconductor pattern SP1 by the first semiconductor layer SEL1. But the inventive concept is not limited to this example. The remnant semiconductor pattern RSP may be connected to the first semiconductor pattern SP1. However, there may be no visible interface between the remnant semiconductor pattern RSP and the first semiconductor pattern SP1, because the remnant semiconductor pattern RSP is formed of the same material as the first semiconductor pattern SP1.

The remnant semiconductor pattern RSP may be interposed between the first semiconductor layer SEL1 and the end EN of the gate spacer GS, which is not covered with the second semiconductor layer SEL2. The remnant semiconductor pattern RSP may be in contact with the end EN of the gate spacer GS, which is not covered with the second semiconductor layer SEL2. The first semiconductor layer SEL1 may be spaced apart from the gate spacer GS by the remnant semiconductor pattern RSP.

Owing to the remnant semiconductor pattern RSP, the width W2 of the first semiconductor layer SEL1 may be greater than the width W1 of the first semiconductor pattern SP1. This is because not only the first semiconductor pattern SP1 but also the remnant semiconductor pattern RSP are used as a seed layer to grow the first semiconductor layer SEL1.

The gate electrode GE may be on both side surfaces SW of the first semiconductor pattern SP1. The gate insulating layer GI may be interposed between the gate electrode GE and the side surface SW of the first semiconductor pattern SP1. The gate insulating layer GI may include an interface layer IL, which directly covers the both side surfaces SW of the first semiconductor pattern SP1, and a high-k dielectric layer HK, which is provided on the interface layer IL. The interface layer IL be between the high-k dielectric layer HK and the first semiconductor pattern SP1, and may contact both the high-k dielectric layer HK and the first semiconductor pattern SP1. In an embodiment, the high-k dielectric layer HK may be thicker than the interface layer IL.

The interface layer IL may include a silicon oxide layer or a silicon oxynitride layer. The high-k dielectric layer HK may be formed of or may include at least one of high-k dielectric materials whose dielectric constants are higher than that of silicon oxide. For example, the high-k dielectric materials may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an embodiment, the gate insulating layer GI may include a dipole element. The dipole element may be formed of or may include at least one of lanthanum (La), aluminum (Al), or combinations thereof. For example, the gate insulating layer GI may contain at least one of lanthanum (La), aluminum (Al), or combinations thereof, as its impurity.

The gate insulating layer GI may include a dipole interface, which is formed near the interface layer IL by the dipole element. In the case where the gate insulating layer GI contains lanthanum (La), an effective work function of the gate electrode GE may be lowered. In the case where the gate insulating layer GI contains aluminum (Al), the effective work function of the gate electrode GE may be increased. For example, the dipole element may be used to control a threshold voltage of a transistor.

The first semiconductor pattern SP1, the second source/drain pattern SD2, and the gate electrode GE on the NMOSFET region NR will be described in more detail with reference to FIG. 3B. For example, FIG. 3B illustrates a planar structure of a semiconductor device at a level of the first semiconductor pattern SP1 (for example, obtained by planarizing the semiconductor device to the level depicted by the line N-N).

The largest width of the first semiconductor pattern SP1 in the first direction D1 may be the first width W1. The second source/drain pattern SD2 may be interposed between an adjacent pair of first semiconductor patterns SP1. Opposite end portions of the second source/drain pattern SD2 may be in direct contact with a pair of the first semiconductor patterns SP1, respectively.

The second source/drain pattern SD2 may cover an end EN of the gate spacer GS. At least a portion of the second source/drain pattern SD2 may be interposed between a pair of the gate spacers GS adjacent to each other. The largest width of the second source/drain pattern SD2 in the first direction D1 may be a fourth width W4. The fourth width W4 may be larger than the first width W1. In some example embodiments, the fourth width W4 may be different from the third width W3.

The remnant semiconductor pattern RSP may be interposed between the gate spacer GS and the second source/drain pattern SD2. The remnant semiconductor pattern RSP may be provided to have substantially the same features as that described with reference to FIG. 3A.

The gate electrode GE may be on both side surfaces SW of the first semiconductor pattern SP1. The gate insulating layer GI may be interposed between the gate electrode GE and the side surface SW of the first semiconductor pattern SP1. The gate insulating layer GI may be provided to have substantially the same features as that described with reference to FIG. 3A.

Figure 12A:
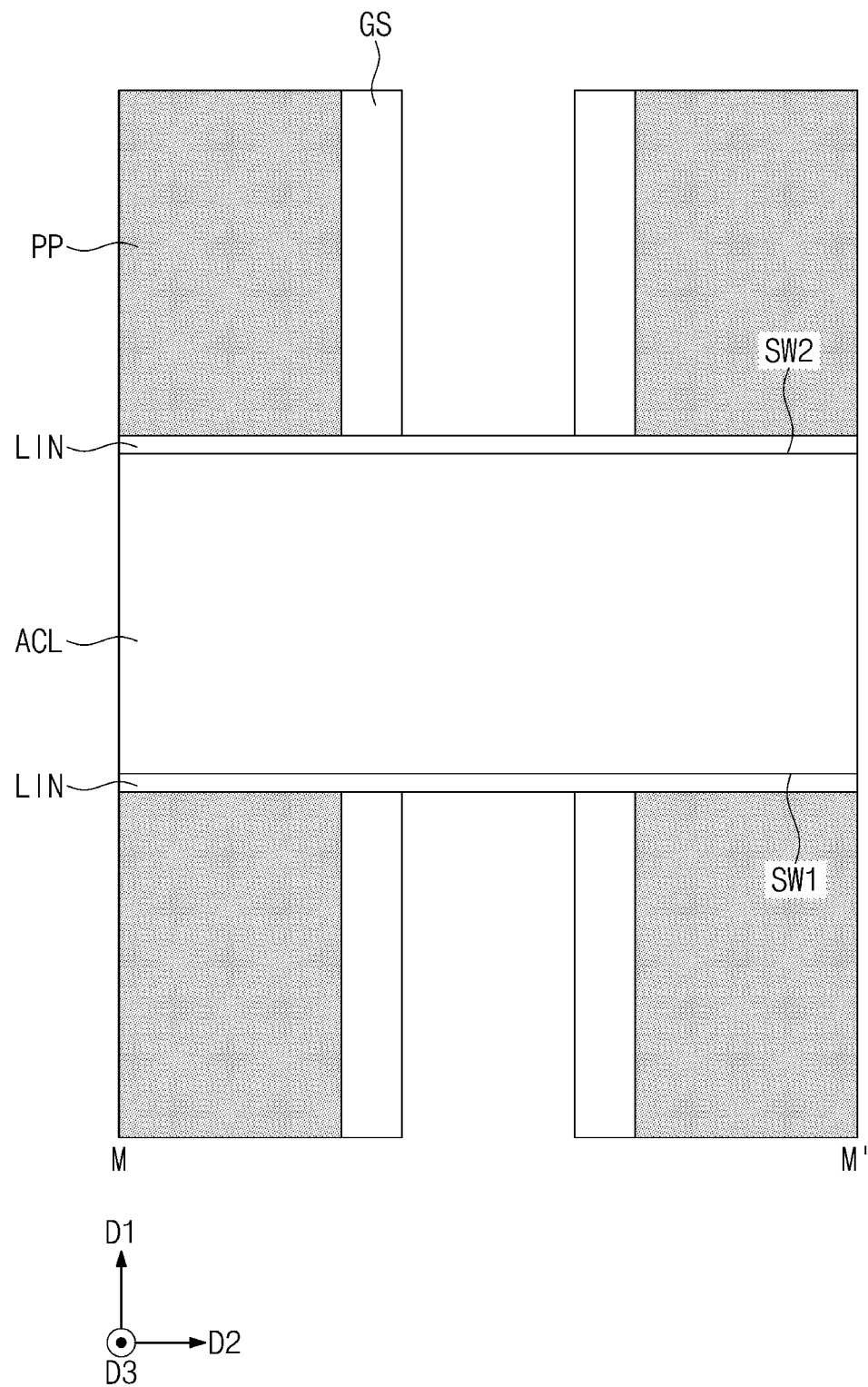
FIG. 12A is a top plan view taken at a level M-M' of FIG. 6A.
Figure 12B:
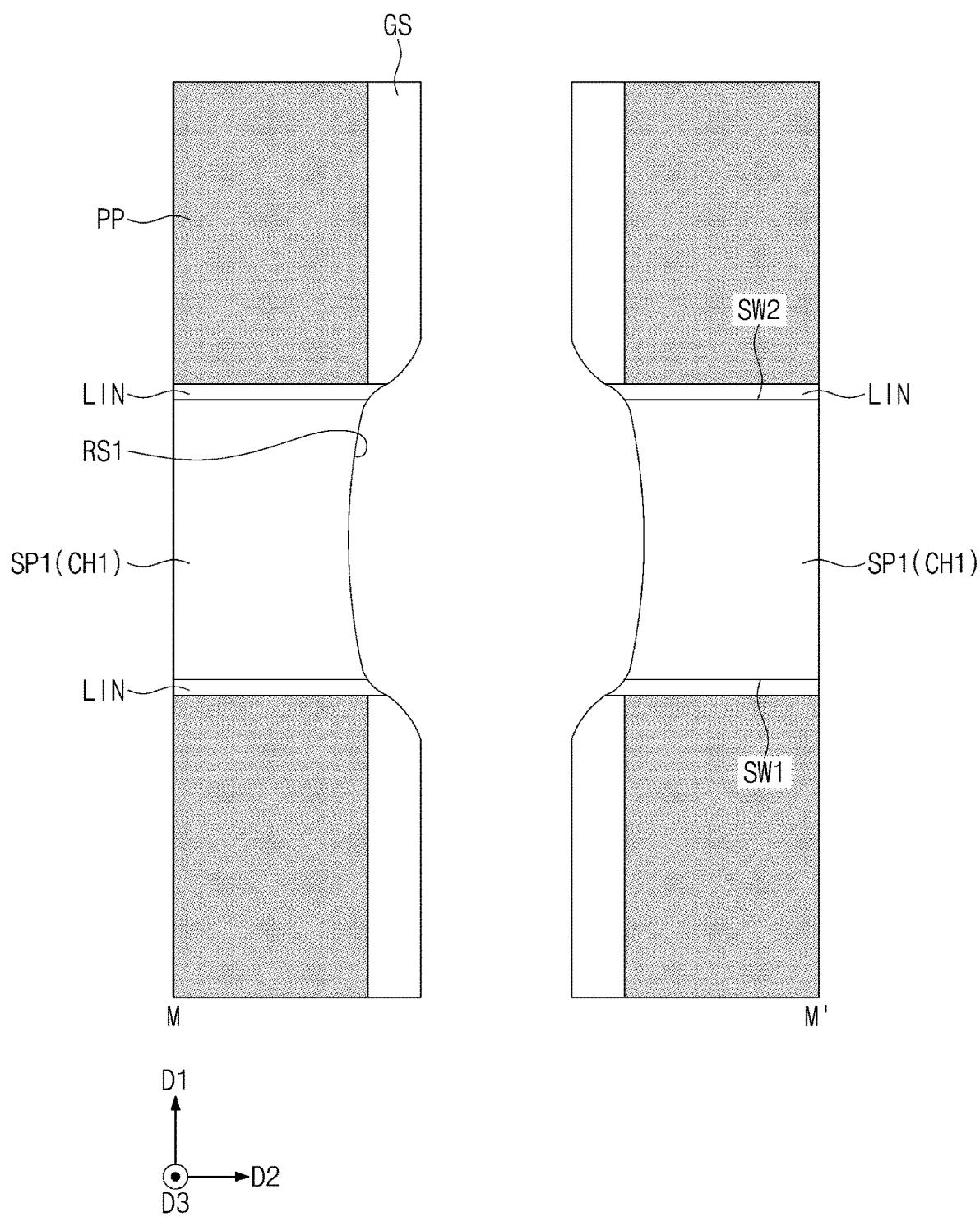
FIG. 12B is a top plan view taken at a level M-M' of FIG. 7A.
Figure 12C:
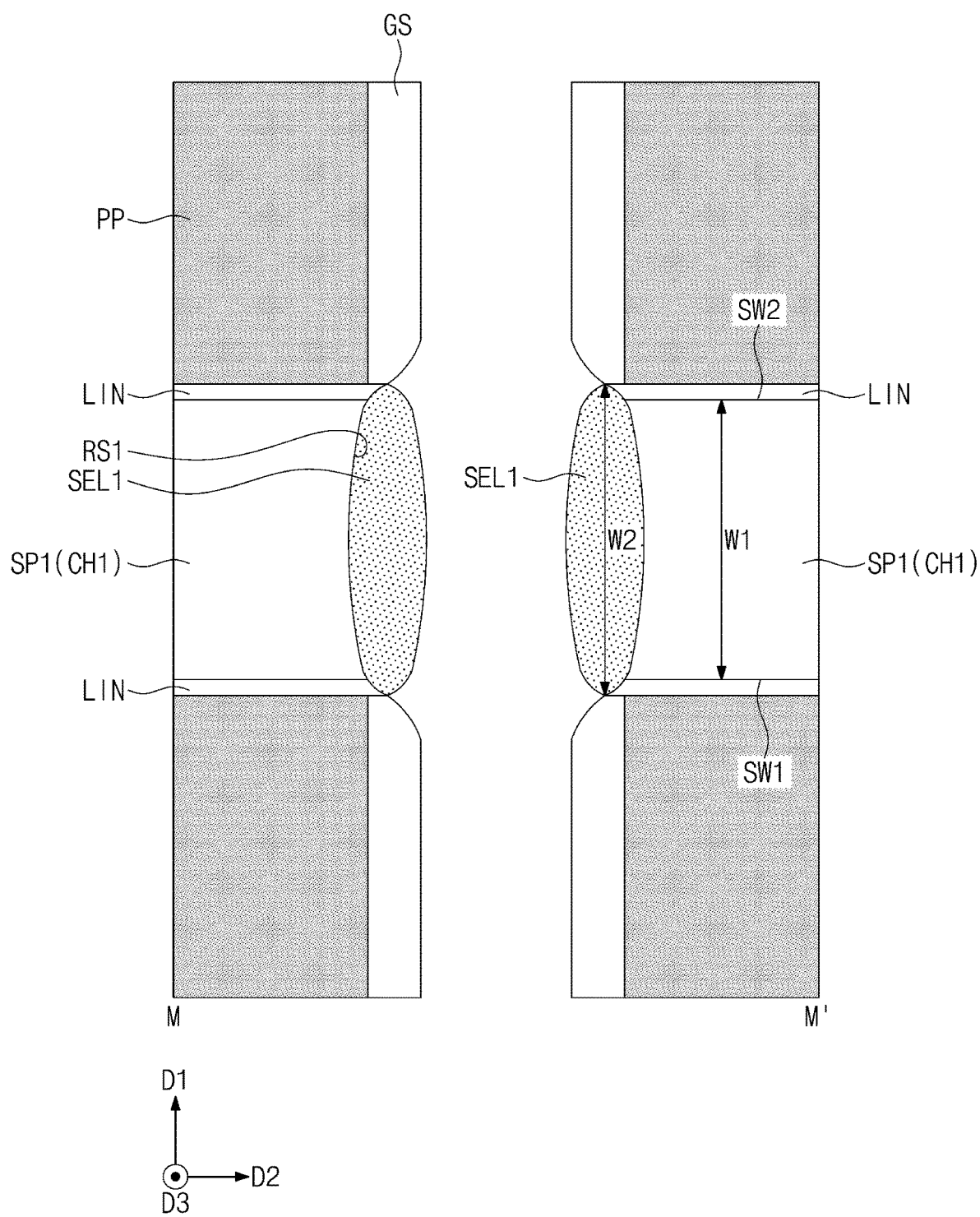
FIGS. 12C and 12D are top plan views, each of which is taken at a level M-M' of FIG. 8A.
Figure 12D:
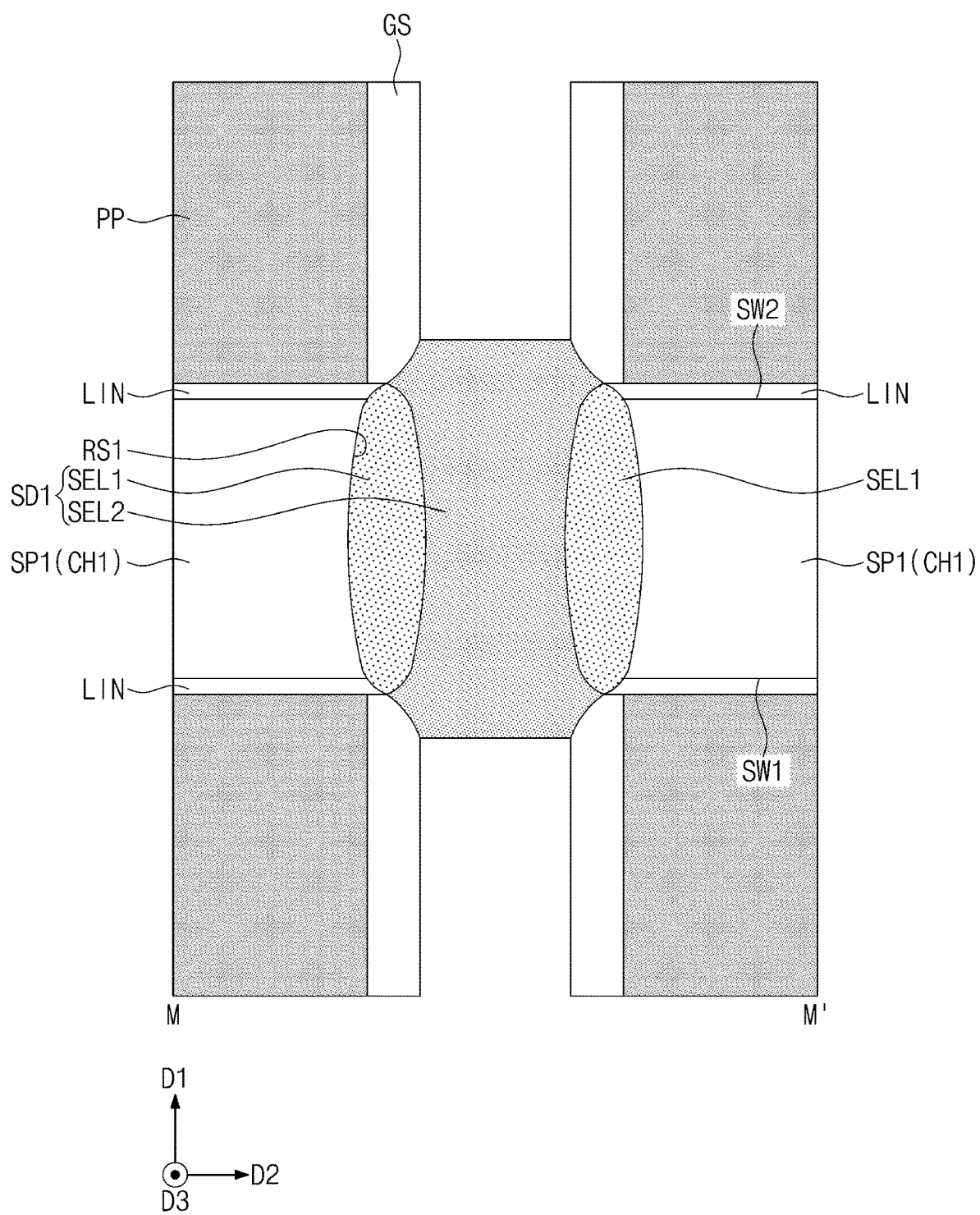
Figure 12E:
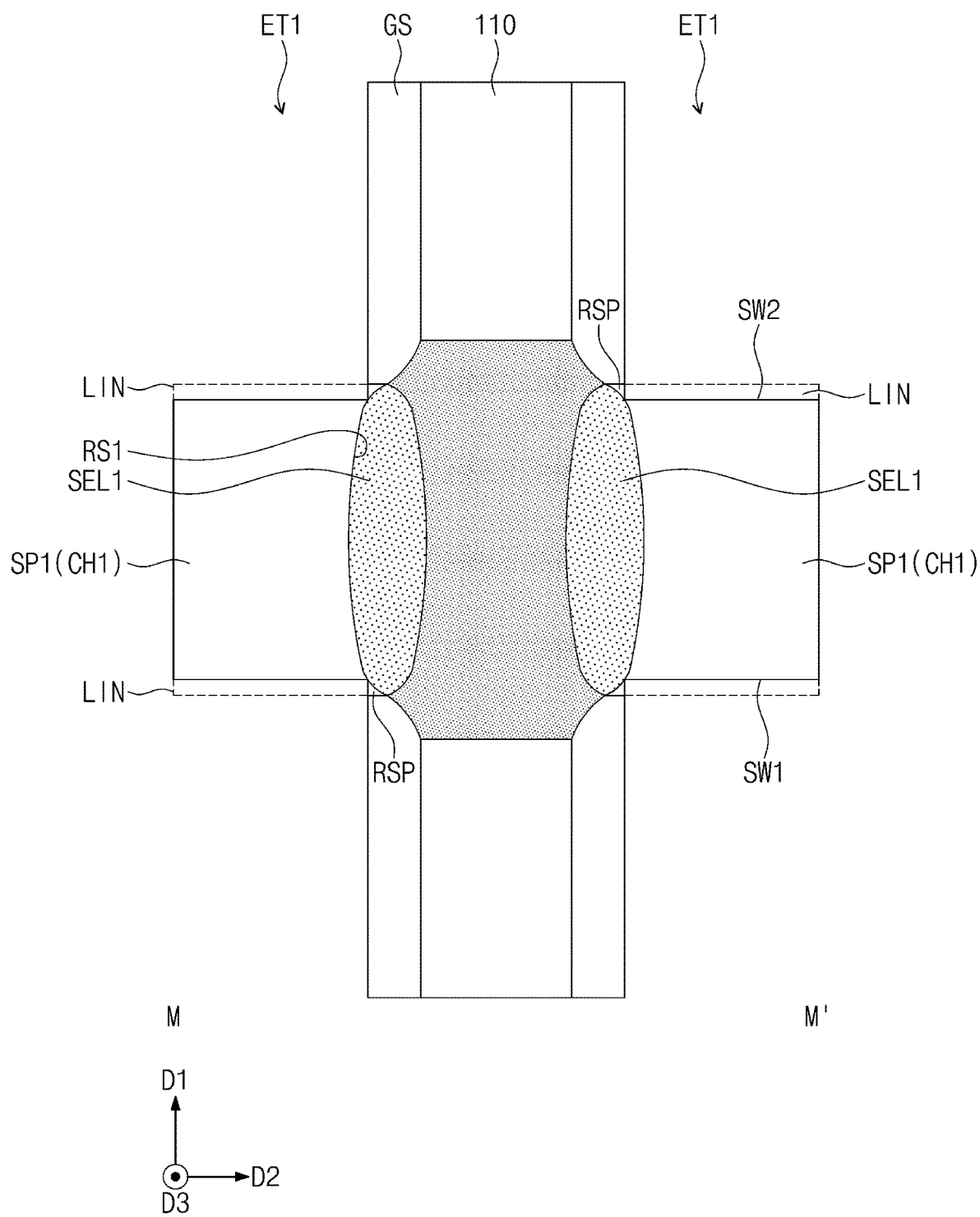
FIG. 12E is a top plan view taken at a level M-M' of FIG. 9A.
Figure 12F:
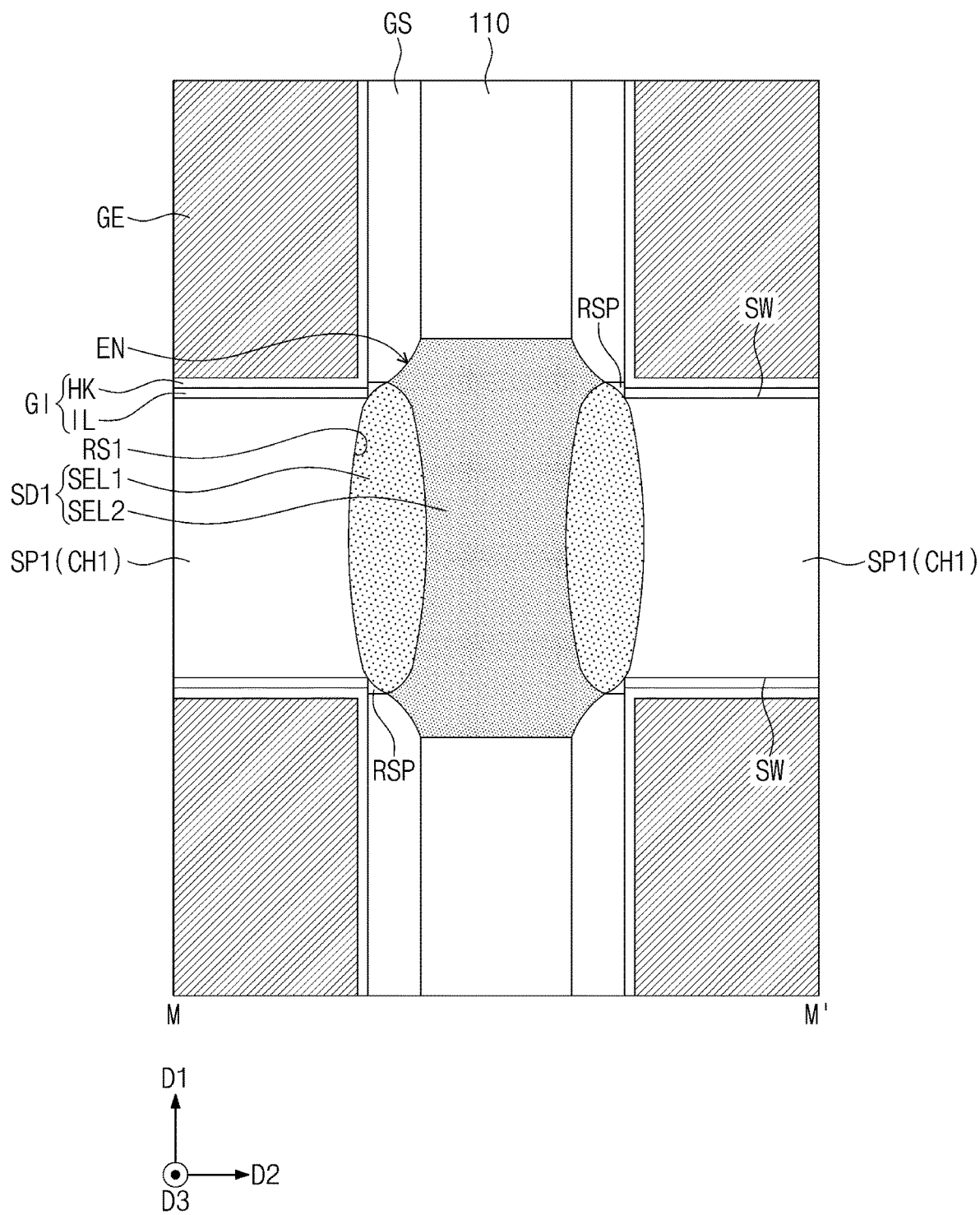
FIG. 12F is a top plan view taken at a level M-M' of FIG. 11A.
Figure 13:
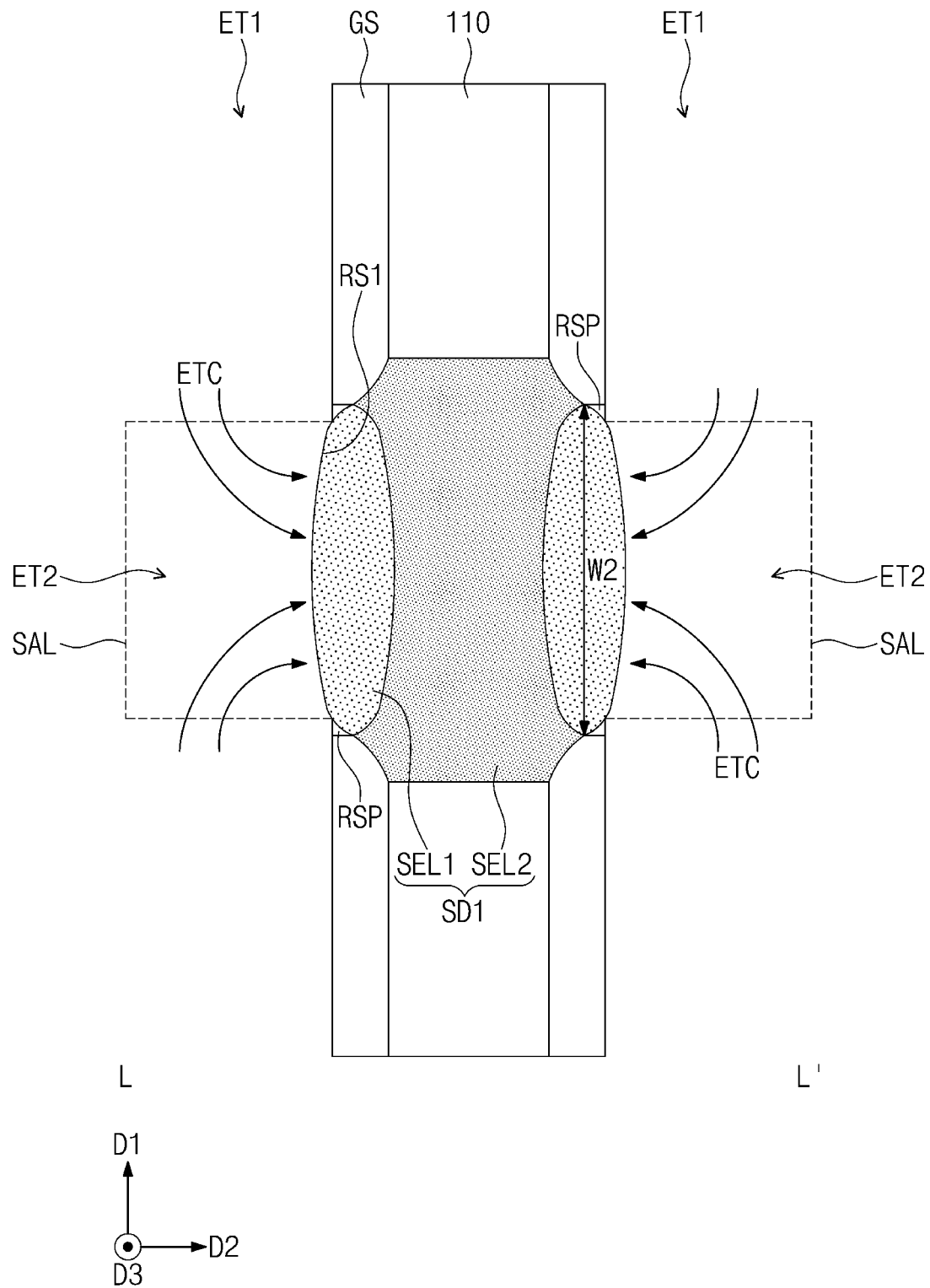
FIG. 13 is a top plan view taken at a level L-L' of FIG. 10A.
Figure 14A:
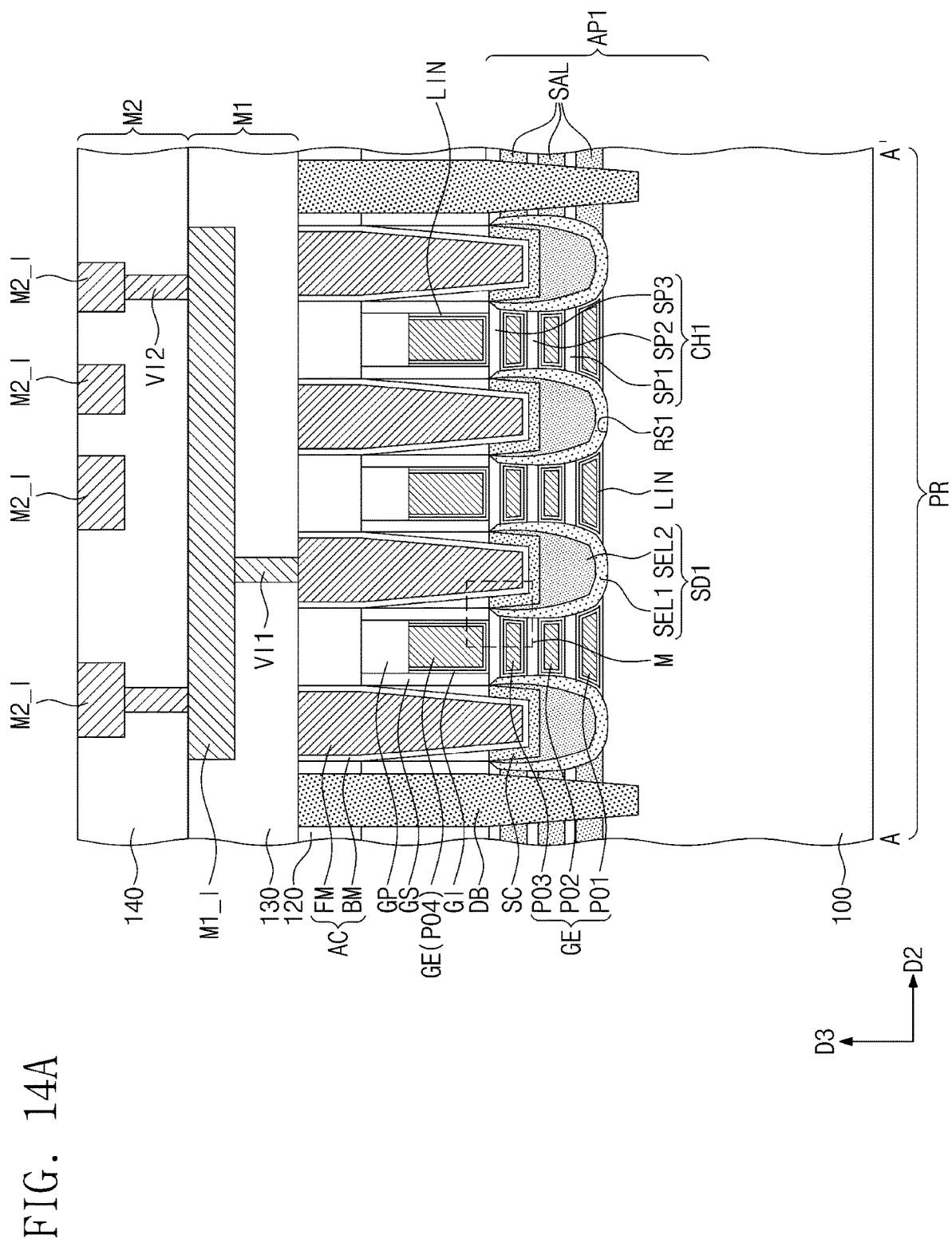
FIGS. 14A to 14D are sectional views, which are respectively taken along the lines A-A', B-B', C-C', and D-D' of FIG. 1, illustrating a semiconductor device according to an example embodiment of the inventive concept.
Figure 14B:
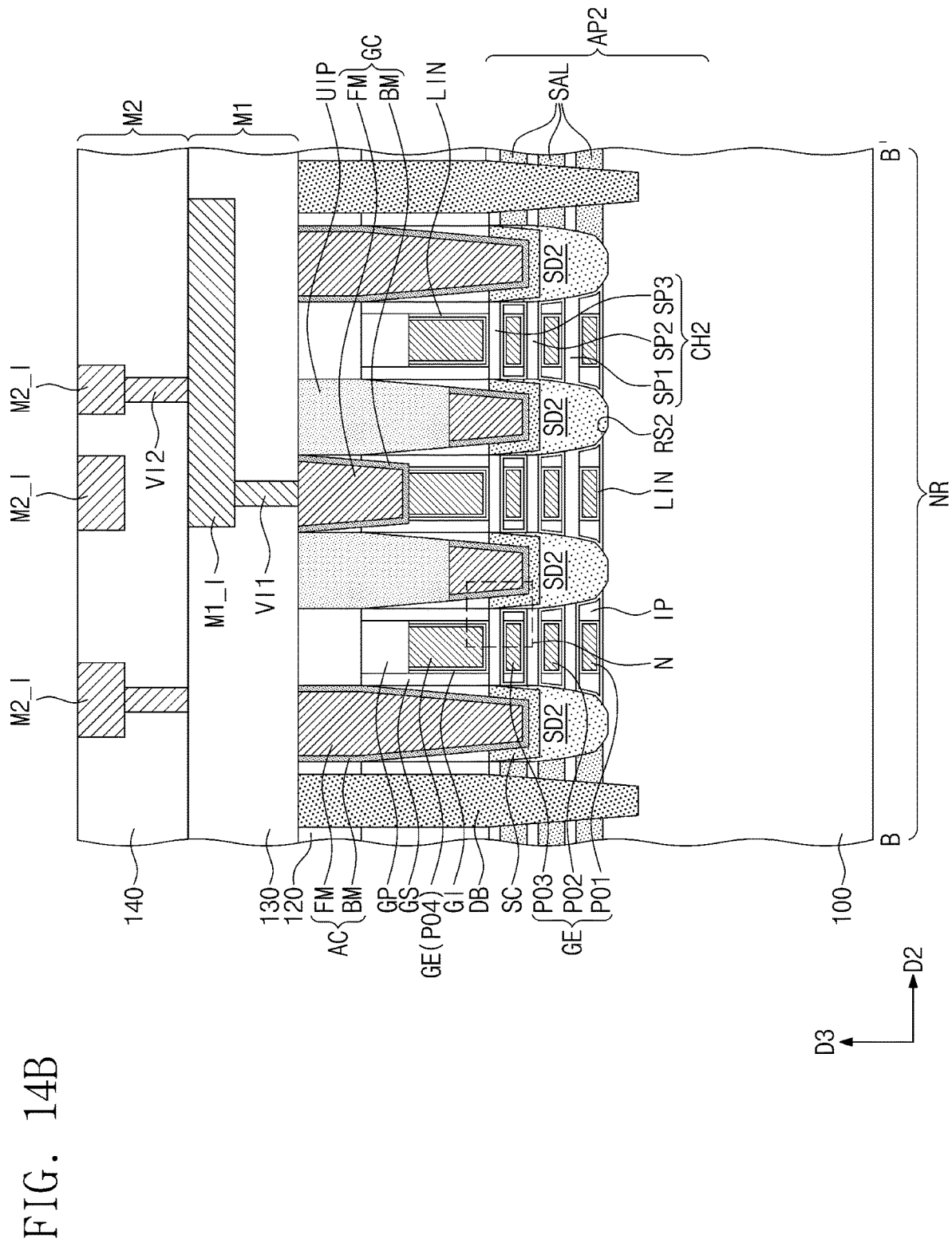
Figure 14C:
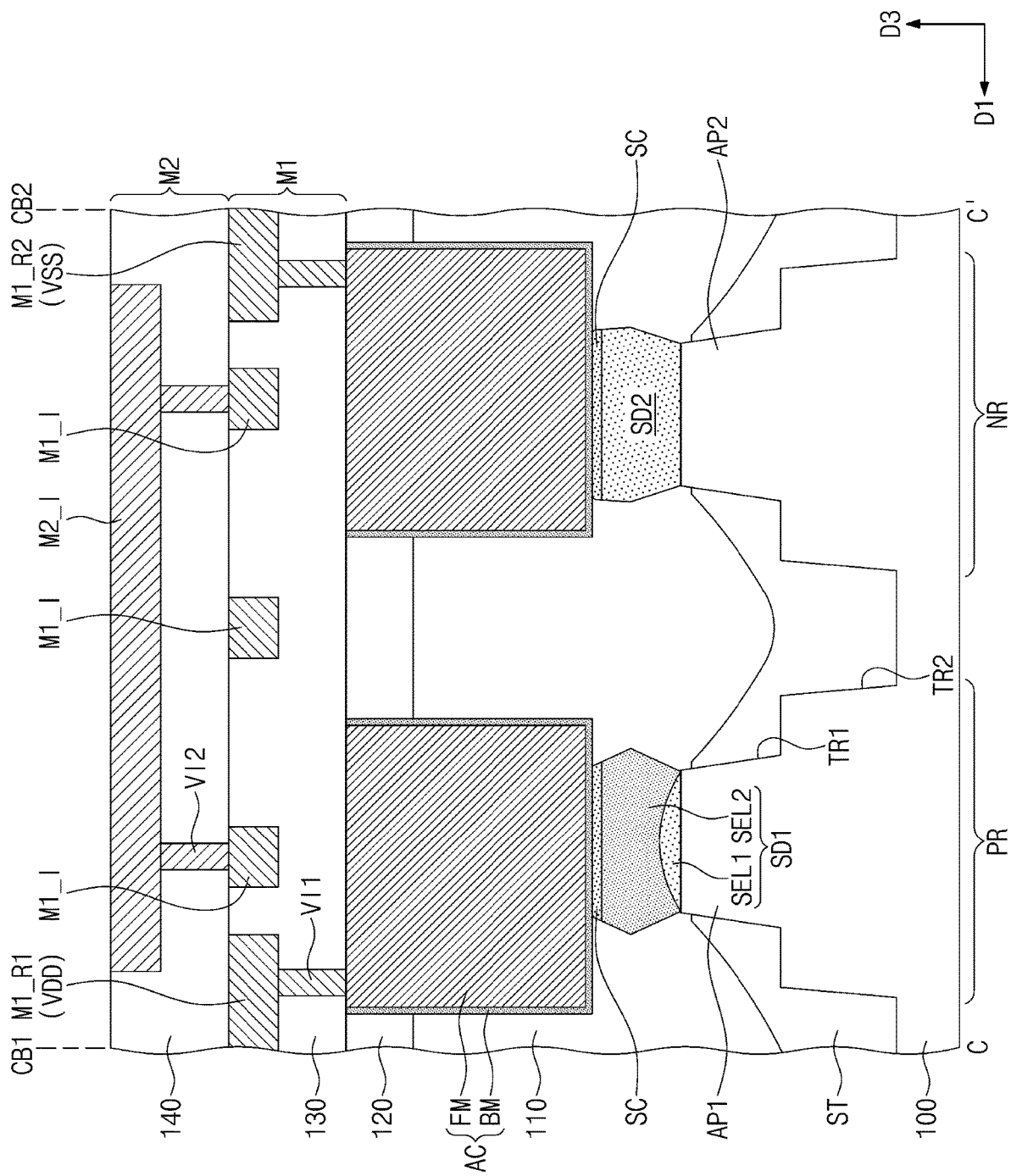
Figure 14D:
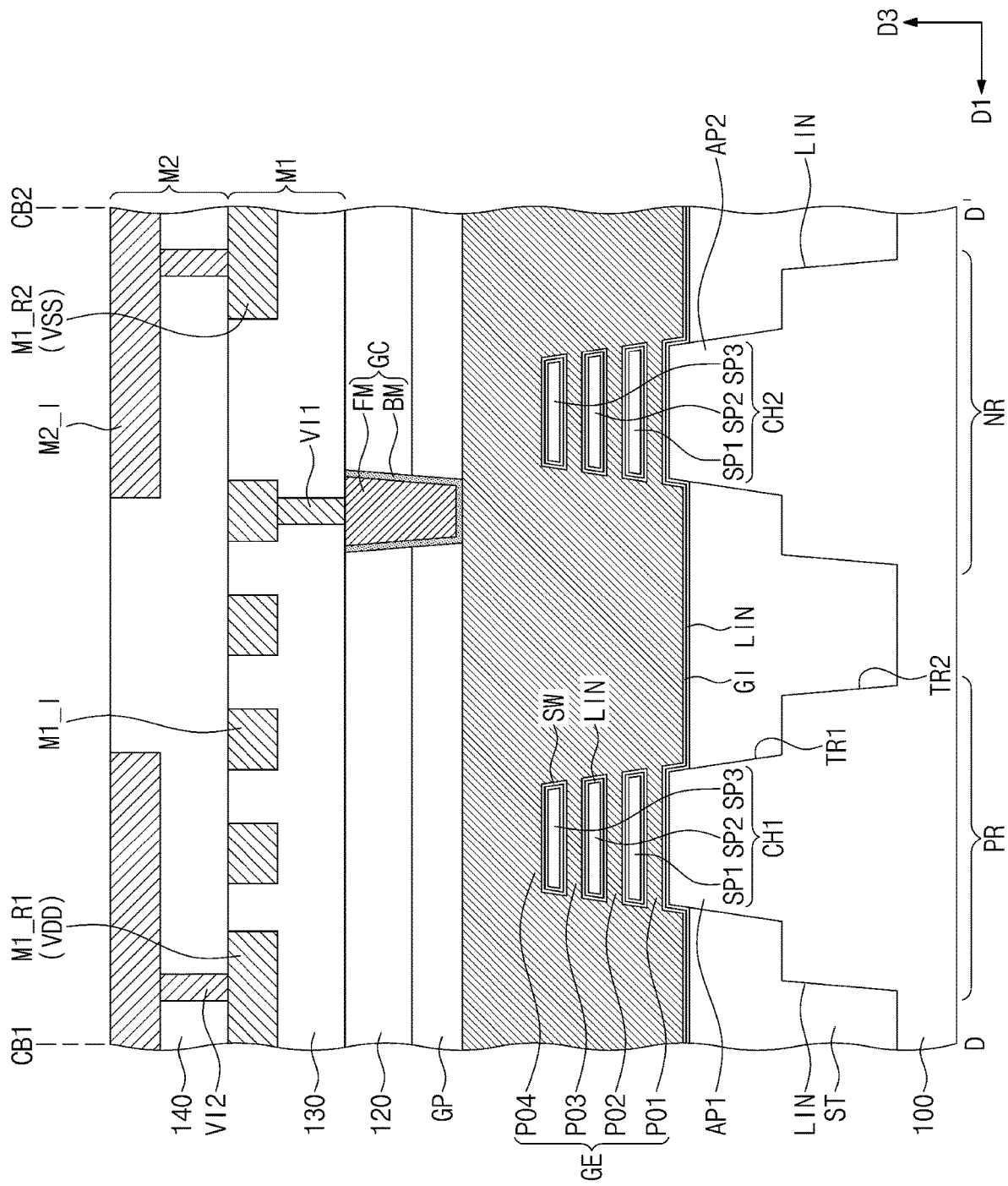

FIGS. 4A to 11D are sectional views illustrating a method of fabricating a semiconductor device according to an example embodiment of the inventive concept. In detail, FIGS. 4A, 5A, 6A, 7A, 8A, 9A, 10A, and 11A are sectional views corresponding to the line A-A' of FIG. 1. FIGS. 7B, 8B, 9B, 10B, and 11B are sectional views corresponding to the line B-B' of FIG. 1. FIGS. 7C, 8C, 9C, 10C, and 11C are sectional views, which correspond to the line C-C' of FIG. 1 and illustrate a method of fabricating a semiconductor device according to an example embodiment of the inventive concept. FIGS. 4B, 5B, 6B, 7D, 8D, 9D, 10D, and 11D are sectional views corresponding to the line D-D' of FIG. 1. FIG. 12A is a top plan view taken at a level M-M' of FIG. 6A. FIG. 12B is a top plan view taken at a level M-M' of FIG. 7A. FIGS. 12C and 12D are top plan views, each of which is taken at a level M-M' of FIG. 8A. FIG. 12E is a top plan view taken at a level M-M' of FIG. 9A. FIG. 12F is a top plan view taken at a level M-M' of FIG. 11A. FIG. 13 is a top plan view taken at a level L-L' of FIG. 10A.

Figure 4A:
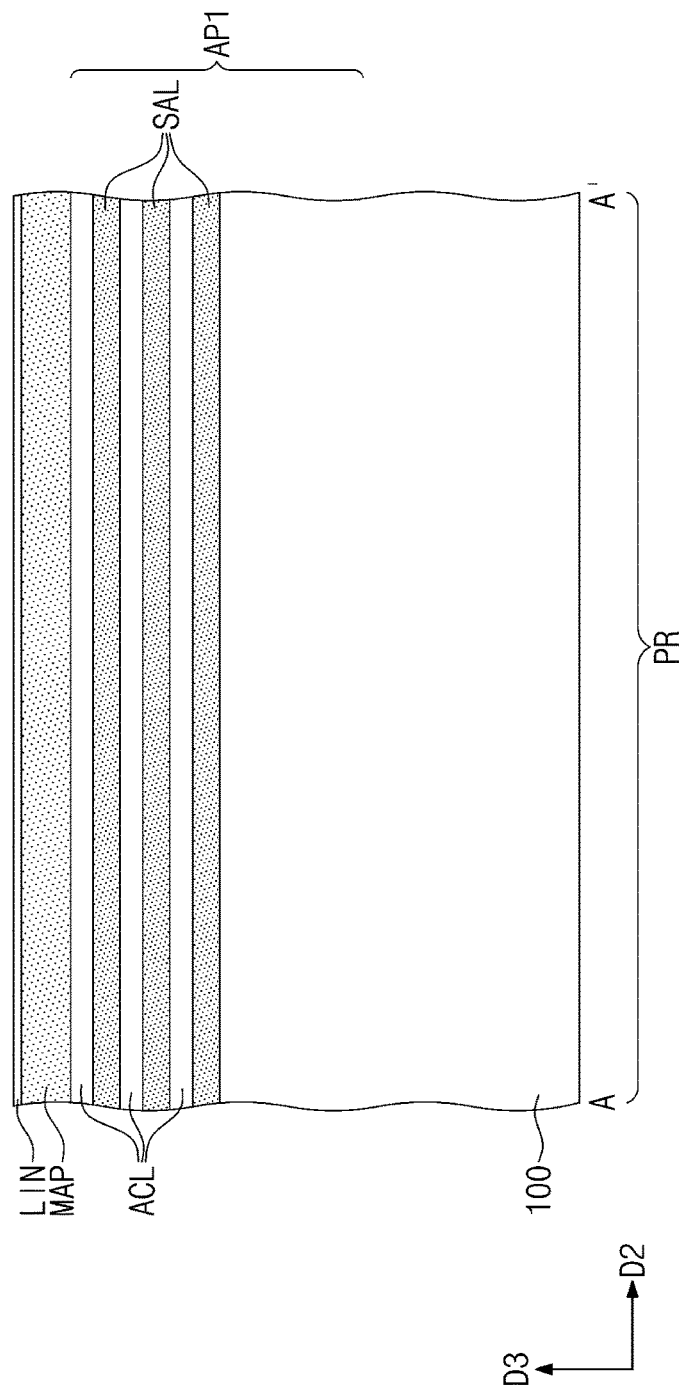
FIGS. 4A, SA, 6A, 7A, 8A, 9A, 10A, and 11A are sectional views corresponding to the line A-A' of FIG. 1, illustrating a method of fabricating a semiconductor device according to an example embodiment of the inventive concept.
Figure 4B:
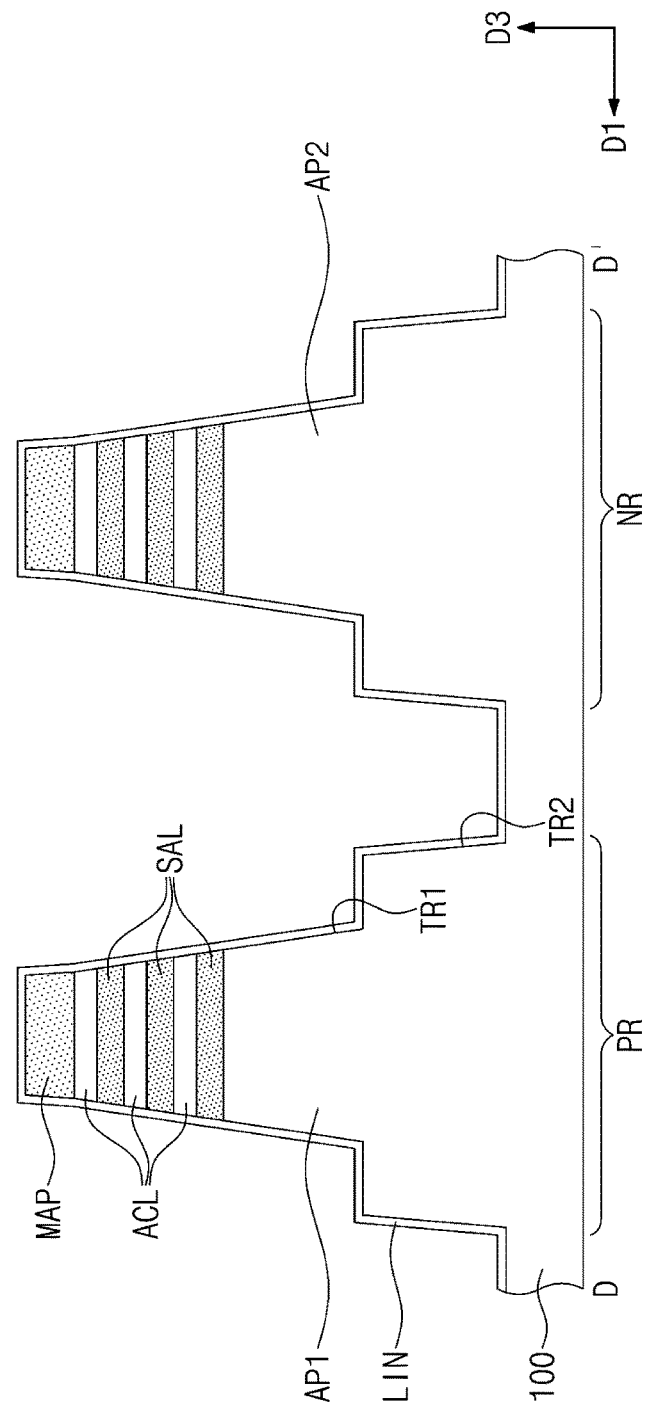
FIGS. 4B, 5B, 6B, 7D, 8D, 9D, 10D, and 11D are sectional views corresponding to the line D-D' of FIG. 1, illustrating a method of fabricating a semiconductor device according to an example embodiment of the inventive concept.

Referring to FIGS. 4A and 4B, the substrate 100 including the PMOSFET and NMOSFET regions PR and NR may be provided. The sacrificial layers SAL and active layers ACL may be alternately formed on the substrate 100. The sacrificial layers SAL may be formed of or may include one of silicon (Si), germanium (Ge), and silicon-germanium (SiGe), and the active layers ACL may be formed of or may include another one of silicon (Si), germanium (Ge) and silicon-germanium (SiGe).

For example, the sacrificial layers SAL may be formed of or may include silicon-germanium (SiGe), and the active layers ACL may be formed of or may include silicon (Si). A germanium concentration of each of the sacrificial layers SAL may range from 10 at % to 30 at %.

A mask pattern MAP may be formed on each of the PMOSFET and NMOSFET regions PR and NR of the substrate 100. The mask pattern MAP may be a line-shaped or bar-shaped pattern extending in the second direction D2. For example, the mask pattern MAP may include a silicon nitride layer.

A first patterning process using the mask pattern MAP as an etch mask may be performed to form the first trench TR1 defining the first and second active patterns AP1 and AP2. The first and second active patterns AP1 and AP2 may be formed on the PMOSFET and NMOSFET regions PR and NR, respectively. Each of the first and second active patterns AP1 and AP2 may include the sacrificial layers SAL and the active layers ACL, which are alternately stacked and constitutes its upper portion.

A second patterning process may be performed on the substrate 100 to form the second trench TR2 defining the PMOSFET and NMOSFET regions PR and NR. The second trench TR2 may be formed to be deeper than the first trench TR1.

A liner layer LIN may be conformally formed by performing an epitaxial growth process on the substrate 100. For example, the liner layer LIN may conformally cover the first and second active patterns AP1 and AP2 and the mask patterns MAP. The liner layer LIN may be formed to a thickness of 1 nm to 4 nm. As a result of the formation of the liner layer LIN, a width of each of the first and second active patterns AP1 and AP2 in the first direction D1 may be increased (e.g., see FIG. 4B).

For example, the liner layer LIN may be formed of or may include at least one of silicon (Si), germanium (Ge), or silicon-germanium (SiGe). In an embodiment, the liner layer LIN may be formed of or may include the same material (e.g., silicon (Si)) as the active layers ACL. In an embodiment, the liner layer LIN may be doped with an impurity, such as B, P, C, Ga, O, or N, but the inventive concept is not limited to this example.

In an embodiment, the liner layer LIN, which is formed on the first and second active patterns AP1 and AP2, may have a single crystalline structure or a poly crystalline structure. In another embodiment, the liner layer LIN on the mask patterns MAP may have an amorphous structure.

Figure 5A:
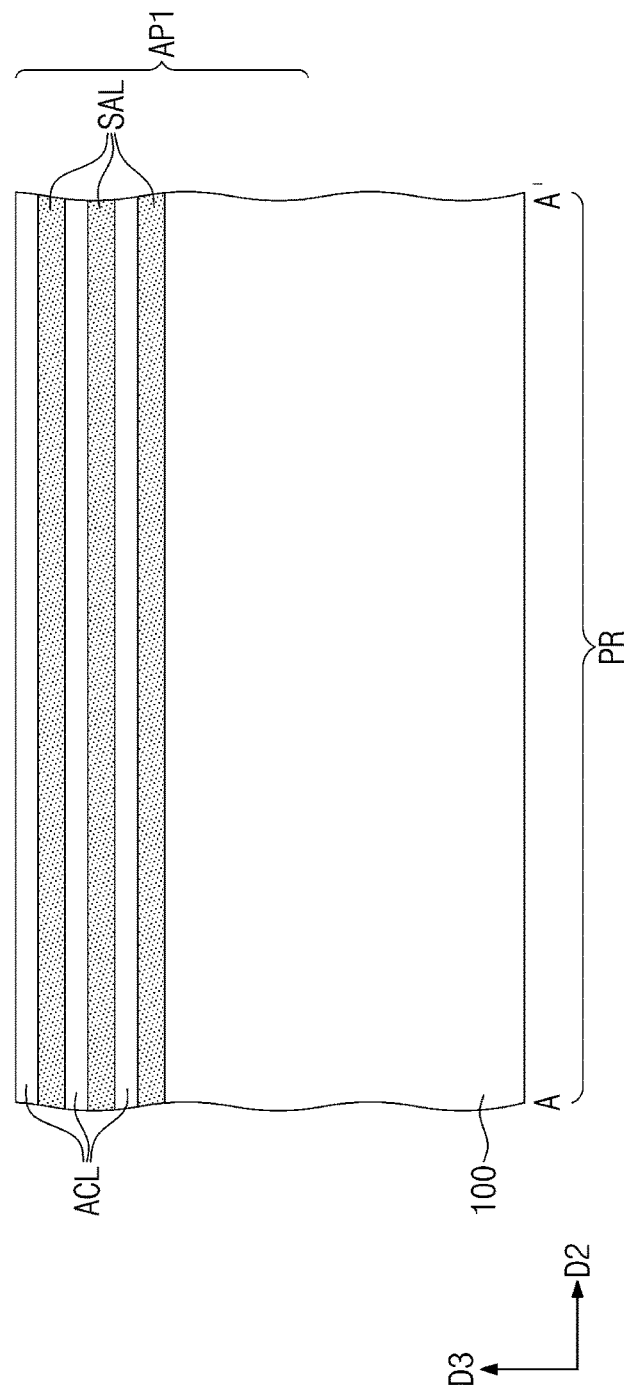
Figure 5B:
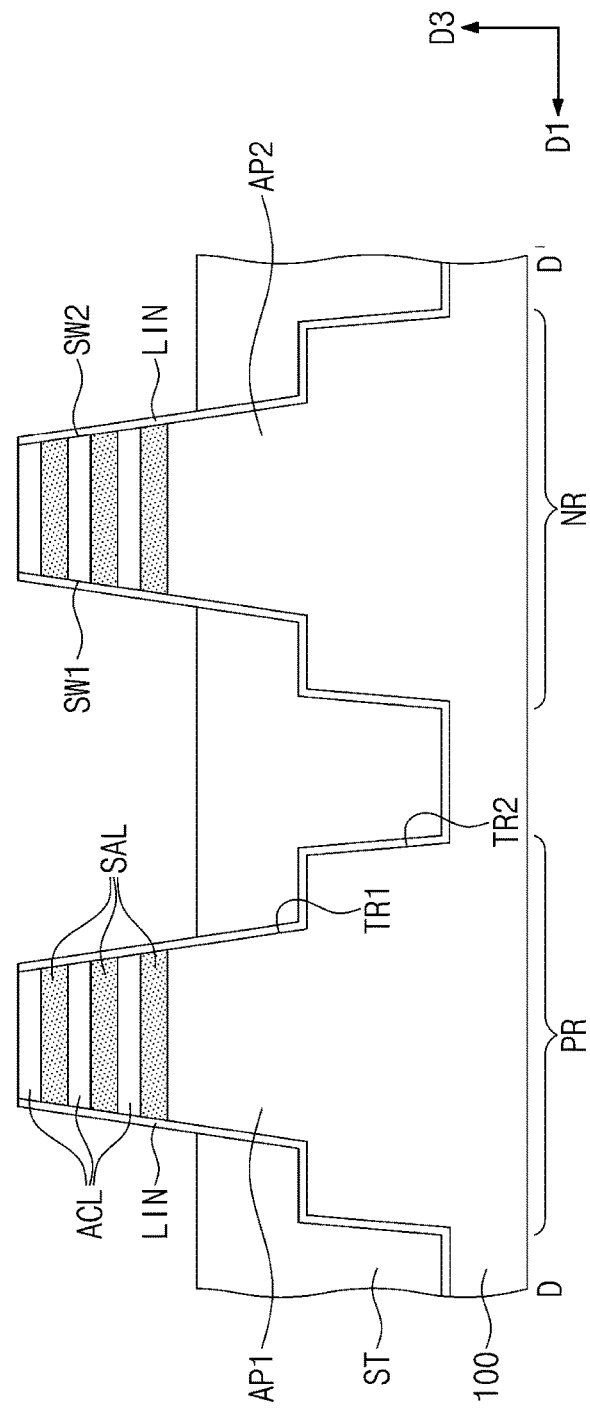

Referring to FIGS. 5A and 5B, the device isolation layer ST may be formed on the substrate 100 to fill the first and second trenches TR1 and TR2. For example, an insulating layer may be formed on the substrate 100 to cover the first and second active patterns AP1 and AP2. A planarization process may be performed on the insulating layer to expose the topmost layer of the active layers ACL. As a result, the mask patterns MAP and the liner layer LIN thereon may be removed. After the planarization process, the device isolation layer ST may be formed by recessing the insulating layer.

The device isolation layer ST may be formed of or may include at least one of insulating materials (e.g., silicon oxide). Each of the first and second active patterns AP1 and AP2 may include an upper portion protruding above the device isolation layer ST. For example, the upper portion of each of the first and second active patterns AP1 and AP2 may vertically protrude above the device isolation layer ST.

Each of the first and second active patterns AP1 and AP2 may have a first side surface SW1 and a second side surface SW2, which are opposite to each other in the first direction D1. The liner layer LIN may cover both of the first and second side surfaces SW1 and SW2 (e.g., see FIG. 5B).

Figure 6A:
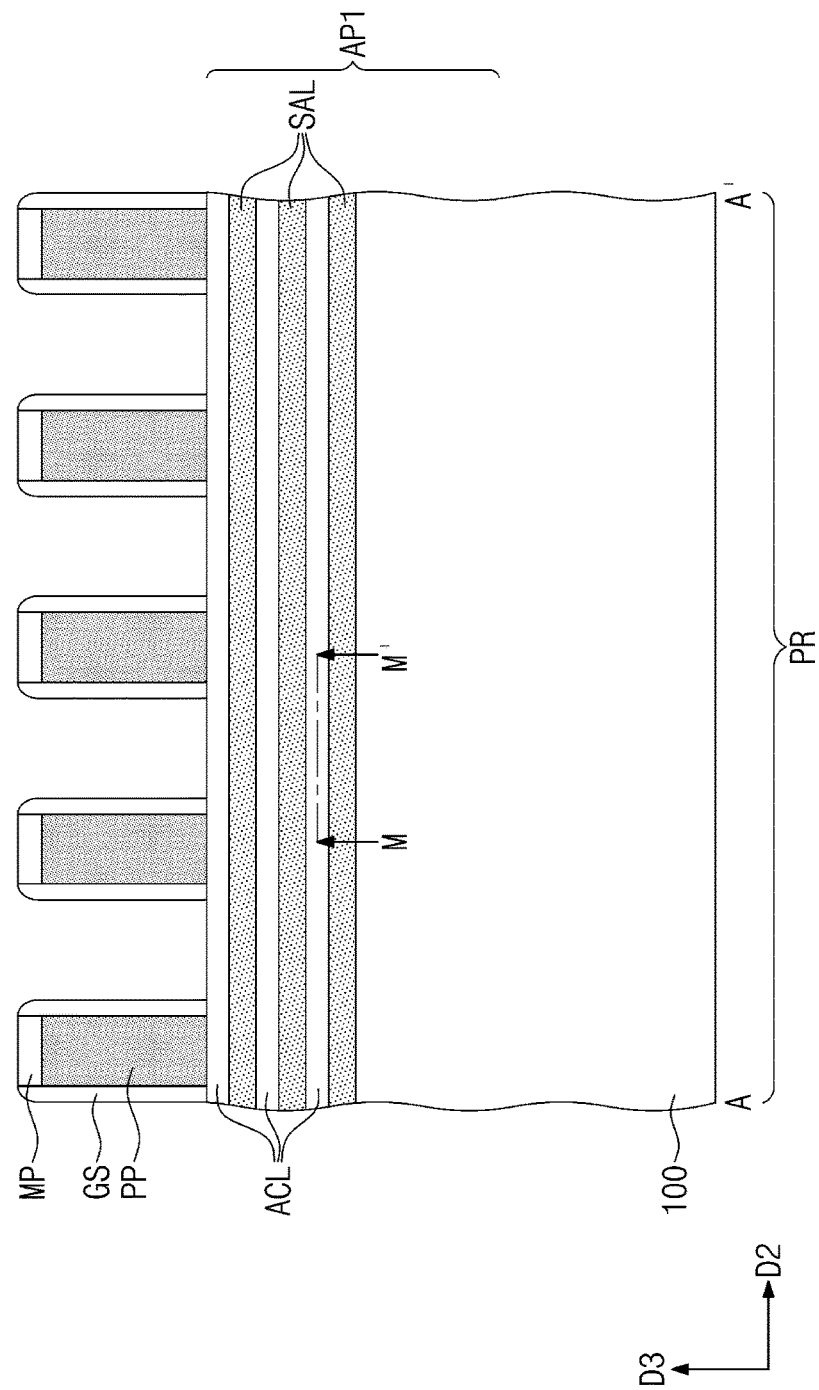
Figure 6B:
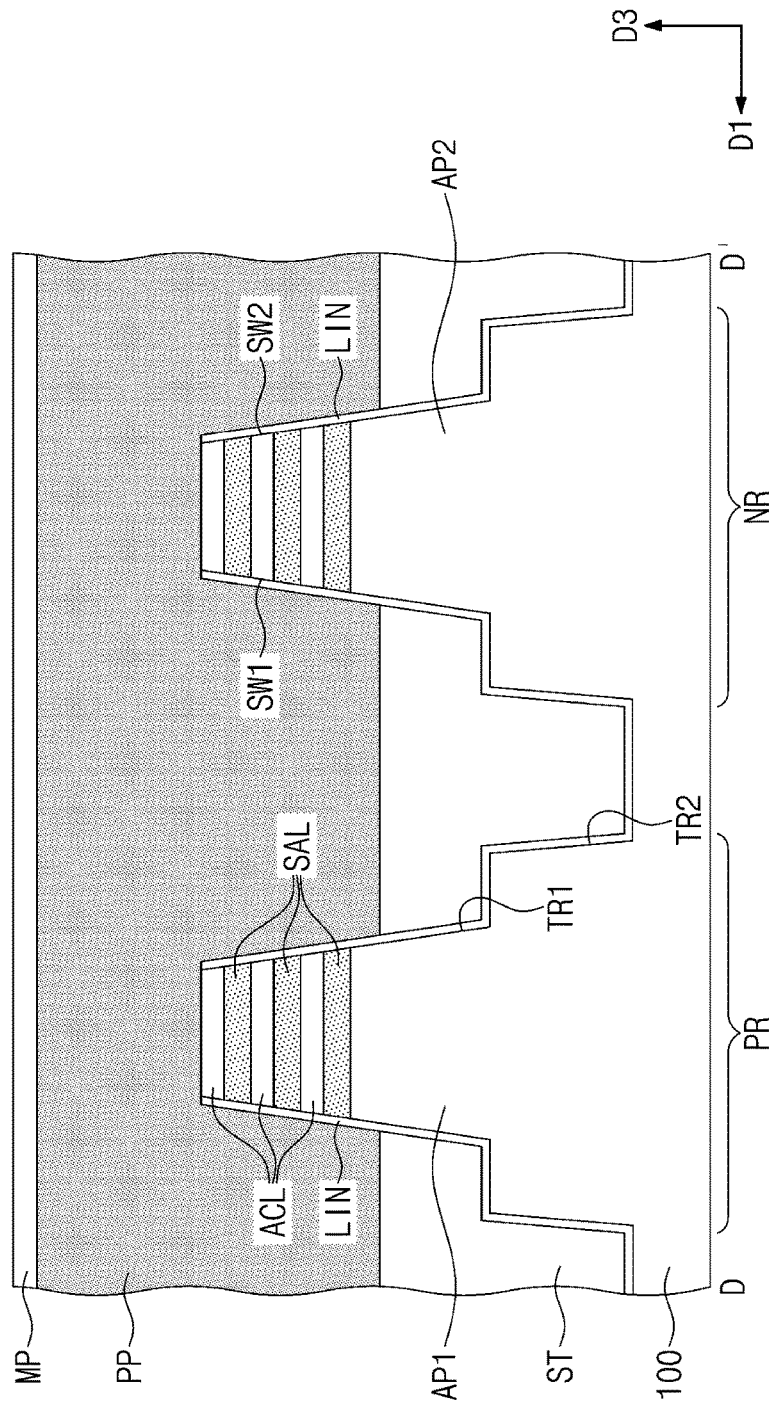
Figure 7A:
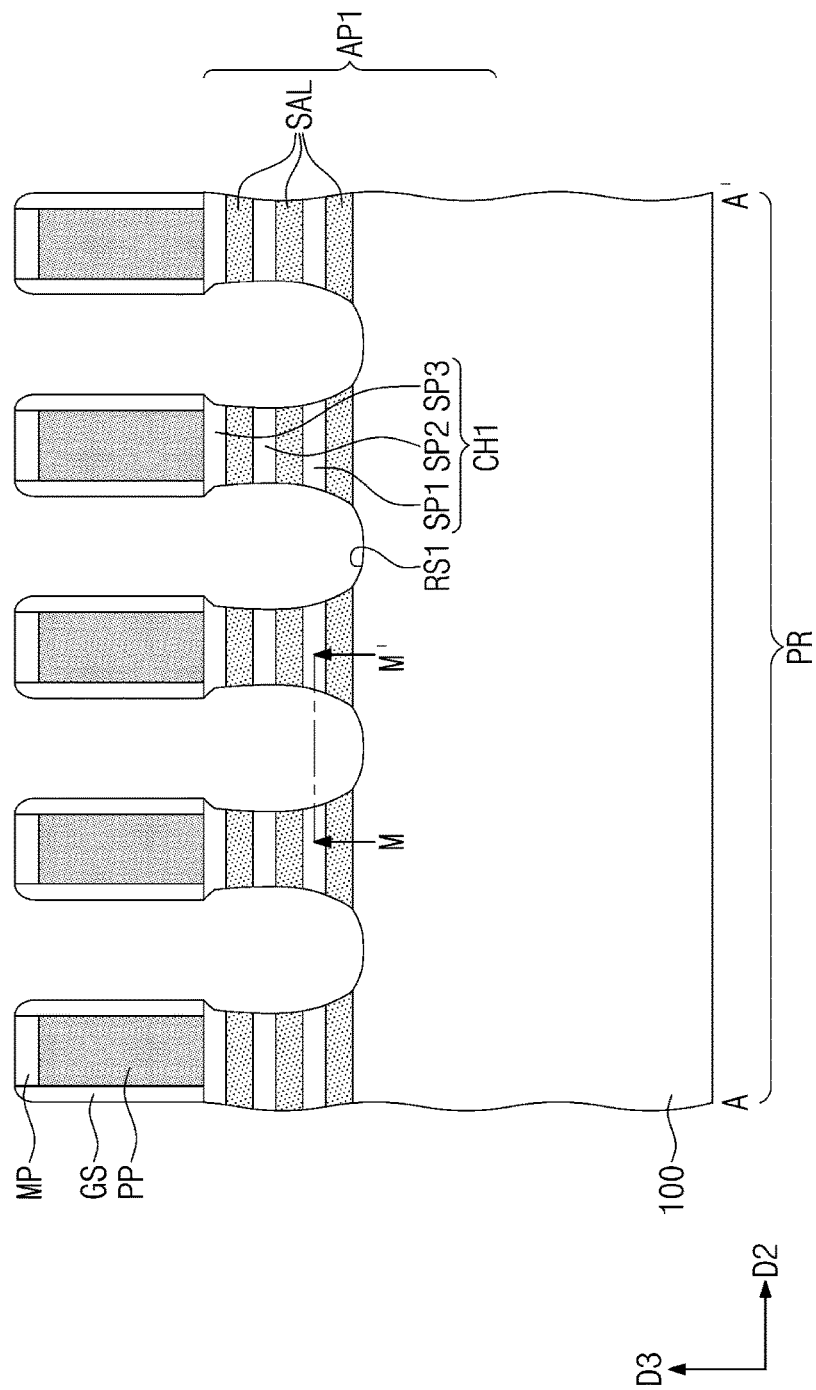
FIGS. 7B, 8B, 9B, 10B, and 11B are sectional views corresponding to the line B-B' of FIG. 1, illustrating a method of fabricating a semiconductor device according to an example embodiment of the inventive concept.
FIGS. 7C, 8C, 9C, 10C, and 11C are sectional views, which correspond to the line C-C' of FIG. 1, illustrating a method of fabricating a semiconductor device according to an example embodiment of the inventive concept.
Figure 7B:
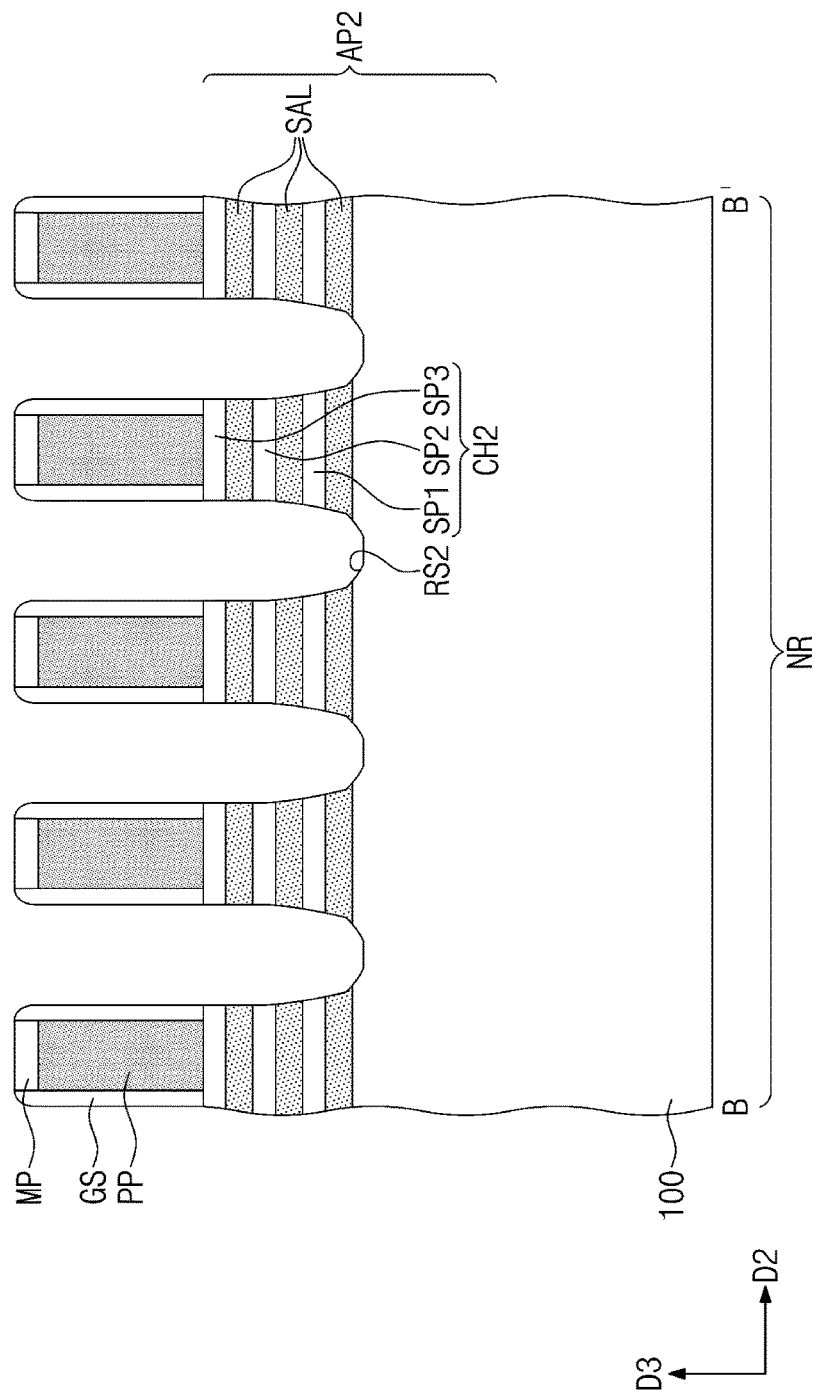
Figure 7C:
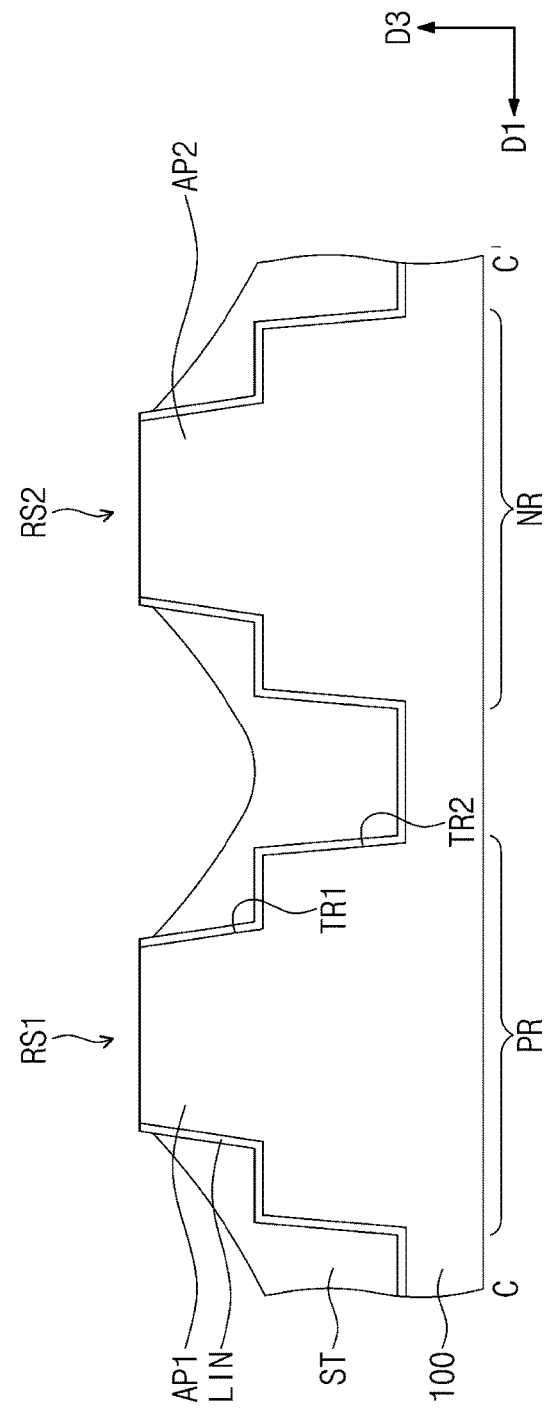
Figure 7D:
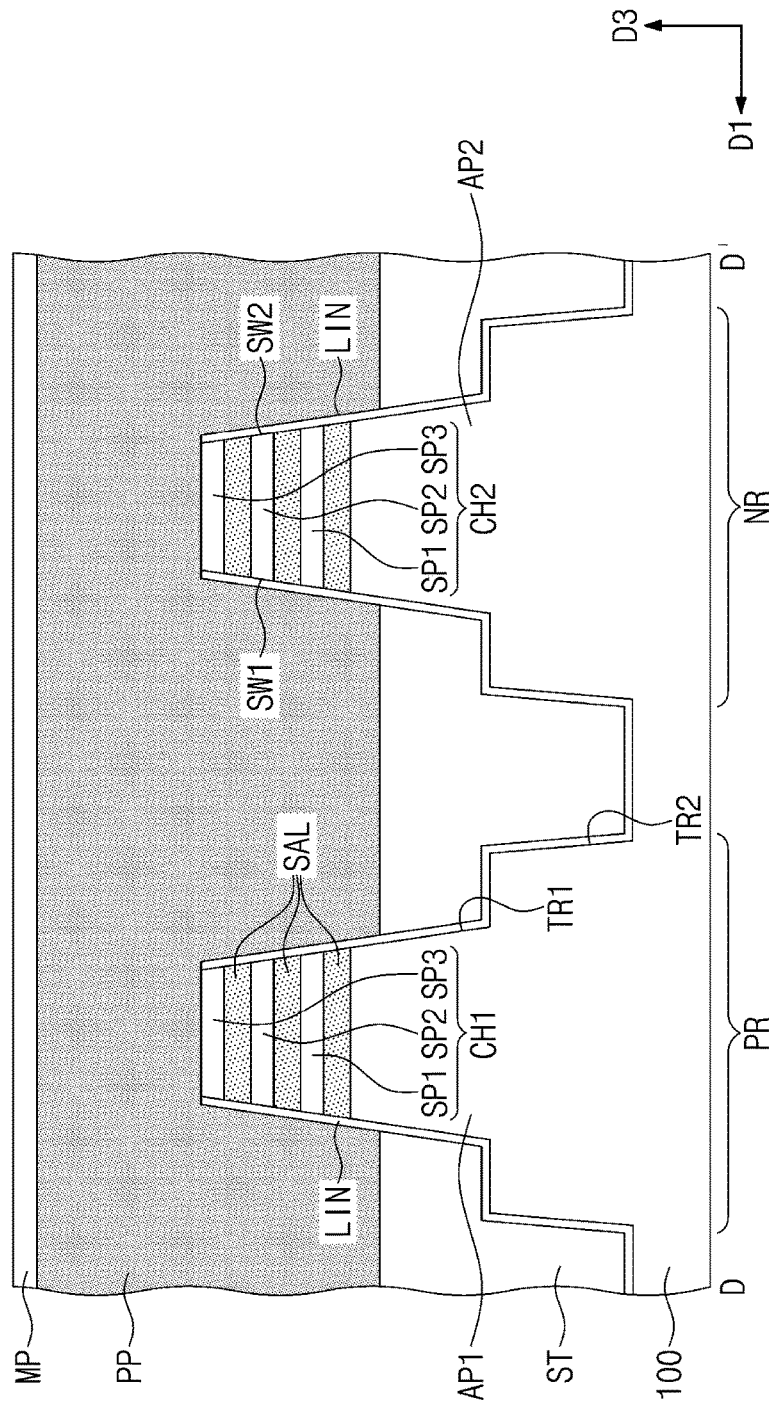

Referring to FIGS. 6A and 6B, sacrificial patterns PP may be formed on the substrate 100 to cross the first and second active patterns AP1 and AP2. Each of the sacrificial patterns PP may be formed to have a line-shape or bar-shape extending lengthwise in the first direction D1. The sacrificial patterns PP may be arranged, with a specific pitch, in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or may include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. The gate spacer layer may be formed of or may include at least one of SiCN, SiCON, or SiN. Alternatively, the gate spacer layer may include at least two layers, each of which is formed of at least one of SiCN, SiCON, or SiN; that is, the gate spacer layer may have a multi-layered structure.

Referring to FIGS. 7A to 7D, the first recesses RS1 may be formed in upper portions of the first active pattern AP1. The second recesses RS2 may be formed in upper portions of the second active pattern AP2. During the formation of the first and second recesses RS1 and RS2, the device isolation layer ST may be recessed at both sides of each of the first and second active patterns AP1 and AP2 (e.g., see FIG. 7C).

In detail, the first recesses RS1 may be formed by etching upper portions of the first active pattern AP1 using hard mask patterns MP and the gate spacers GS as an etch mask. Each of the first recesses RS1 may be formed between each pair of the sacrificial patterns PP. As shown in FIG. 12A, the active layer ACL may be extended lengthwise in the second direction D2. Both side surfaces SW1 and SW2 of the active layer ACL of the first active pattern AP1 may be covered with the liner layer LIN.

Referring to FIG. 12B, the first recess RS1 may be formed by removing the active layer ACL from a region between a pair of the sacrificial patterns PP, which are adjacent to each other in the second direction D2. At this time, a portion of the liner layer LIN may be removed from the region between the pair of the sacrificial patterns PP. As a result of the formation of the first recess RS1, the active layer ACL may be divided into a pair of first semiconductor patterns SP1, which are spaced apart from each other in the second direction D2.

The second recesses RS2 in the second active pattern AP2 may be formed in the same manner as the afore-described method, which is used to form the first recesses RS1.

Referring to FIGS. 8A to 8D, the first source/drain patterns SD1 may be formed in the first recesses RS1. The second source/drain patterns SD2 may be formed in the second recesses RS2.

Figure 8A:
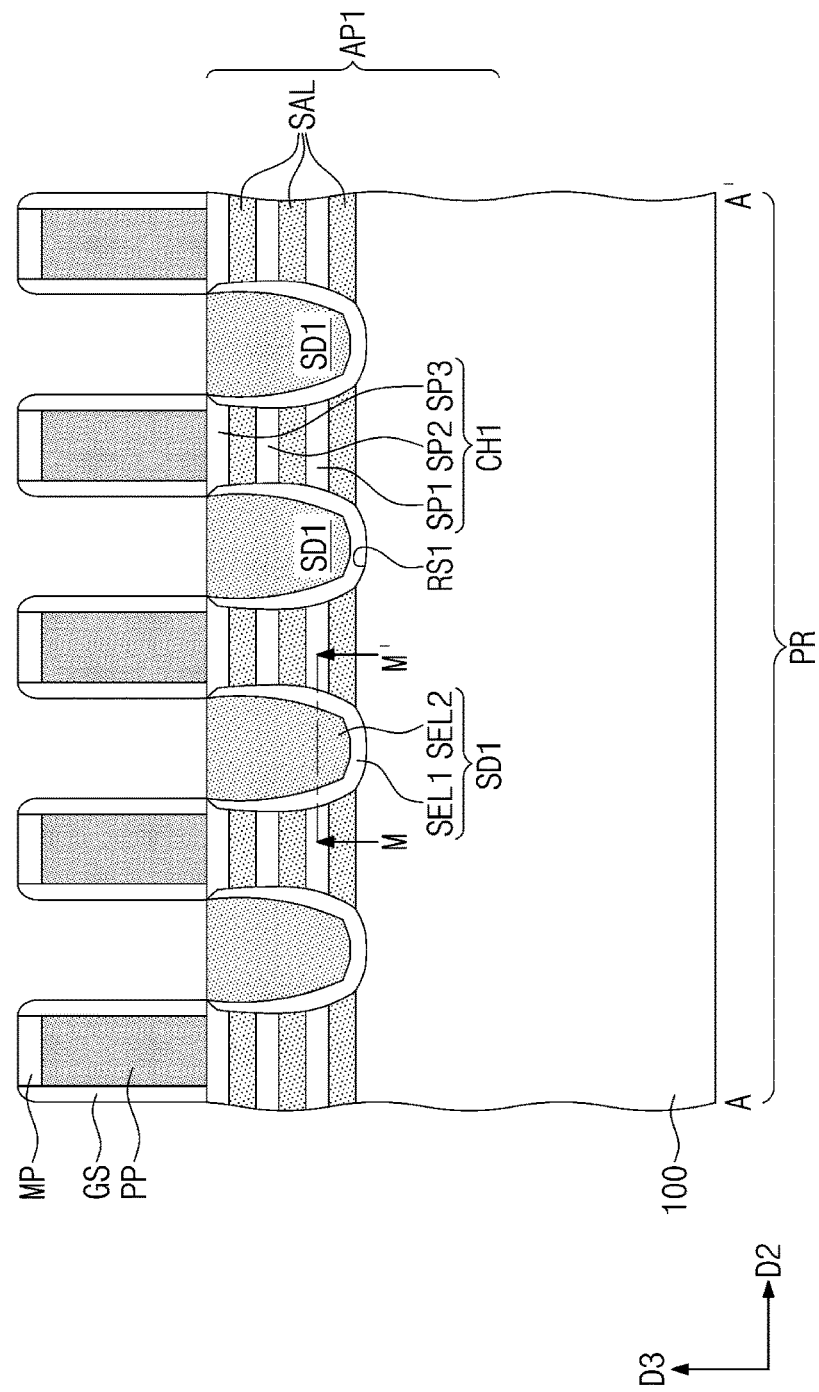
Figure 8B:
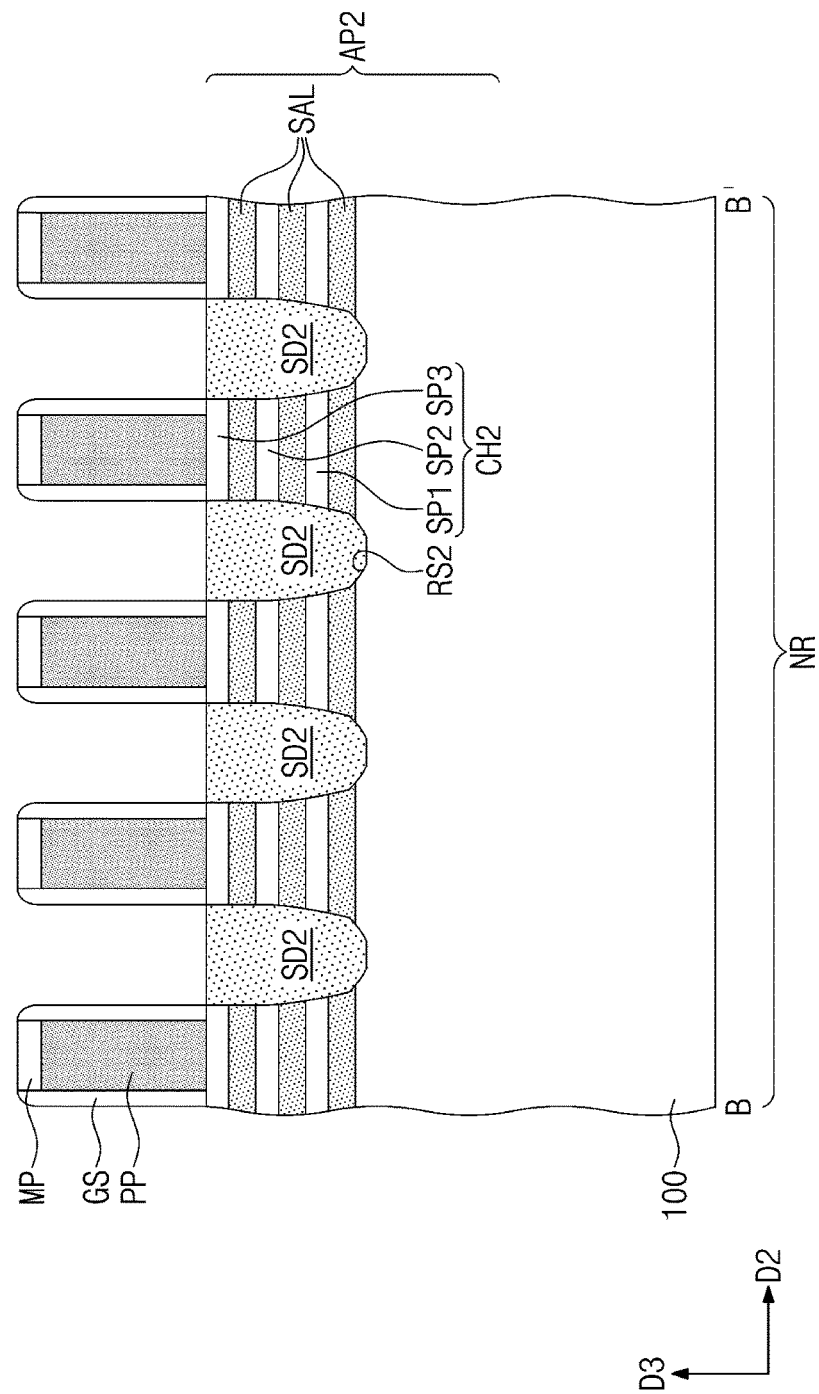
Figure 8C:
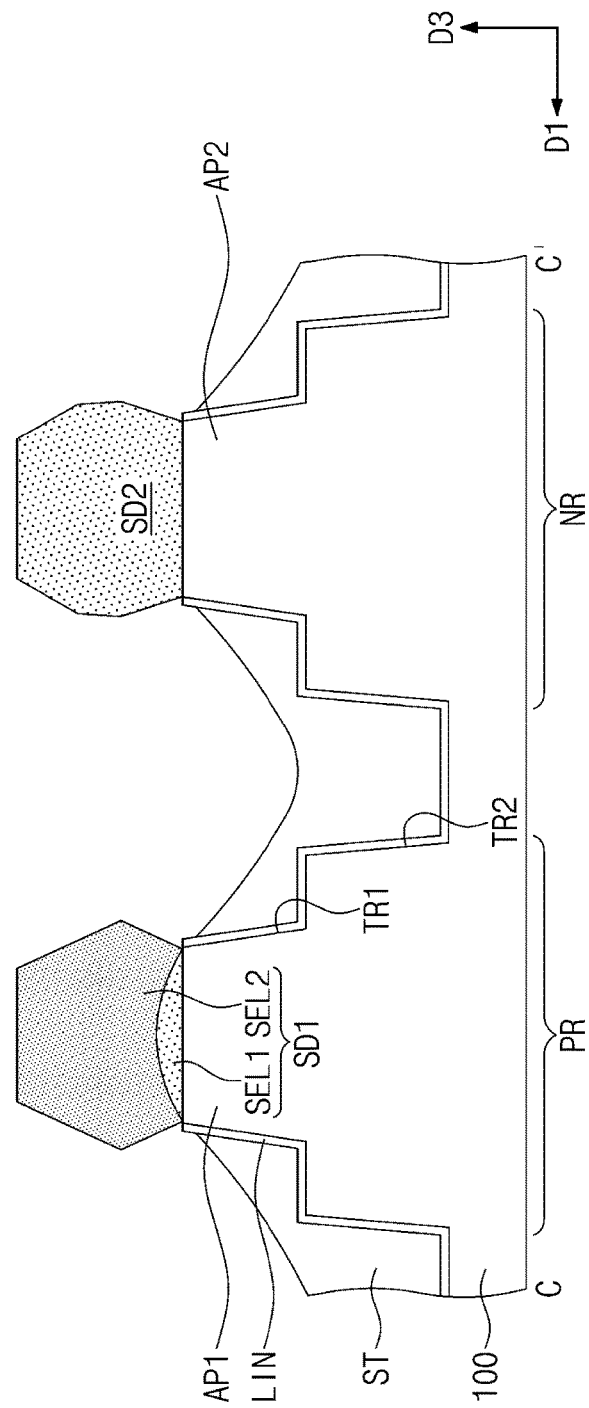
Figure 8D:
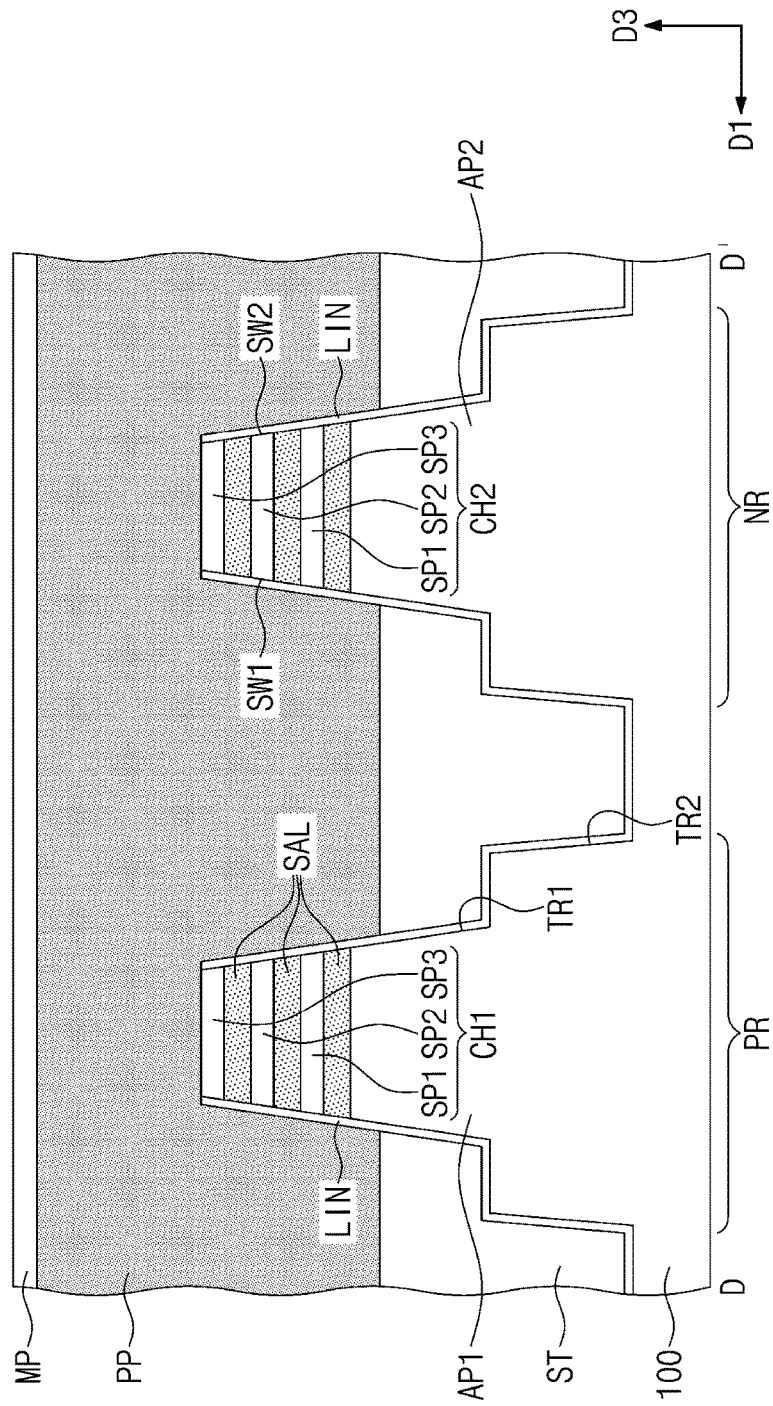

In detail, referring to FIGS. 8A, 12C, and 12D, a first selective epitaxial growth process, in which an inner surface of the first recess RS1 is used as a seed layer, may be performed to form the first semiconductor layer SEL1. For example, the first semiconductor layer SEL1 may be grown by using the first semiconductor pattern SP1 and the liner layer LIN as a seed layer. Thus, the width W2 of the first semiconductor layer SEL1 in the first direction D1 may be larger than the width W1 of the first semiconductor pattern SP1 in the first direction D1.

As an example, the first selective epitaxial growth process may include a chemical vapor deposition (CVD) process or a molecular beam epitaxy (MBE) process.

The first semiconductor layer SEL1 may be formed of or may include a semiconductor material (e.g., SiGe) having a lattice constant greater than that of the substrate 100. The first semiconductor layer SEL1 may be formed to have a relatively low germanium concentration. In another embodiment, the first semiconductor layer SEL1 may be provided to contain only silicon (Si) and not germanium (Ge). The germanium concentration of the first semiconductor layer SEL1 may range from 0 at % to 10 at %.

A second selective epitaxial growth process may be performed on the first semiconductor layer SEL1 to form the second semiconductor layer SEL2. The second semiconductor layer SEL2 may be formed to completely fill the first recess RS1. The second semiconductor layer SEL2 may be formed to have a relatively high germanium concentration. As an example, the germanium concentration of the second semiconductor layer SEL2 may range from 30 at % to 70 at %.

The first and second semiconductor layers SEL1 and SEL2 may constitute the first source/drain pattern SD1. During the selective epitaxial growth process to form the first and second semiconductor layers SEL1 and SEL2, impurities may be injected into the first and second semiconductor layers SEL1 and SEL2 in an in-situ manner. Alternatively, the first source/drain pattern SD1 may be doped with impurities, after the formation of the first source/drain pattern SD1. The first source/drain pattern SD1 may be doped to have a first conductivity type (e.g., p-type).

Referring back to FIGS. 8A to 8D, the second source/drain pattern SD2 may be formed by a selective epitaxial growth process, in which an inner surface of the second recess RS2 is used as a seed layer. In an embodiment, the second source/drain pattern SD2 may be formed of or may include the same semiconductor material (e.g., Si) as the substrate 100. The second source/drain pattern SD2 may be doped to have a second conductivity type (e.g., n-type).

Referring to FIGS. 9A to 9D, the first interlayer insulating layer 110 may be formed to cover the first and second source/drain patterns SD1 and SD2, the hard mask patterns MP, and the gate spacers GS. In an embodiment, the first interlayer insulating layer 110 may be formed of or may include silicon oxide.

The first interlayer insulating layer 110 may be planarized to expose top surfaces of the sacrificial patterns PP. The planarization of the first interlayer insulating layer 110 may be performed by an etch-back or chemical mechanical polishing (CMP) process. All of the hard mask patterns MP may be removed during the planarization process. As a result, the first interlayer insulating layer 110 may have a top surface that is substantially coplanar with the top surfaces of the sacrificial patterns PP and the top surfaces of the gate spacers GS.

Figure 9A:
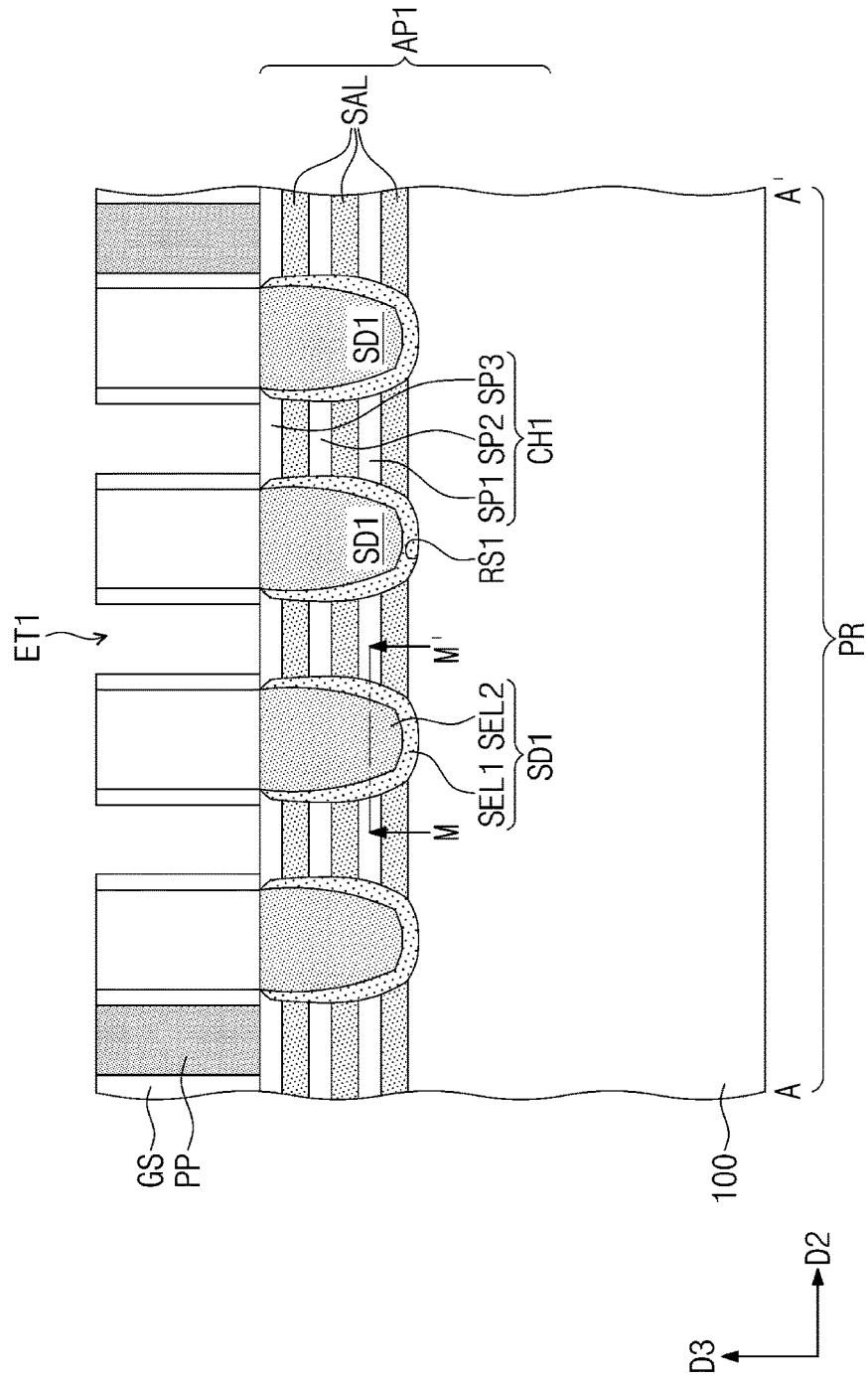
Figure 9B:
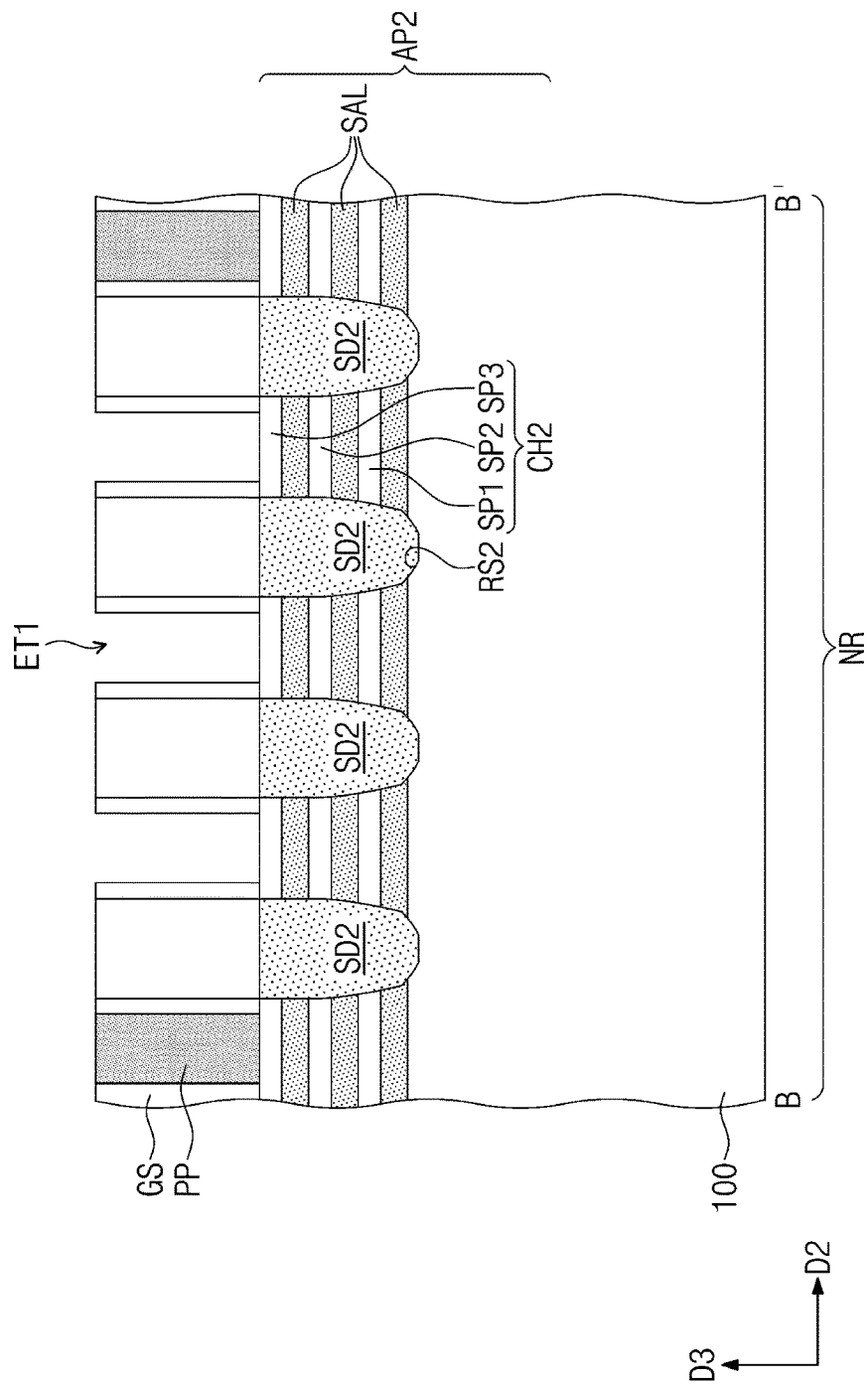
Figure 9C:
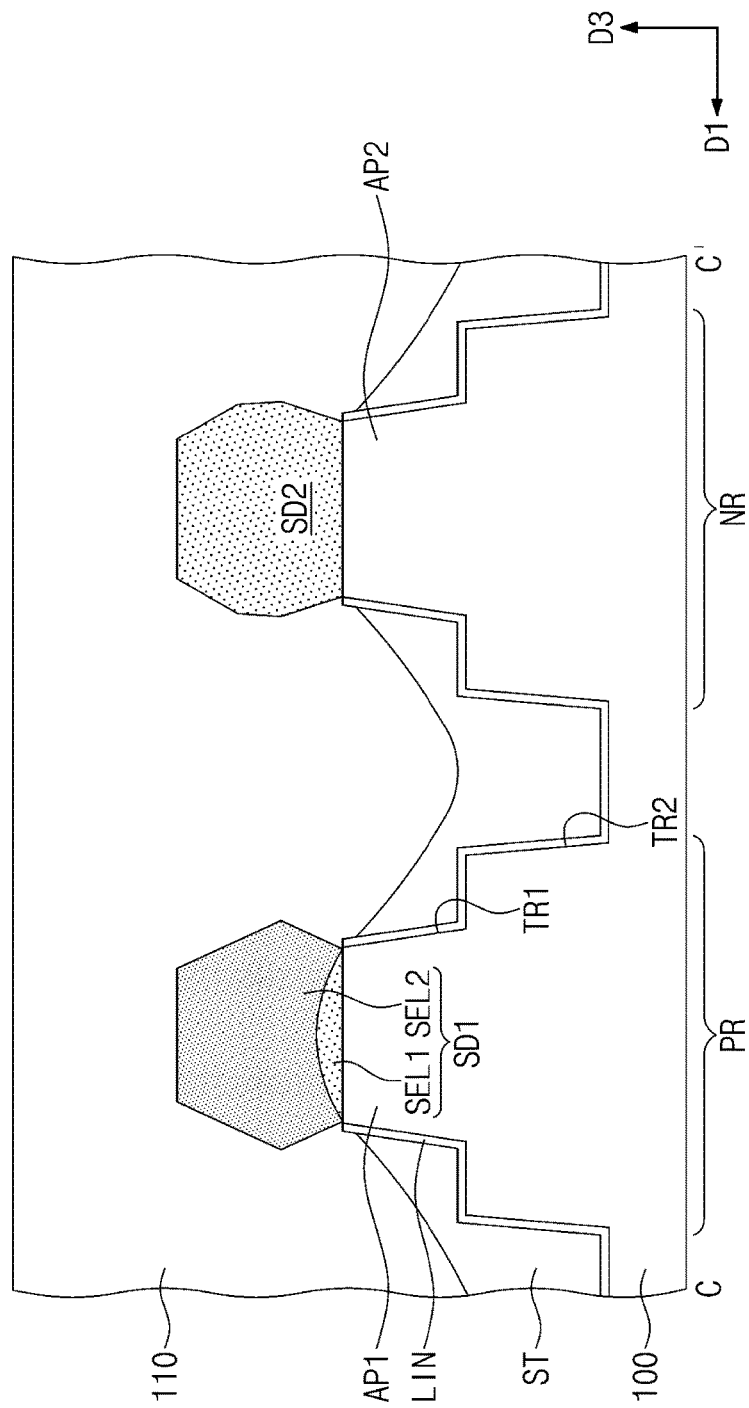
Figure 9D:
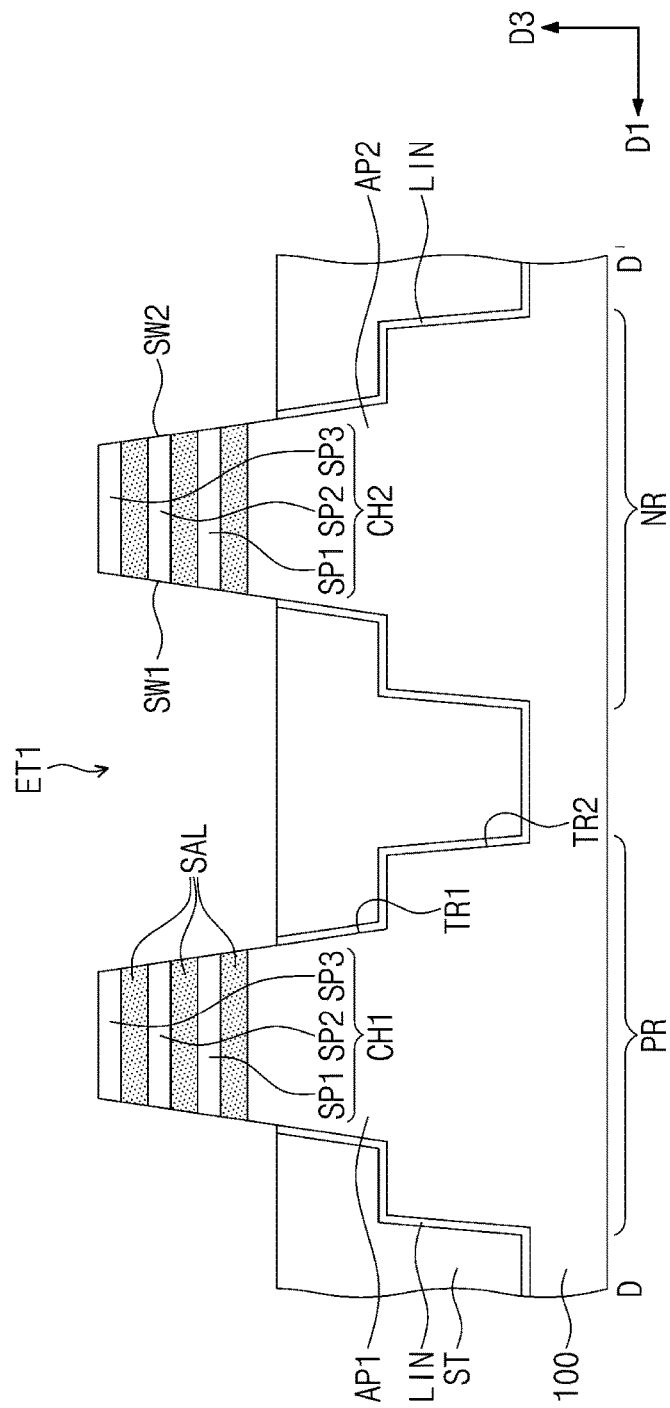

In an embodiment, the exposed sacrificial patterns PP may be selectively removed. As a result of the removal of the sacrificial pattern PP, first empty spaces ET1 exposing the first and second active patterns AP1 and AP2 may be formed, as shown in FIG. 9D.

In an embodiment, portions of the sacrificial patterns PP may not be removed. For example, the sacrificial pattern PP near a cell border may not be removed. In detail, the sacrificial patterns PP, which should not be removed, may be left by forming a mask layer on the same.

As a result of the removal of the sacrificial pattern PP, the first and second active patterns AP1 and AP2 may be exposed through the first empty space ET1. The liner layer LIN covering the first and second side surfaces SW1 and SW2 of each of the first and second active patterns AP1 and AP2 may also be exposed through the first empty space ET1. A trimming process on an exposed portion of the liner layer LIN may be performed to selectively remove the liner layer LIN. The trimming process may be controlled to selectively remove only the exposed portion of the liner layer LIN.

As a result of the removal of the liner layer LIN, the first and second side surfaces SW1 and SW2 of each of the first and second active patterns AP1 and AP2 may be exposed through the first empty space ET1. As a result of the removal of the liner layer LIN, the sacrificial layers SAL may be exposed through the first empty space ET1, as shown in FIG. 9D.

In detail, referring to FIG. 12E, during the trimming process, the liner layer LIN covering both side surfaces SW1 and SW2 of the first semiconductor pattern SP1 may be removed through the first empty space ET1. In an embodiment, a portion of the liner layer LIN may be interposed between the gate spacer GS and the first semiconductor layer SEL1 of the first source/drain pattern SD1. Since the portion of the liner layer LIN is not exposed to the outside by the gate spacer GS, it may not be removed during the trimming process and may be left after during the trimming process. The unremoved portion of the liner layer LIN may constitute the remnant semiconductor pattern RSP.

Referring to FIGS. 10A to 10D, the sacrificial layers SAL exposed through the first empty space ET1 may be selectively removed. For example, referring back to FIG. 10D, the sacrificial layers SAL of each of the first and second active patterns AP1 and AP2 may be exposed to the outside through the first empty space ET1. The sacrificial layers SAL may be selectively removed by an etching process of selectively etching the sacrificial layers SAL (i.e., preventing or suppressing the first to third semiconductor patterns SP1, SP2, and SP3 from being etched).

The etching process may be chosen to exhibit a high etch rate for a material (e.g., SiGe) having a relatively high germanium concentration. For example, the etching process may have a high etch rate for silicon-germanium whose germanium concentration is higher than 10 at %.

Figure 10A:
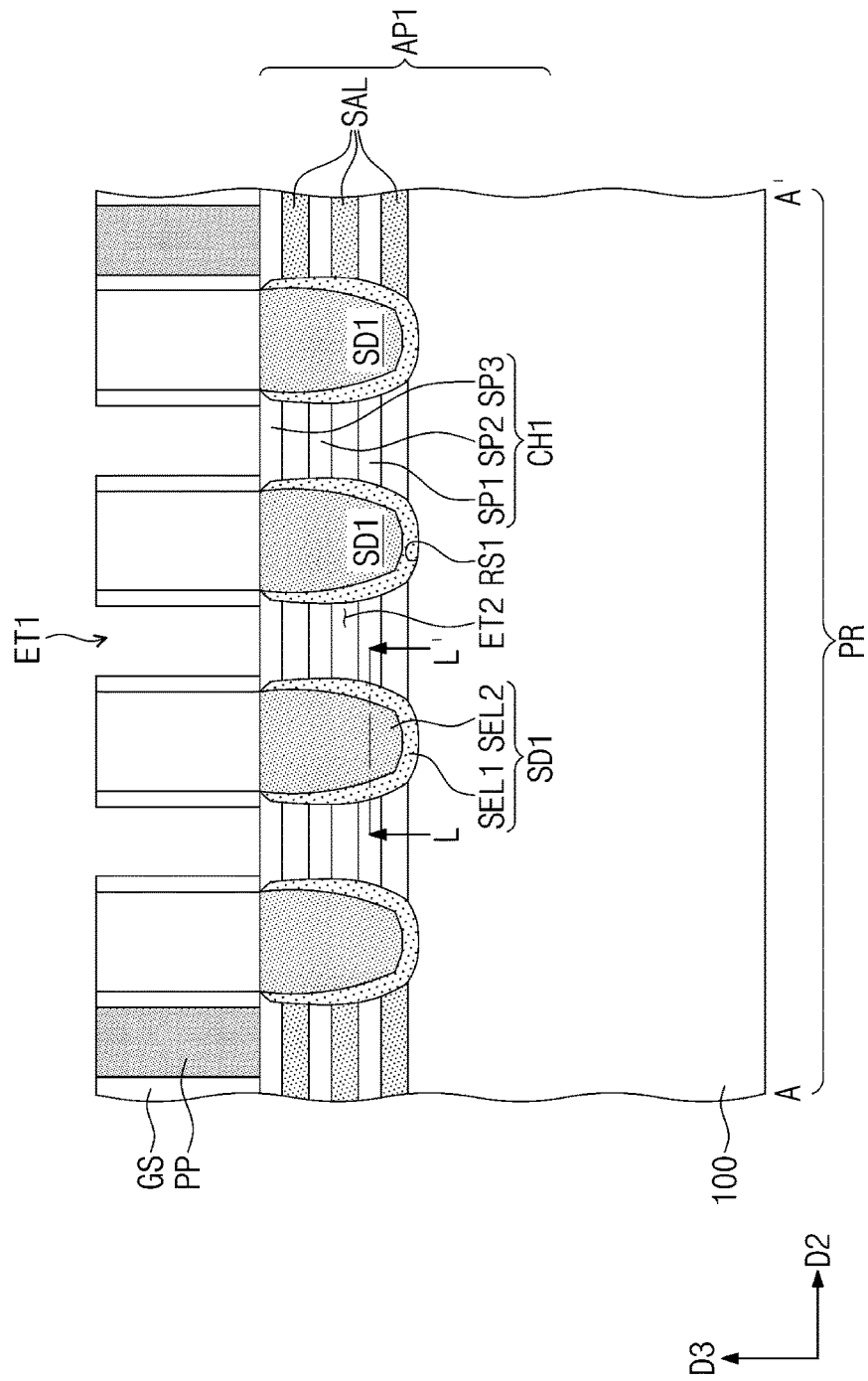

Referring to FIGS. 10A and 13, the sacrificial layers SAL on the PMOSFET region PR may be removed during the etching process. The etching process may be a wet etching process. An etching material ETC, which is used for the etching process, may quickly remove the sacrificial layer SAL with a relatively high germanium concentration but may hardly remove the first semiconductor layer SEL1 with a relatively low germanium concentration.

Meanwhile, the second semiconductor layer SEL2 may have a relatively high germanium concentration, and thus, if the etching material ETC is supplied into the second semiconductor layer SEL2, the second semiconductor layer SEL2 may be easily removed. Such a removal of the second semiconductor layer SEL2 caused by the etching material ETC may result in severe process failures.

By contrast, according to an example embodiment of the inventive concept, the first semiconductor layer SEL1 may be formed to have the width W2 that is larger than the width of the sacrificial layer SAL in the second direction D2, as described above. Thus, it may be possible to effectively prevent the etching material ETC from being supplied into the second semiconductor layer SEL2. This may make it possible to prevent the afore-described process failures and to improve the reliability of the semiconductor device.

Figure 10B:
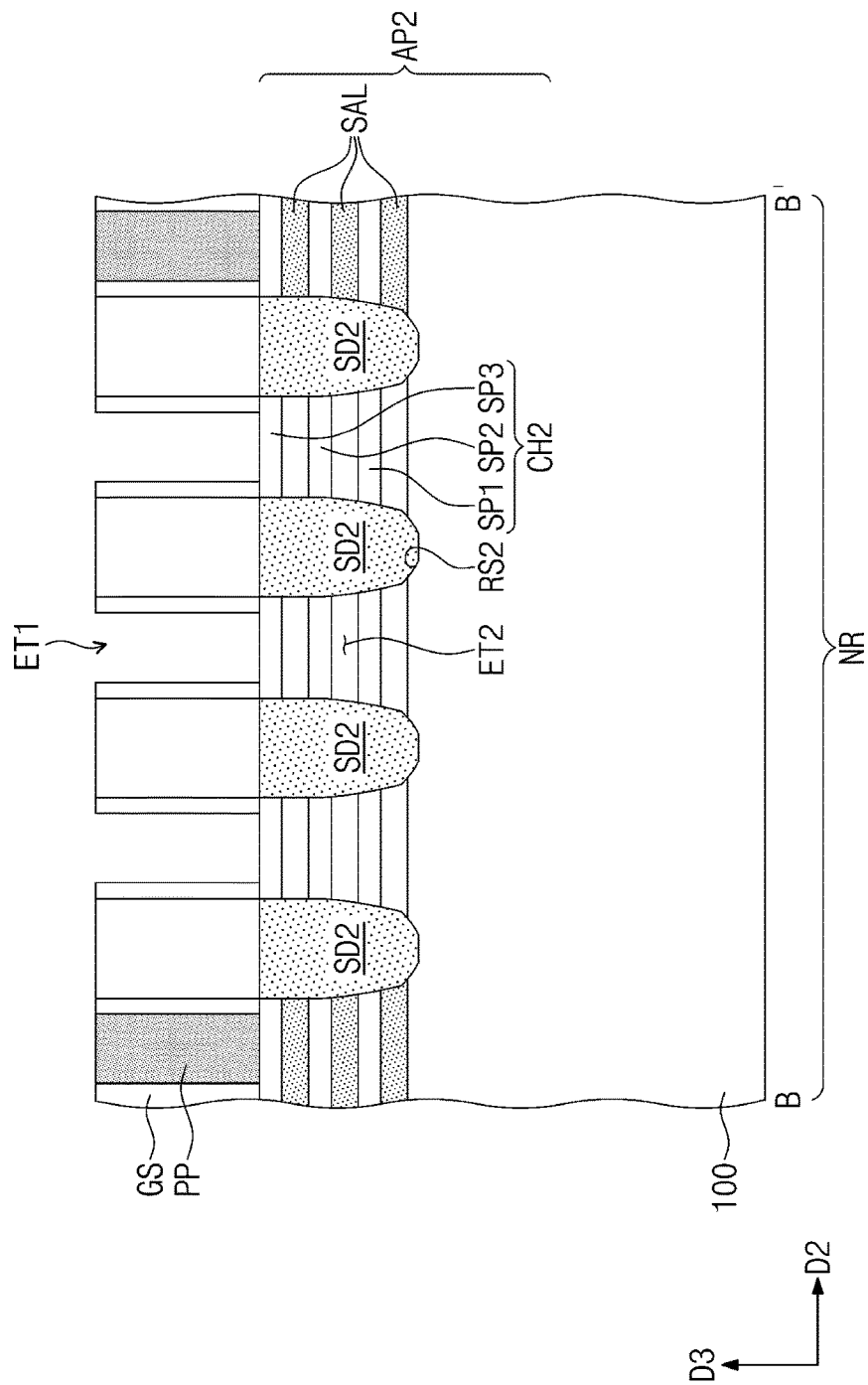
Figure 10C:
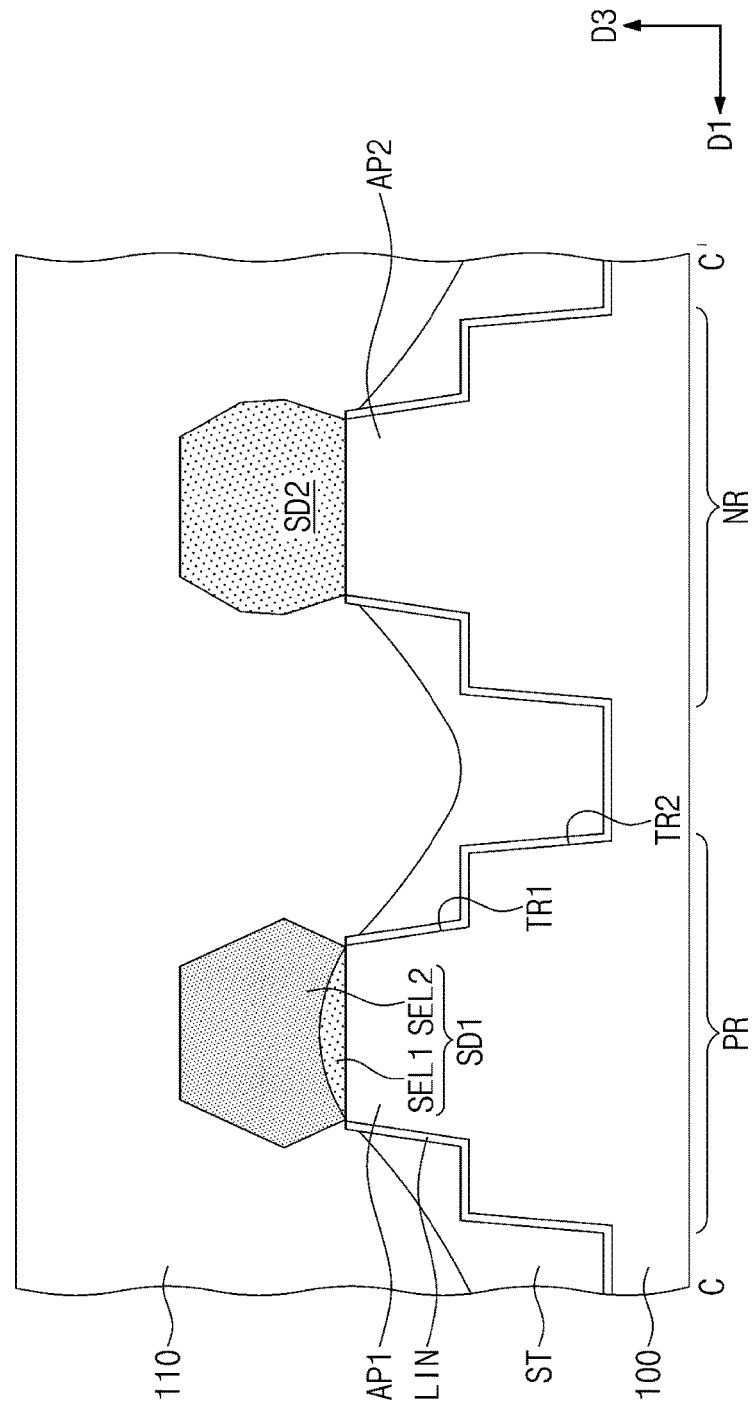
Figure 10D:
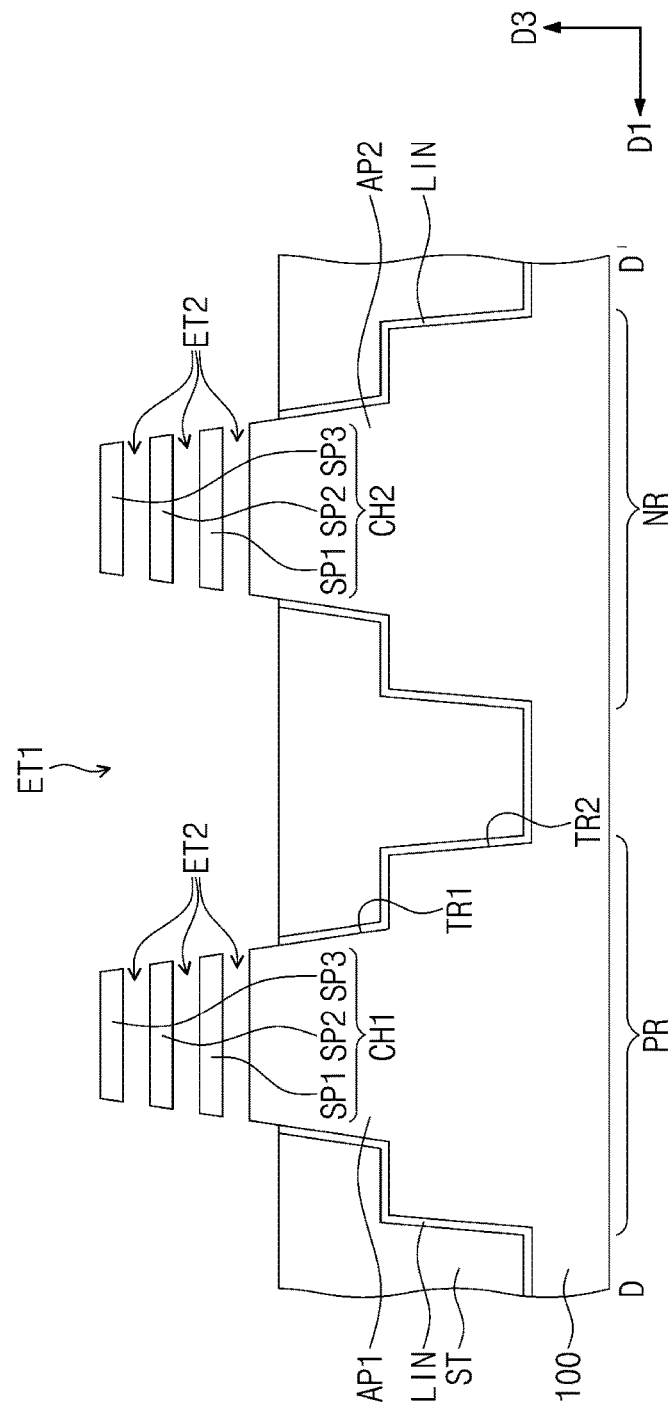
Figure 11A:
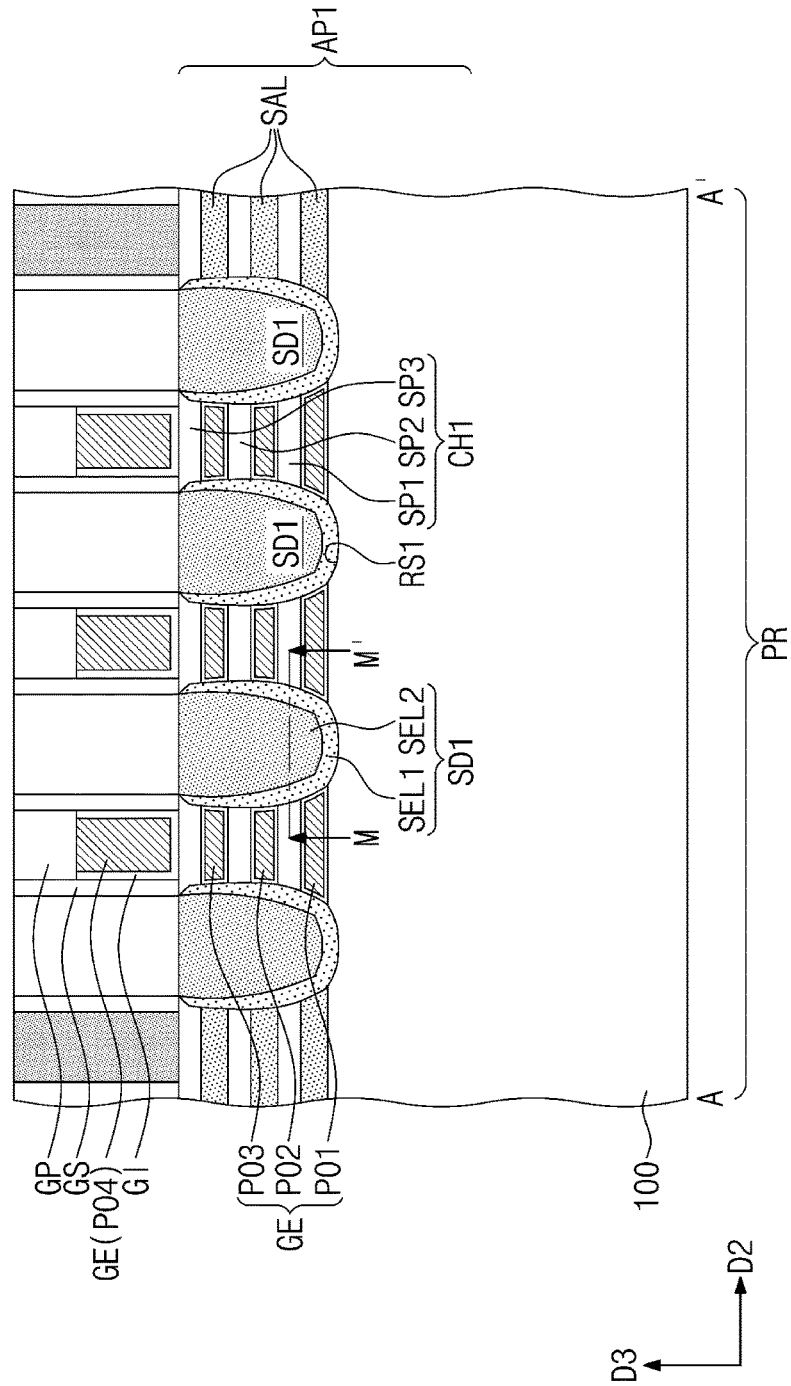
Figure 11B:
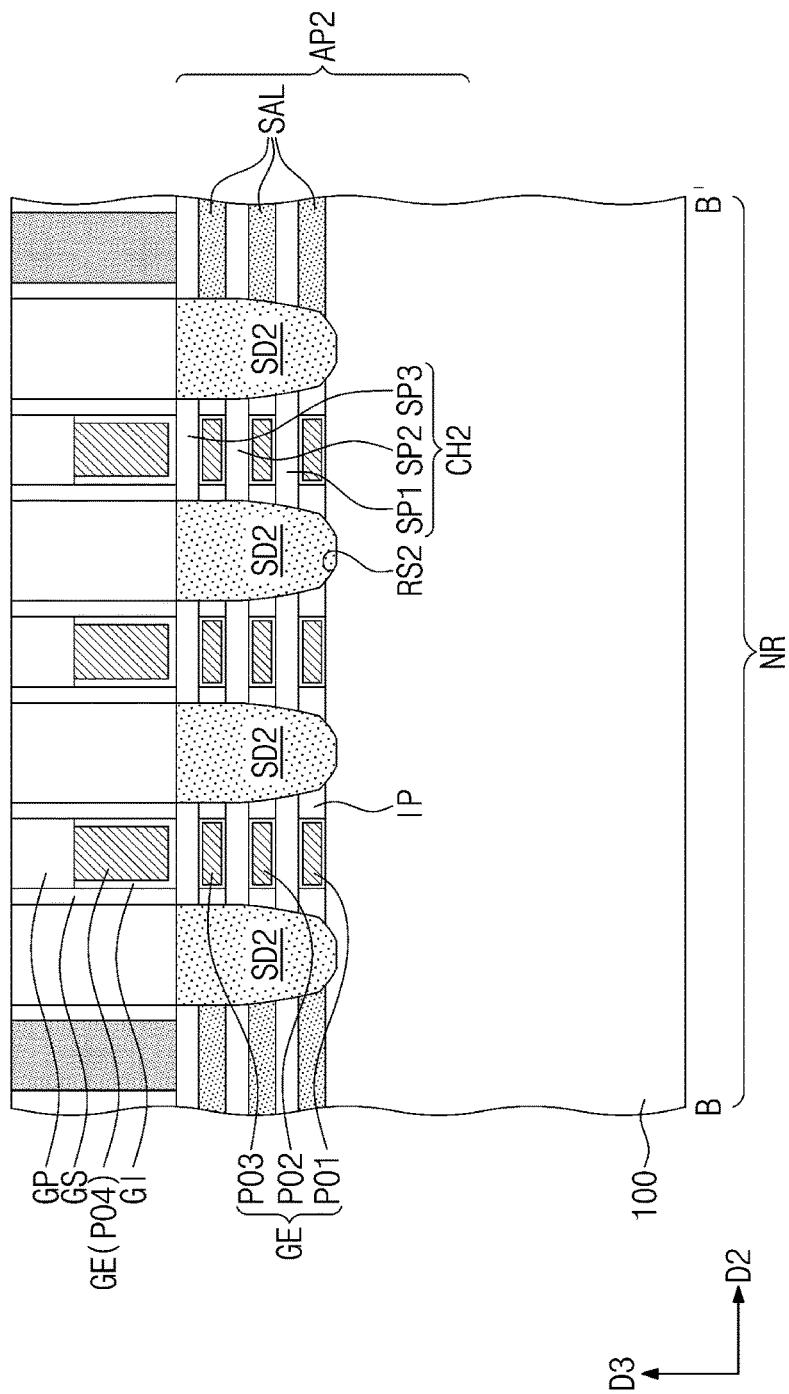
Figure 11C:
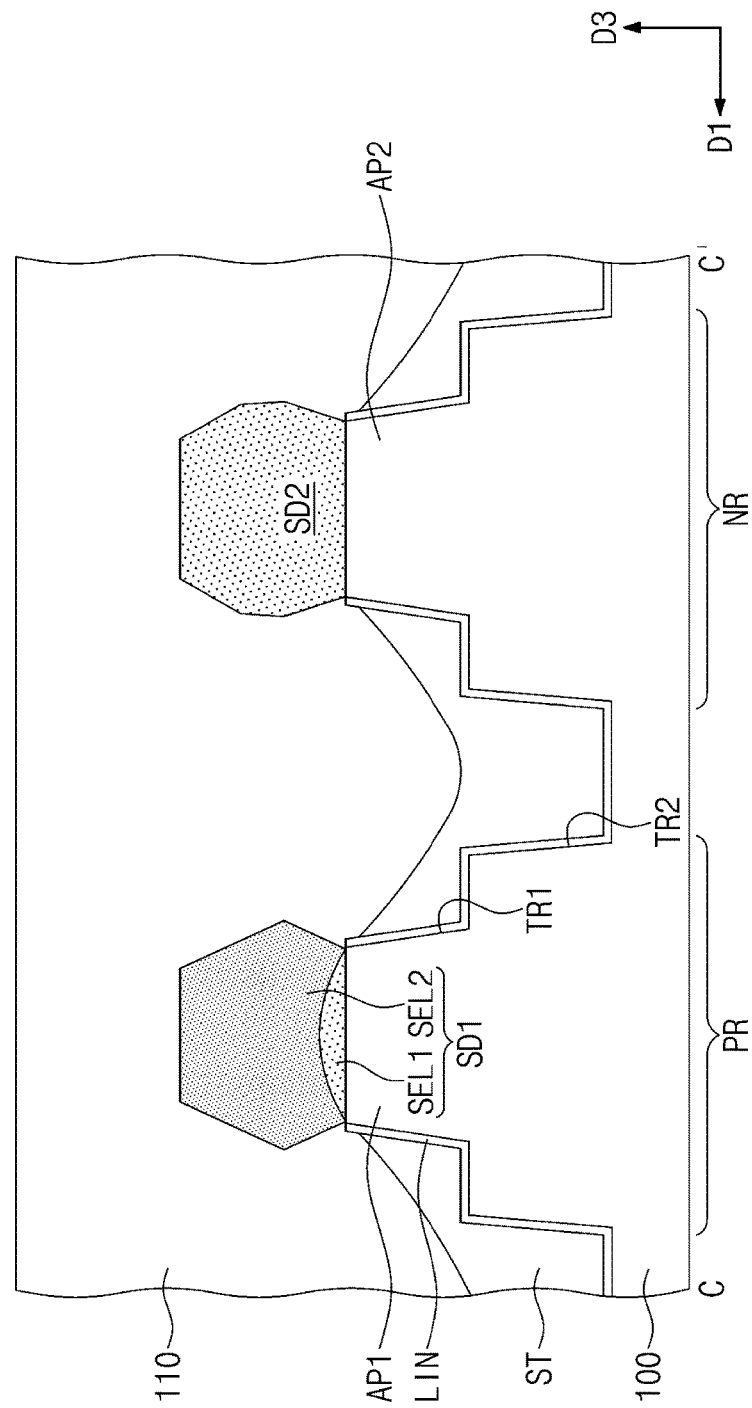
Figure 11D:
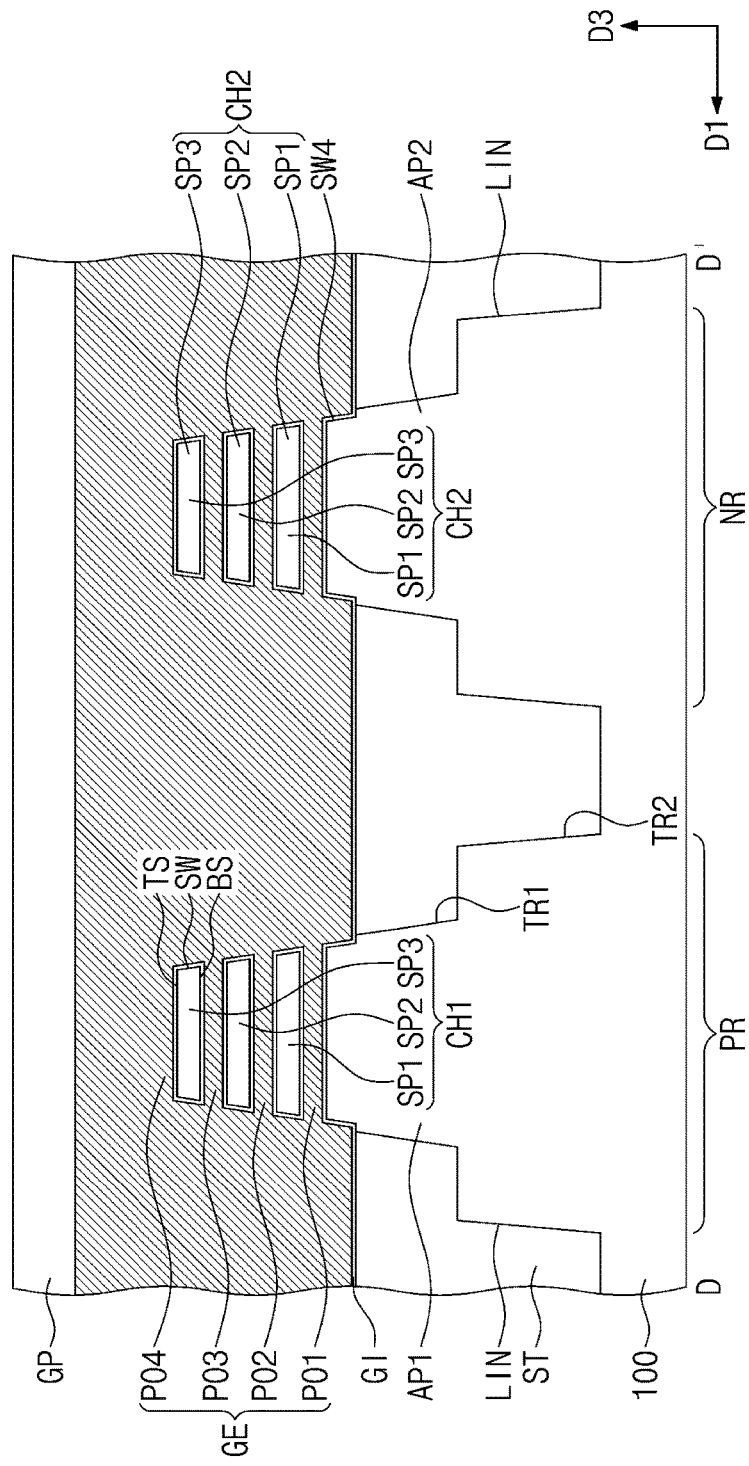

Referring to FIG. 10B, the sacrificial layers SAL on the NMOSFET region NR may also be removed during the etching process. Since the first source/drain patterns SD1 contain only silicon (Si), not germanium (Ge), the first source/drain patterns SD1 may not be removed by the etching process and may be left after the etching process.

Referring back to FIG. 10D, since the sacrificial layers SAL are selectively removed, only the first to third semiconductor patterns SP1, SP2, and SP3 may be left on each of the first and second active patterns AP1 and AP2. That is, second empty spaces ET2 may be formed as the removal of the sacrificial layers SAL. The second empty spaces ET2 may be formed between the first to third semiconductor patterns SP1, SP2, and SP3.

Referring to FIGS. 11A to 11D and 12F, the gate insulating layer GI may be conformally formed in the first and second empty spaces ET1 and ET2. In detail, the interface layer IL may be formed on an exposed surface of each of the first to third semiconductor patterns SP1, SP2, and SP3. The interface layer IL may be formed using a thermal oxidation process. The high-k dielectric layer HK may be conformally formed on the interface layer IL. The high-k dielectric layer HK may cover the interface layer IL. The interface layer IL and the high-k dielectric layer HK may constitute the gate insulating layer GI.

During the thermal oxidation process, the liner layer LIN covered with the device isolation layer ST may be crystallized by the first and second active patterns AP1 and AP2. In this case, an observable boundary between the liner layer LIN and the first and second active patterns AP1 and AP2 may disappear. As a result, the third side surface SW3 the fourth side surface SW4, and the flat surface PLP therebetween may be defined in each of the first and second active patterns AP1 and AP2, as previously described with reference to FIG. 2D.

The gate electrode GE may be formed in the first and second empty spaces ET1 and ET2. The gate electrode GE may include the first to third portions PO1, PO2, and PO3 filling the second empty spaces ET2. The gate electrode GE may further include the fourth portion PO4 filling the first empty space ET1. The gate capping pattern GP may be formed on the gate electrode GE.

In an embodiment, the insulating patterns IP may be formed on the NMOSFET region NR, before the formation of the gate insulating layer GI. The insulating pattern IP may be formed to partially fill the second empty space ET2. In this case, the gate electrode GE on the NMOSFET region NR may be spaced apart from the second source/drain pattern SD2 with the insulating pattern IP interposed therebetween.

Referring back to FIGS. 1 and 2A to 2D, the second interlayer insulating layer 120 may be formed on the first interlayer insulating layer 110. The second interlayer insulating layer 120 may include a silicon oxide layer. The active contacts AC, which are electrically connected to the first and second source/drain patterns SD1 and SD2, may be formed to penetrate the second interlayer insulating layer 120 and the first interlayer insulating layer 110. The gate contact GC, which is electrically connected to the gate electrode GE, may be formed to penetrate the second interlayer insulating layer 120 and the gate capping pattern GP.

A pair of dividing structures DB may be formed at both sides of the logic cell LC. The dividing structure DB may be formed to penetrate the second interlayer insulating layer 120, the remaining sacrificial pattern PP, and an upper portion of the active pattern AP1 or AP2 below the sacrificial pattern PP. The dividing structure DB may be formed of or may include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 15A:
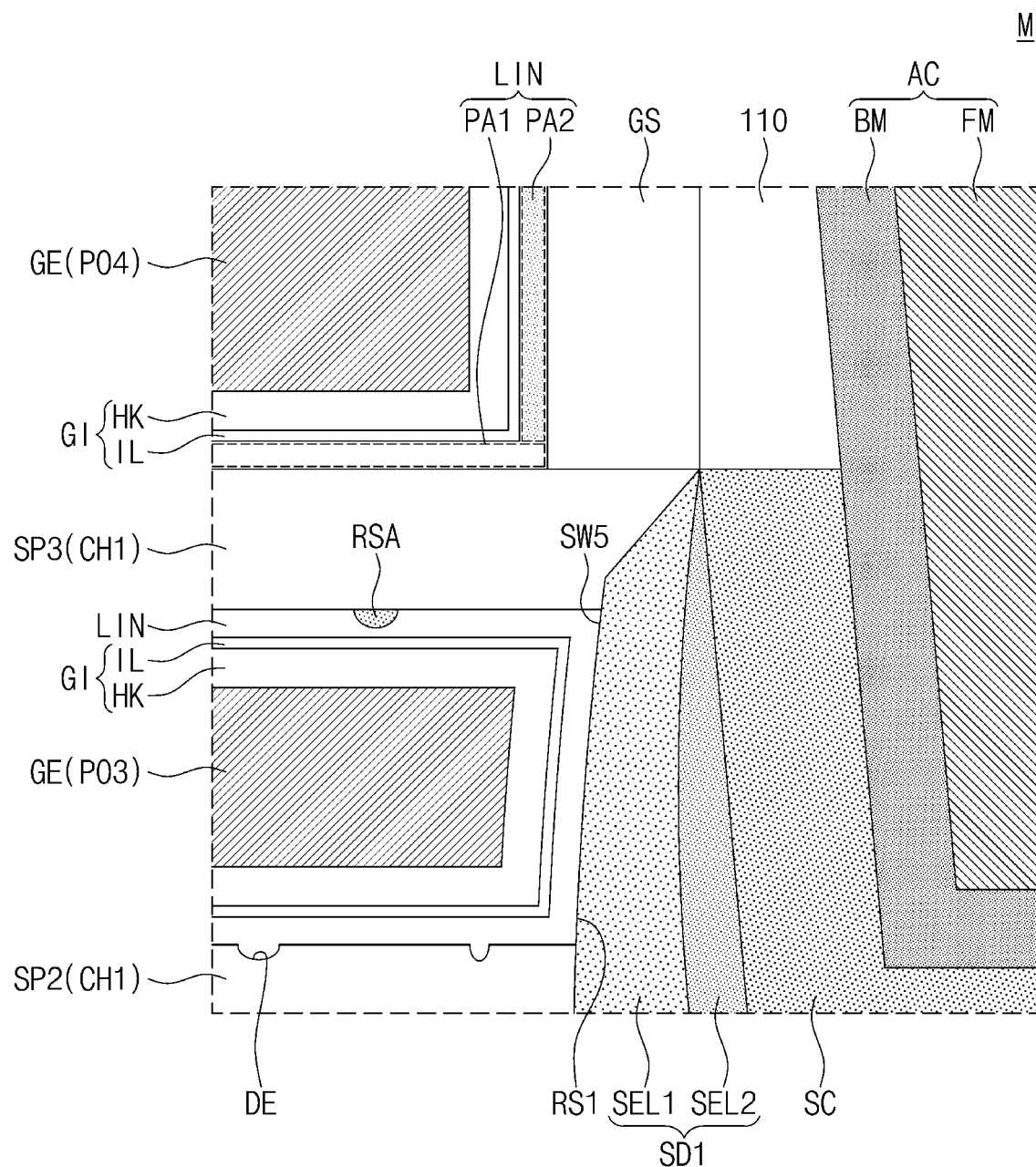
FIG. 15A is an enlarged sectional view illustrating a portion M of FIG. 14A.
Figure 15B:
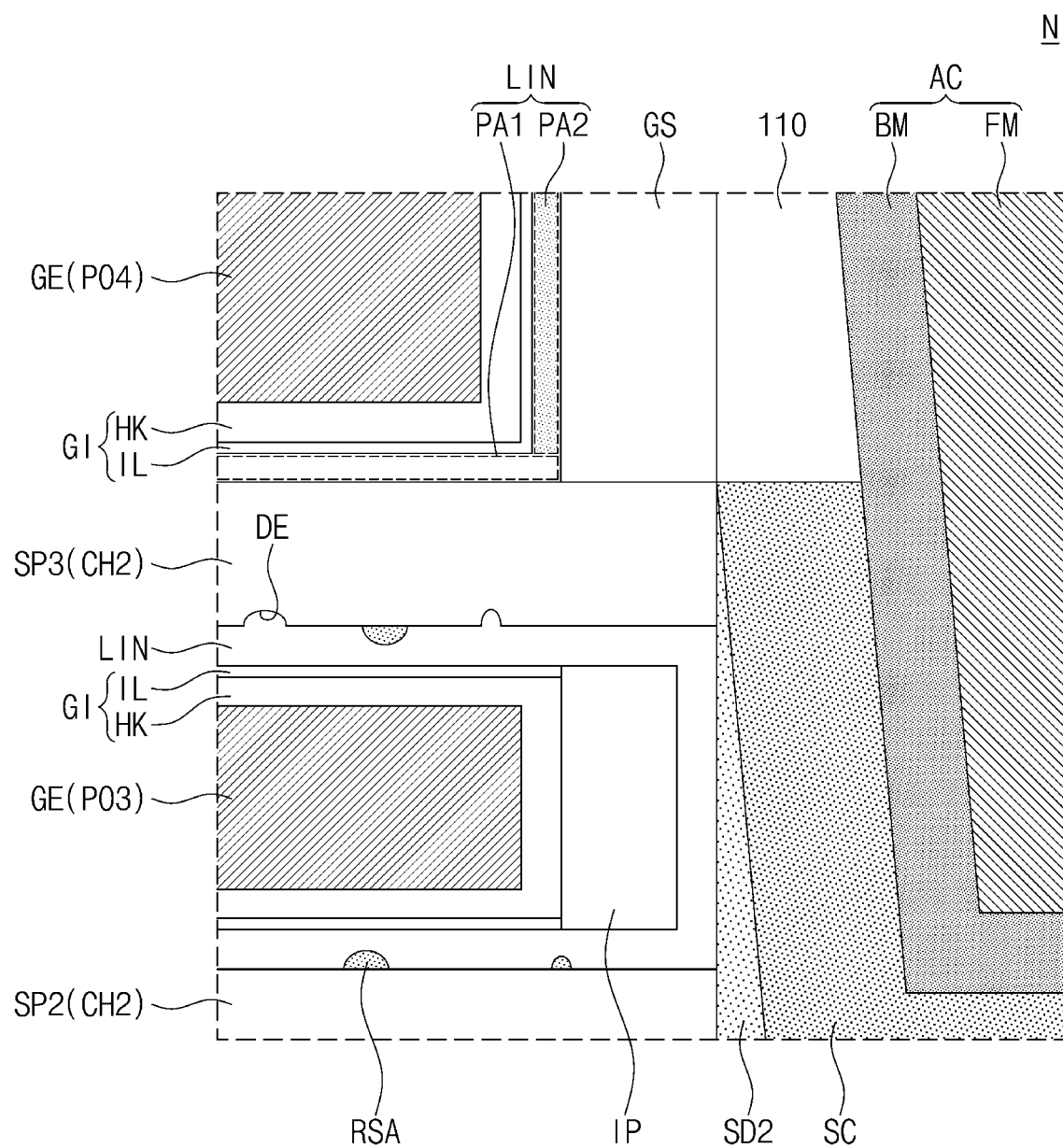
FIG. 15B is an enlarged sectional view illustrating a portion N of FIG. 14B.

FIGS. 14A to 14D are sectional views, which are respectively taken along the lines A-A', B-B', C-C', and D-D' of FIG. 1 to illustrate a semiconductor device according to an example embodiment of the inventive concept. FIG. 15A is an enlarged sectional view illustrating a portion M of FIG. 14A. FIG. 15B is an enlarged sectional view illustrating a portion N of FIG. 14B. In the following description, an element previously described with reference to FIG. 1 and FIGS. 2A to 2D may be identified by the same reference number without repeating an overlapping description thereof.

Referring to FIGS. 14A to 14D and 15A, the liner layer LIN may be provided on a surface of each of the first to third semiconductor patterns SP1, SP2, and SP3 on the PMOSFET region PR. The liner layer LIN may be formed of or may include the same materials (e.g., silicon (Si)) as the first to third semiconductor patterns SP1, SP2, and SP3. The liner layer LIN may have a thickness ranging from 1 nm to 4 nm.

In detail, the liner layer LIN may be provided in a space between the second semiconductor pattern SP2 and the third semiconductor pattern SP3. The liner layer LIN may be extended from the surface of the second semiconductor pattern SP2 to the surface of the third semiconductor pattern SP3 along a fifth side surface SW5 of the first source/drain pattern SD1.

The interface layer IL of the gate insulating layer GI may be directly formed on the liner layer LIN, contacting the liner layer LIN. The liner layer LIN may be interposed between the interface layer IL and the first source/drain pattern SD1. The liner layer LIN may be interposed between the interface layer IL and the second semiconductor pattern SP2. The liner layer LIN may be interposed between the interface layer IL and the third semiconductor pattern SP3.

According to an example embodiment of the inventive concept, the surface of each of the first to third semiconductor patterns SP1, SP2, and SP3 may be formed to have concavely-recessed regions or dents DE. There may be remnant sacrificial patterns RSA on the surface of each of the first to third semiconductor patterns SP1, SP2, and SP3. The dents DE may be formed when the surfaces of the first to third semiconductor patterns SP1, SP2, and SP3 are partially etched during the afore-described process of removing the sacrificial layers SAL. The remnant sacrificial patterns RSA may be formed when a portion of the sacrificial layer SAL is incompletely removed during the afore-described process of removing the sacrificial layers SAL; that is, the remnant sacrificial patterns RSA may be unremoved portions of the sacrificial layers SAL.

According to an example embodiment of the inventive concept, the liner layer LIN may be formed to cover the surface of each of the first to third semiconductor patterns SP1, SP2, and SP3. In detail, the liner layer LIN may be formed to fill the dents DE and to flatten an uneven surface profile caused by the remnant sacrificial patterns RSA. As a result, a structure covered with the liner layer LIN may have an even surface, compared with the surfaces of the first to third semiconductor patterns SP1, SP2, and SP3.

The liner layer LIN formed on the surface of the semiconductor pattern SP1, SP2, or SP3 may have the same crystalline structure as the semiconductor pattern SP1, SP2, or SP3. For example, the liner layer LIN may have a single crystalline silicon structure, like the semiconductor pattern SP1, SP2, or SP3.

Since the liner layer LIN has the same as the semiconductor pattern SP1, SP2, or SP3 in terms of material and crystalline structure, there may be no observable boundary between the liner layer LIN and the semiconductor pattern SP1, SP2, or SP3, unlike those illustrated in the drawings. For example, the liner layer LIN and the semiconductor pattern SP1, SP2, or SP3 may be connected to form a single semiconductor pattern.

The liner layer LIN may be provided on a top surface of the third semiconductor pattern SP3. The liner layer LIN may be extended from the top surface of the third semiconductor pattern SP3 along an inner side surface of the gate spacer GS or in the third direction D3.

For example, the liner layer LIN may include a first region PA1 covering the top surface of the third semiconductor pattern SP3 and a second region PA2 covering the inner side surface of the gate spacer GS. The first region PA1 of the liner layer LIN may have a different crystalline structure from the second region PA2 of the liner layer LIN. For example, the first region PA1 of the liner layer LIN may have a single crystalline structure, and the second region PA2 of the liner layer LIN may have an amorphous structure. Alternatively, the first region PA1 of the liner layer LIN may have a single crystalline structure, and the second region PA2 of the liner layer LIN may have a polycrystalline structure. This difference in crystalline structures may occur because the second region PA2 of the liner layer LIN is grown from an insulating material (i.e., the gate spacer GS) rather than a single crystalline silicon layer.

Referring to FIGS. 14A to 14D and 15B, the liner layer LIN may be provided on a surface of each of the first to third semiconductor patterns SP1, SP2, and SP3 on the NMOSFET region NR. The liner layer LIN on the NMOSFET region NR may be substantially the same as the liner layer LIN on the PMOSFET region PR previously described with reference to FIG. 15A. The insulating pattern IP may be interposed between the gate insulating layer GI and the liner layer LIN.

Referring back to FIG. 14D, the liner layer LIN may directly cover the top surface of the device isolation layer ST, contacting the top surface of the device isolation layer ST. The liner layer LIN may be interposed between the device isolation layer ST and the gate insulating layer GI. The liner layer LIN covering the top surface of the device isolation layer ST may have an amorphous structure, like the second region PA2 of the liner layer LIN described above, or may have a polycrystalline structure.

Figure 20A:
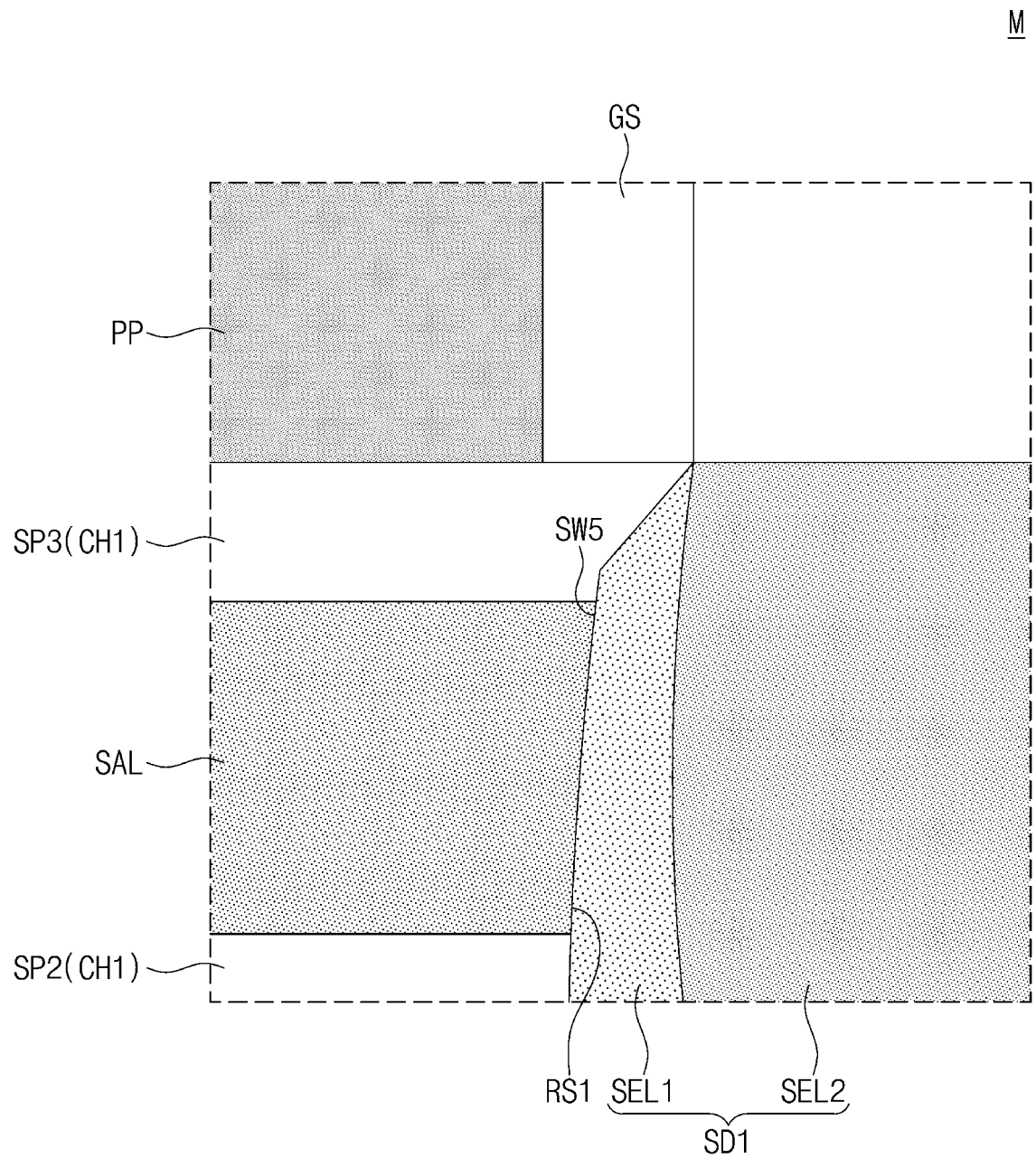
FIGS. 20A, 20B, and 20C are enlarged sectional views illustrating portions M of FIGS. 17A, 18A, and 19A, respectively.
Figure 20B:
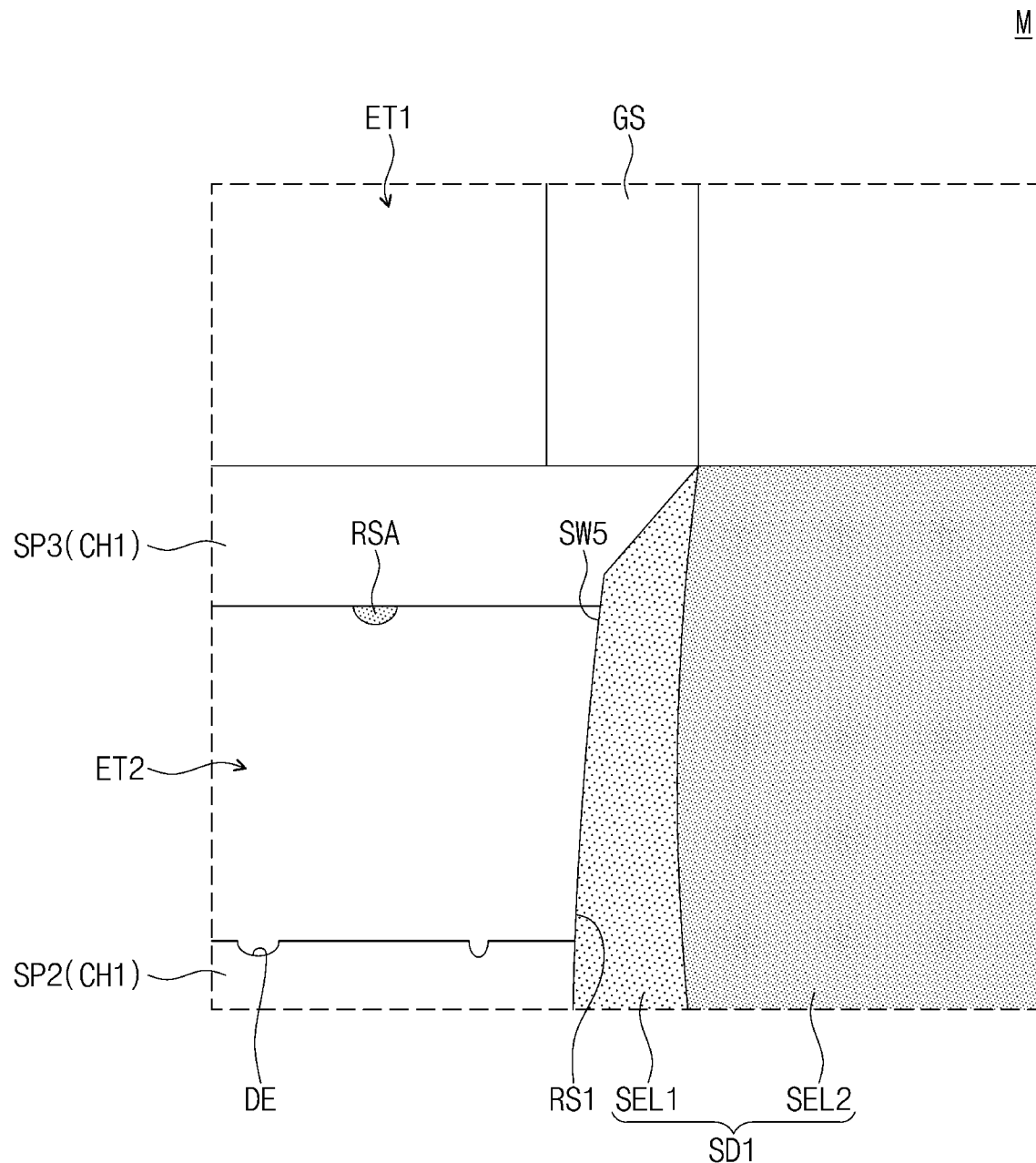
Figure 20C:
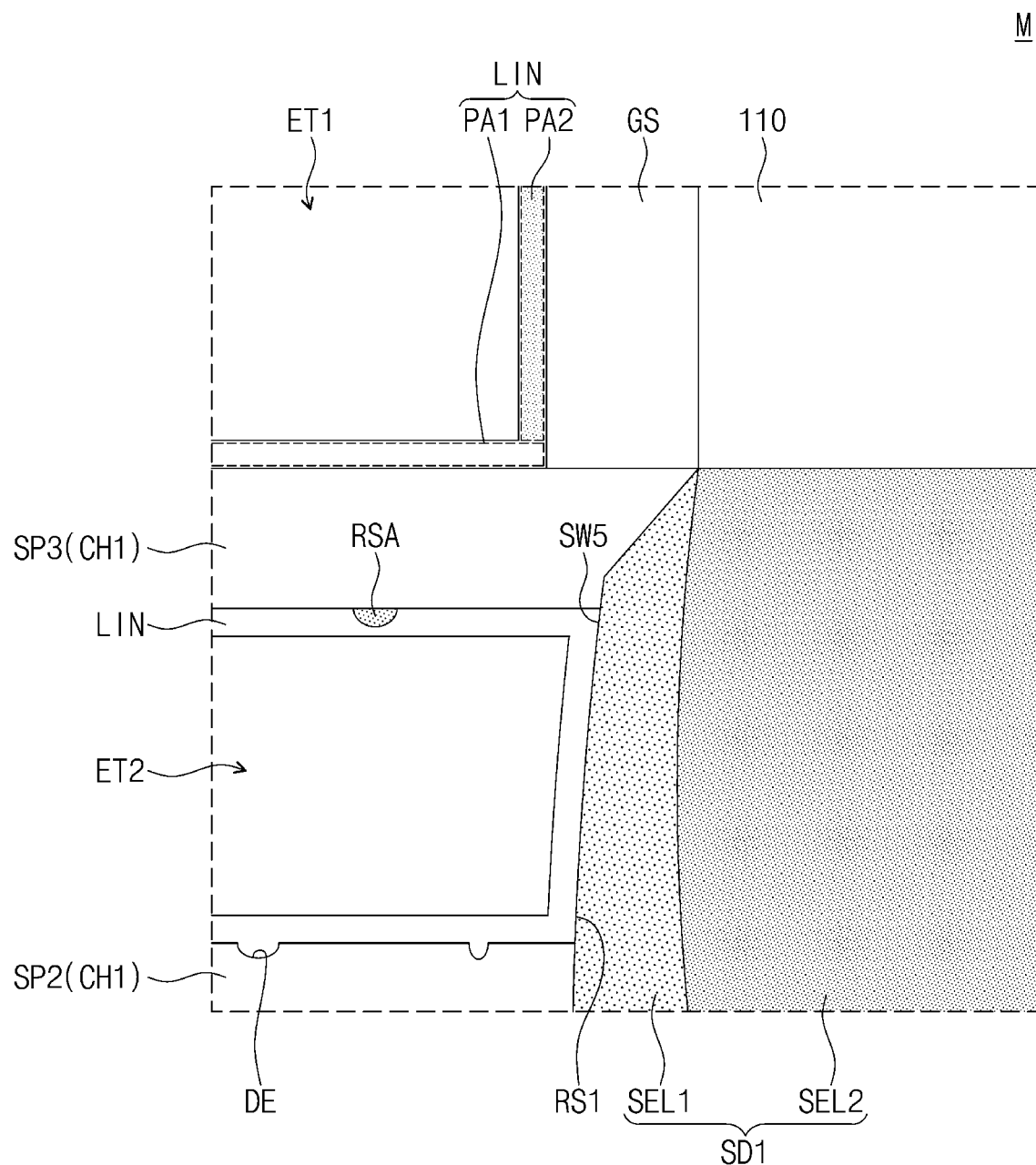

FIGS. 16A to 19D are sectional views illustrating a method of fabricating a semiconductor device according to an example embodiment of the inventive concept. In detail, FIGS. 16A, 17A, 18A, and 19A are sectional views corresponding to the line A-A' of FIG. 1. FIGS. 17B, 18B, and 19B are sectional views corresponding to the line B-B' of FIG. 1. FIGS. 17C, 18C, and 19C are sectional views corresponding to the line C-C' of FIG. 1. FIGS. 16B, 17D, 18D, and 19D are sectional views corresponding to the line D-D' of FIG. 1. FIGS. 20A, 20B, and 20C are enlarged sectional views illustrating portions M of FIGS. 17A, 18A, and 19A, respectively. In the following description, an element or step previously described with reference to FIGS. 4A to 11D may be identified by the same reference number without repeating an overlapping description thereof.

Figure 16A:
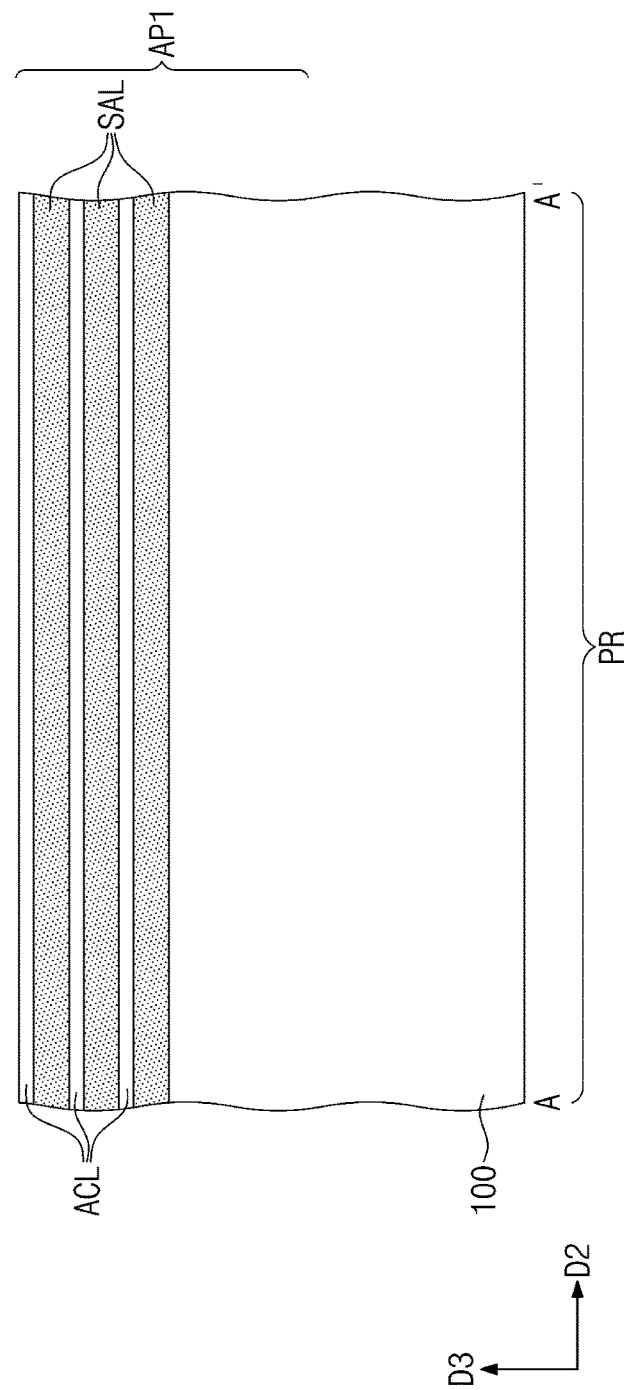
FIGS. 16A, 17A, 18A, and 19A are sectional views corresponding to the line A-A' of FIG. 1, illustrating a method of fabricating a semiconductor device according to an example embodiment of the inventive concept.
Figure 16B:
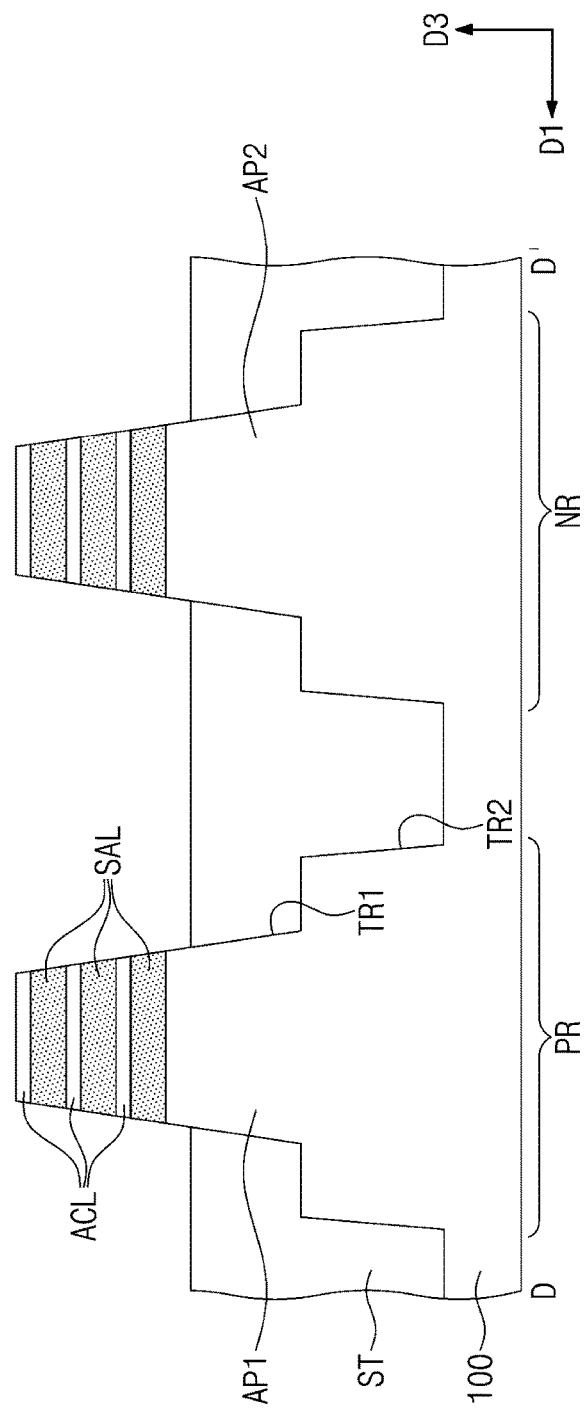
FIGS. 16B, 17D, 18D, and 19D are sectional views corresponding to the line D-D' of FIG. 1, illustrating a method of fabricating a semiconductor device according to an example embodiment of the inventive concept.
Figure 17A:
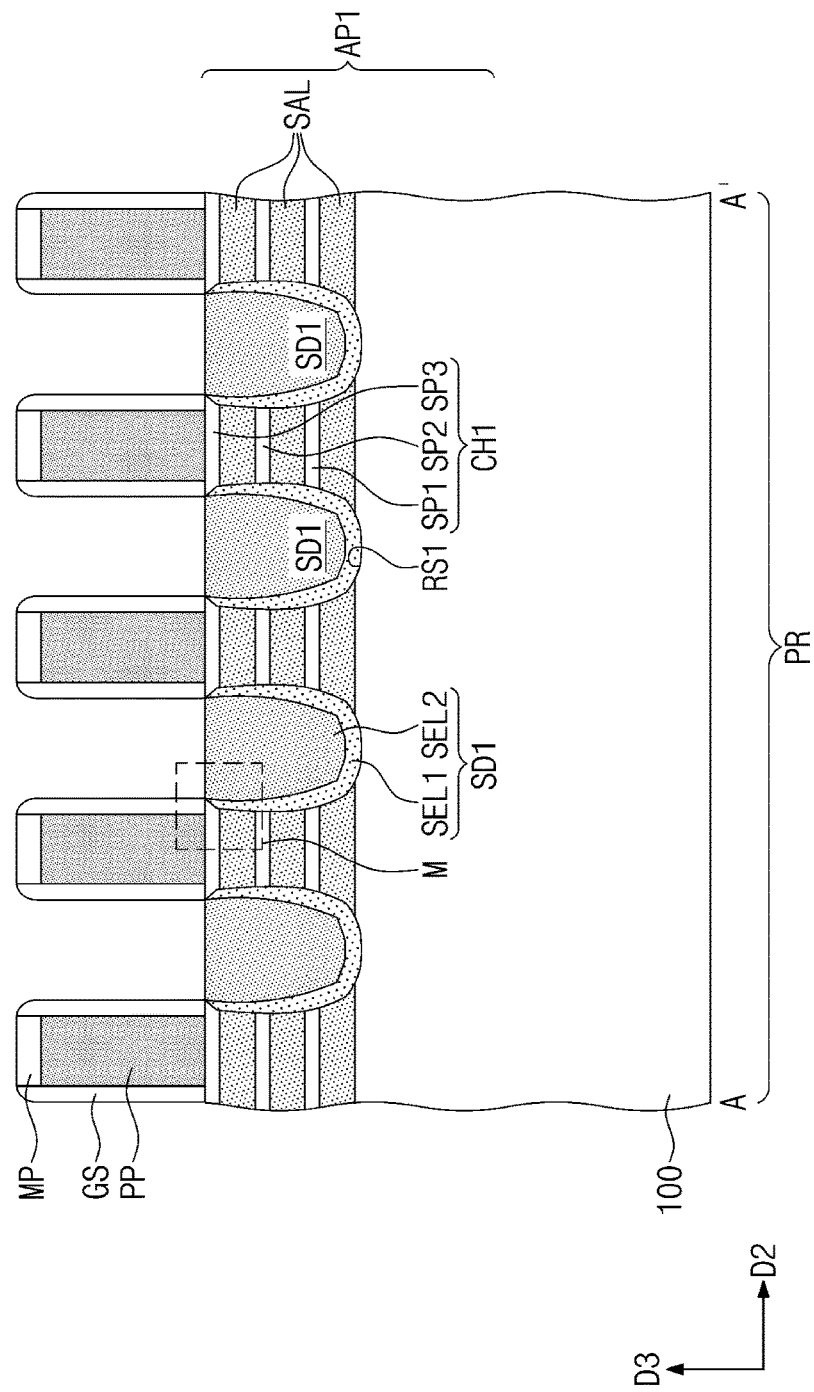
Figure 17B:
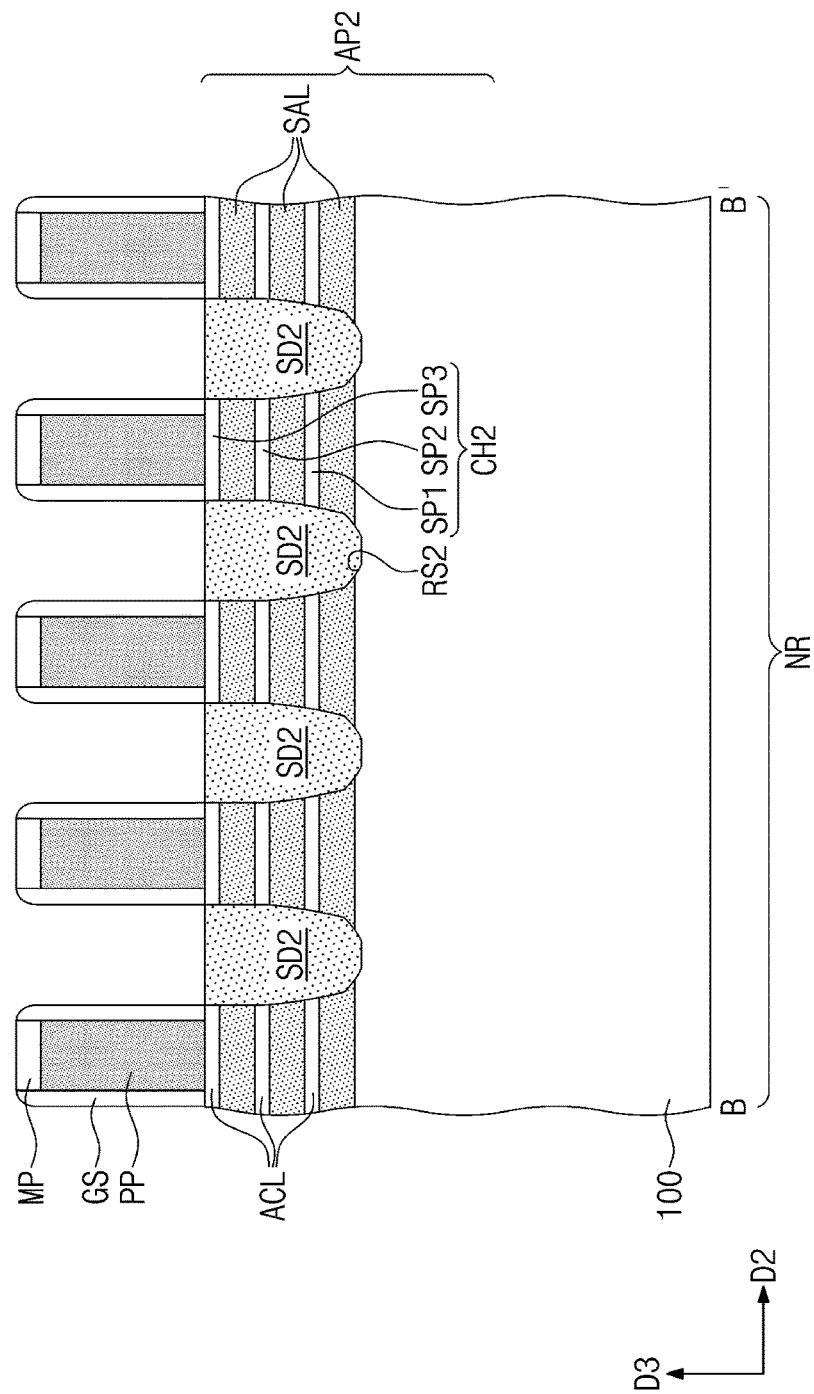
FIGS. 17B, 18B, and 19B are sectional views corresponding to the line B-B' of FIG. 1, illustrating a method of fabricating a semiconductor device according to an example embodiment of the inventive concept.
Figure 17C:
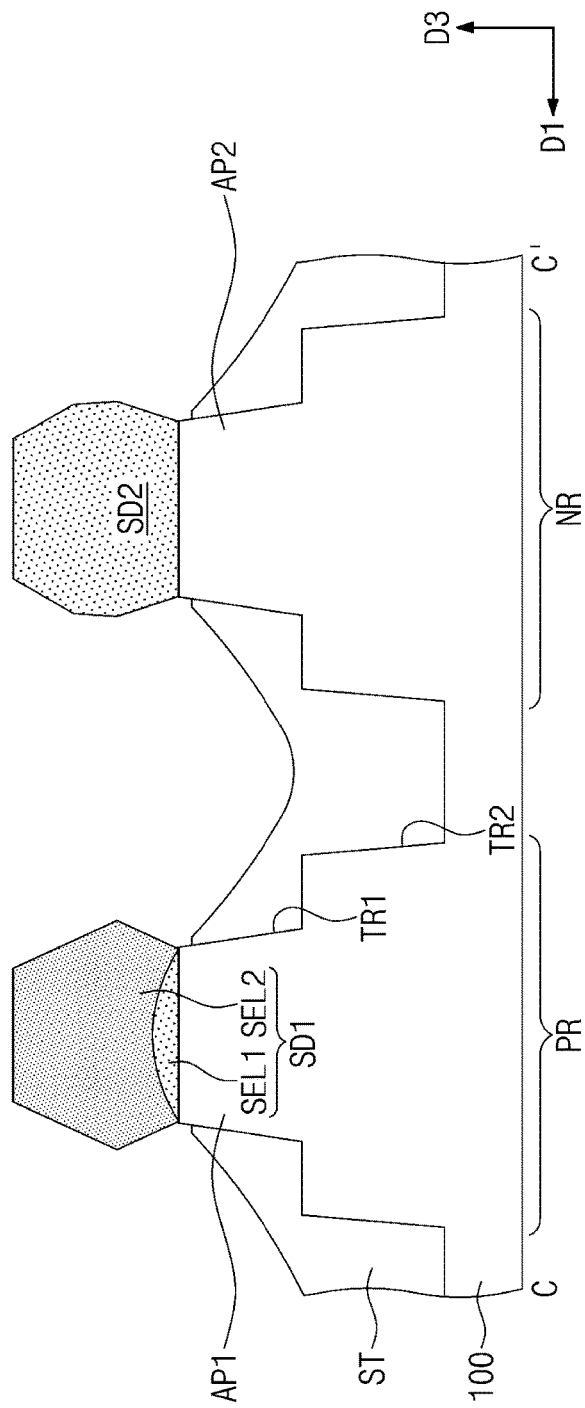
FIGS. 17C, 18C, and 19C are sectional views corresponding to the line C-C' of FIG. 1, illustrating a method of fabricating a semiconductor device according to an example embodiment of the inventive concept.
Figure 17D:
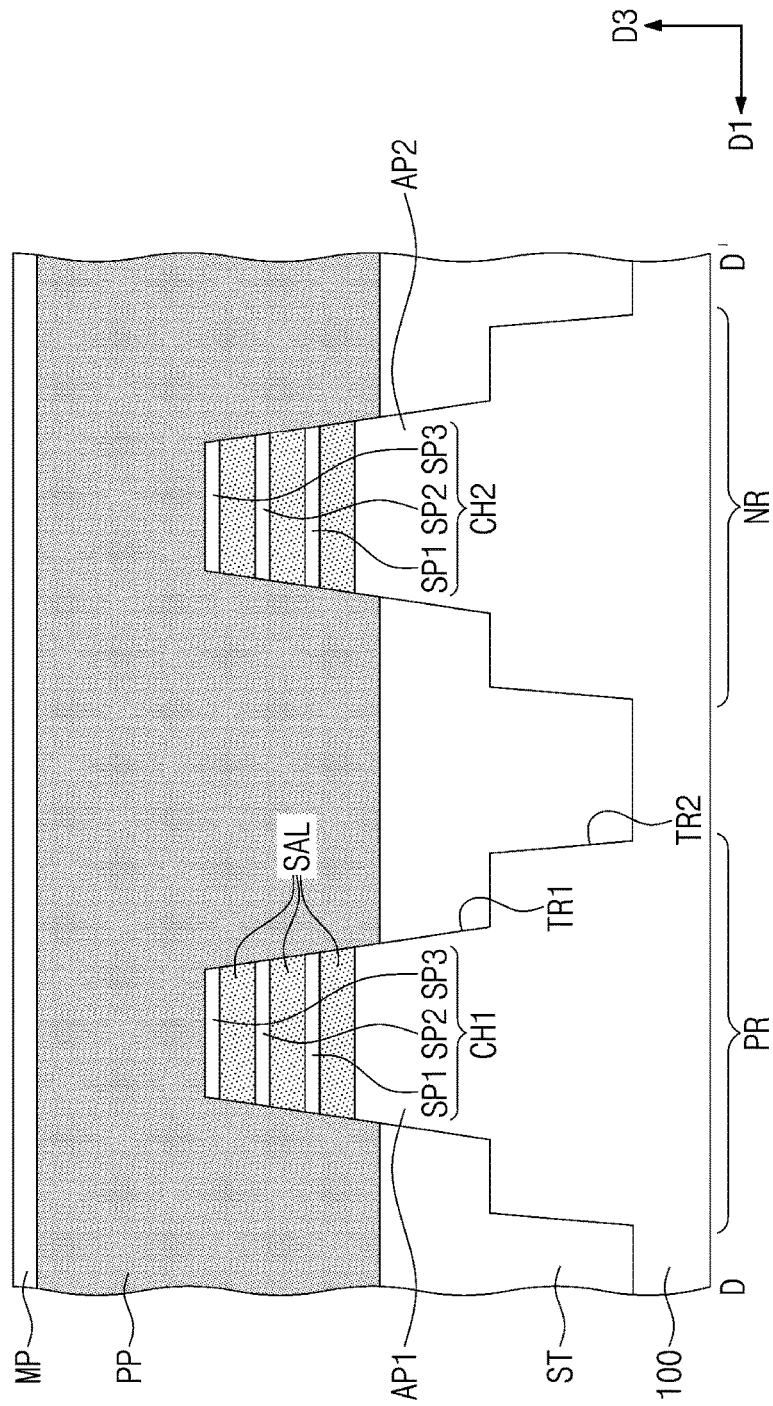
Figure 18A:
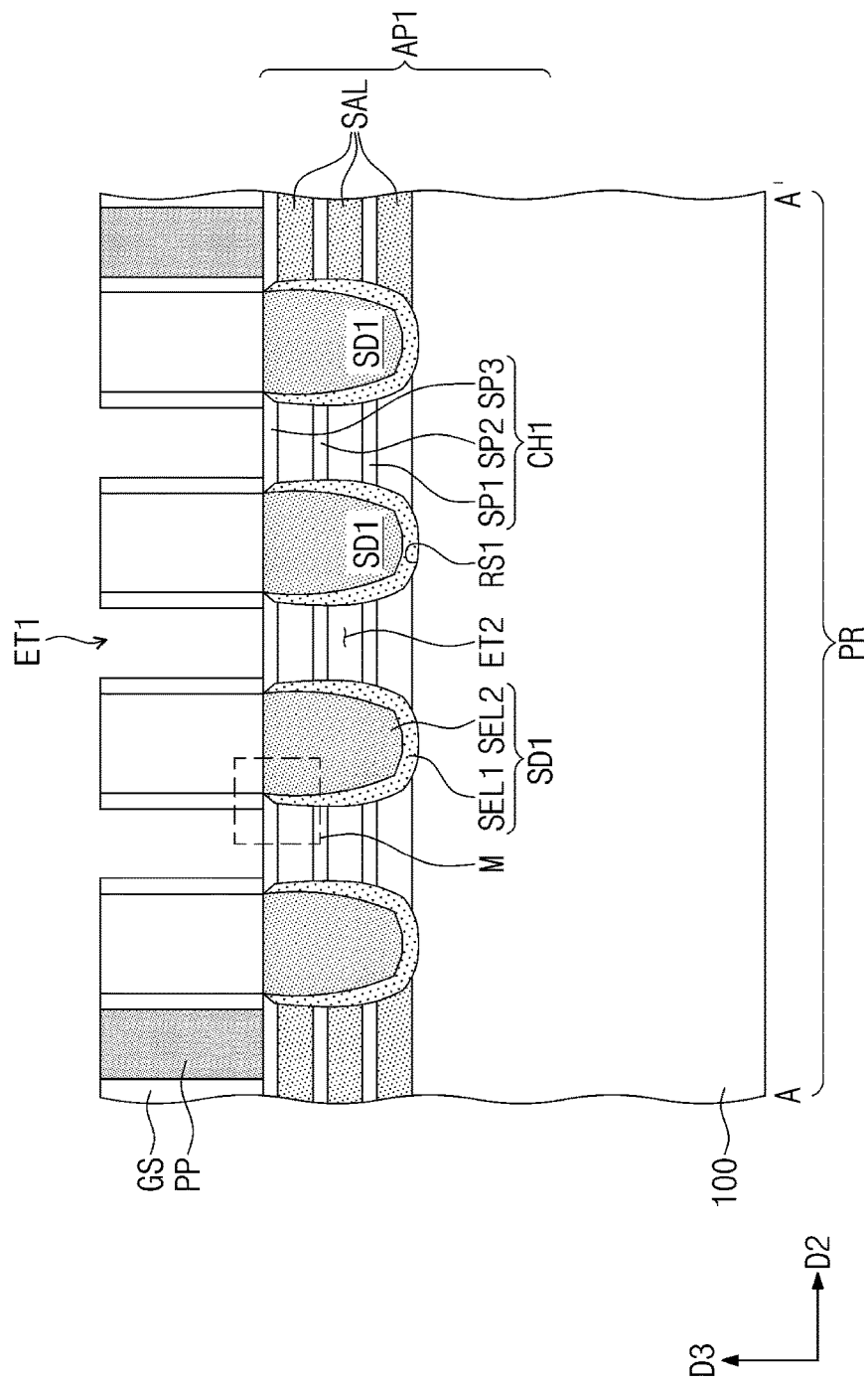
Figure 18B:
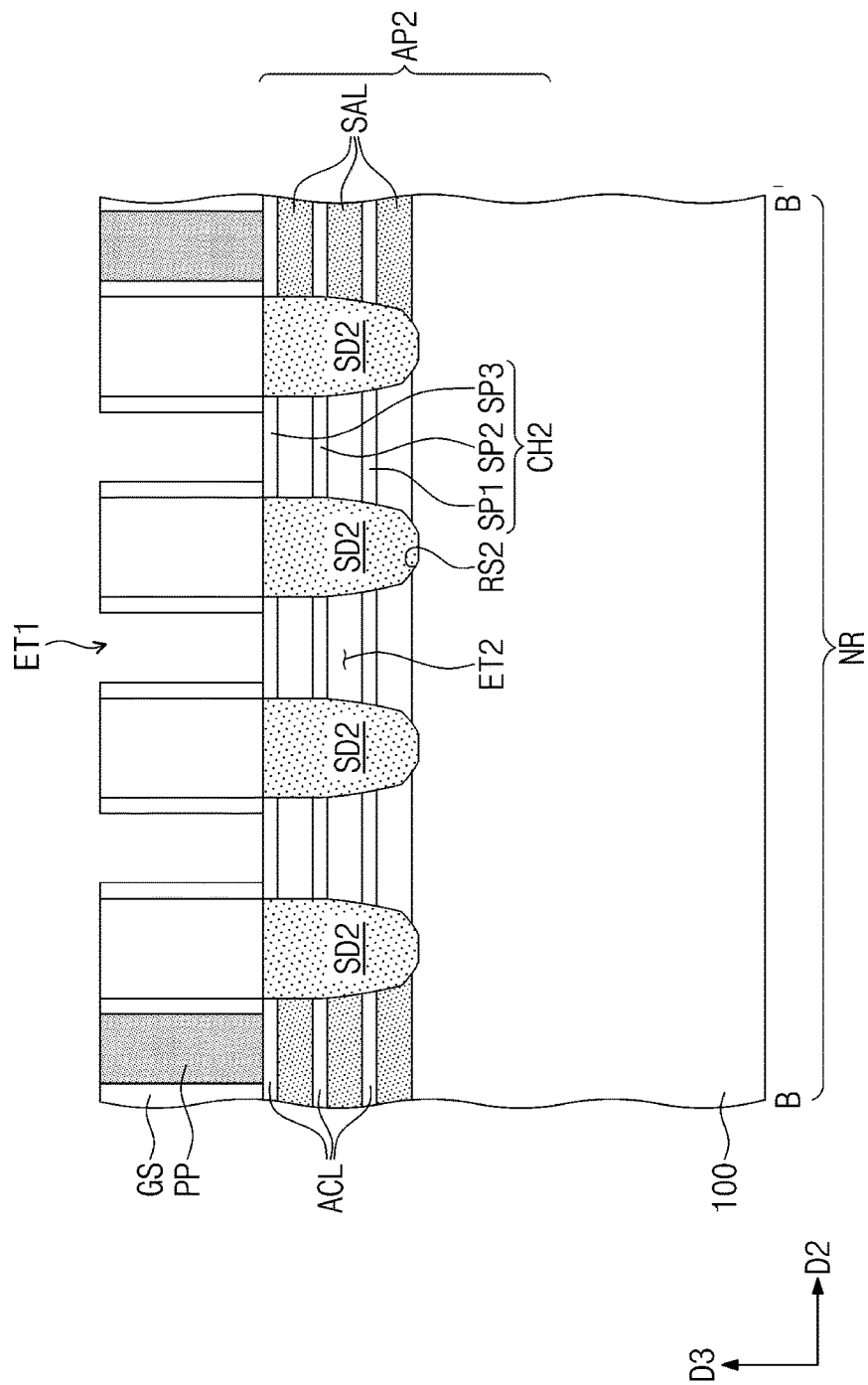
Figure 18C:
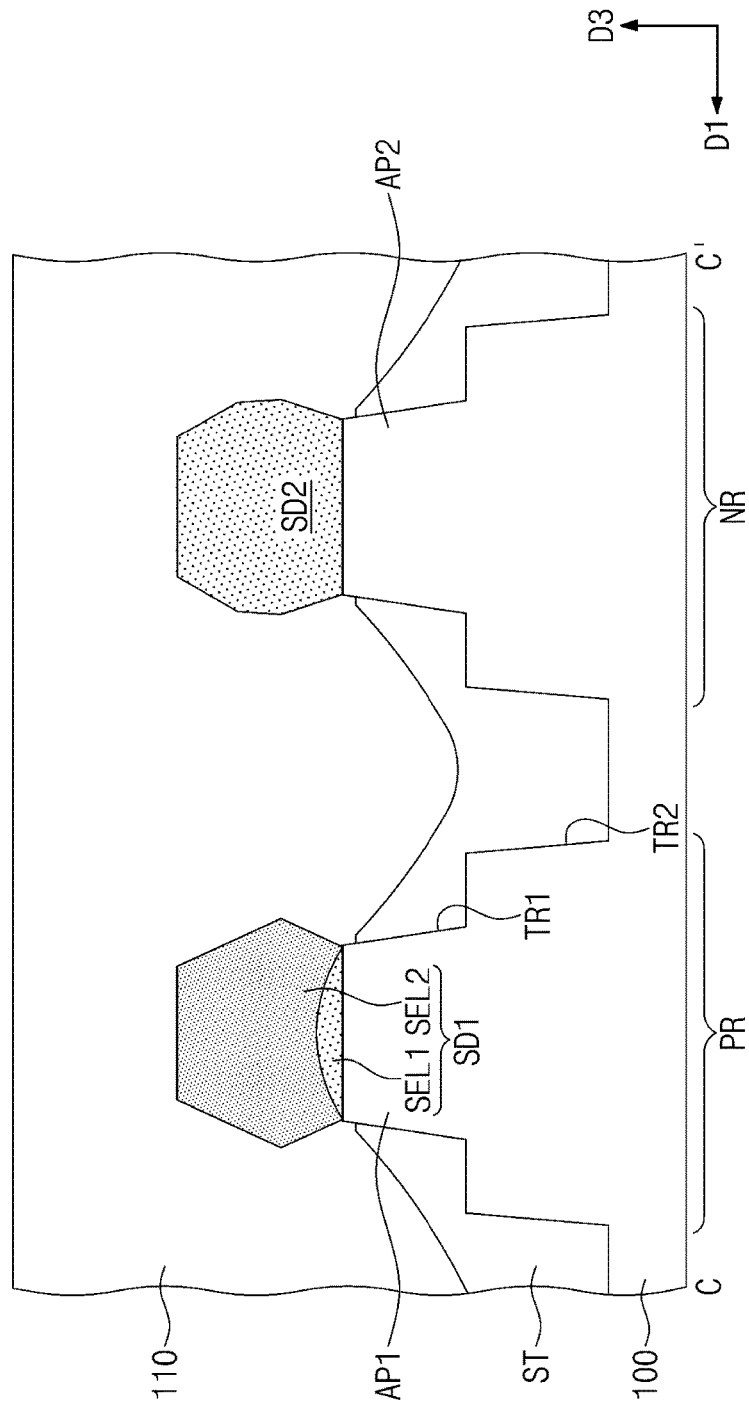
Figure 18D:
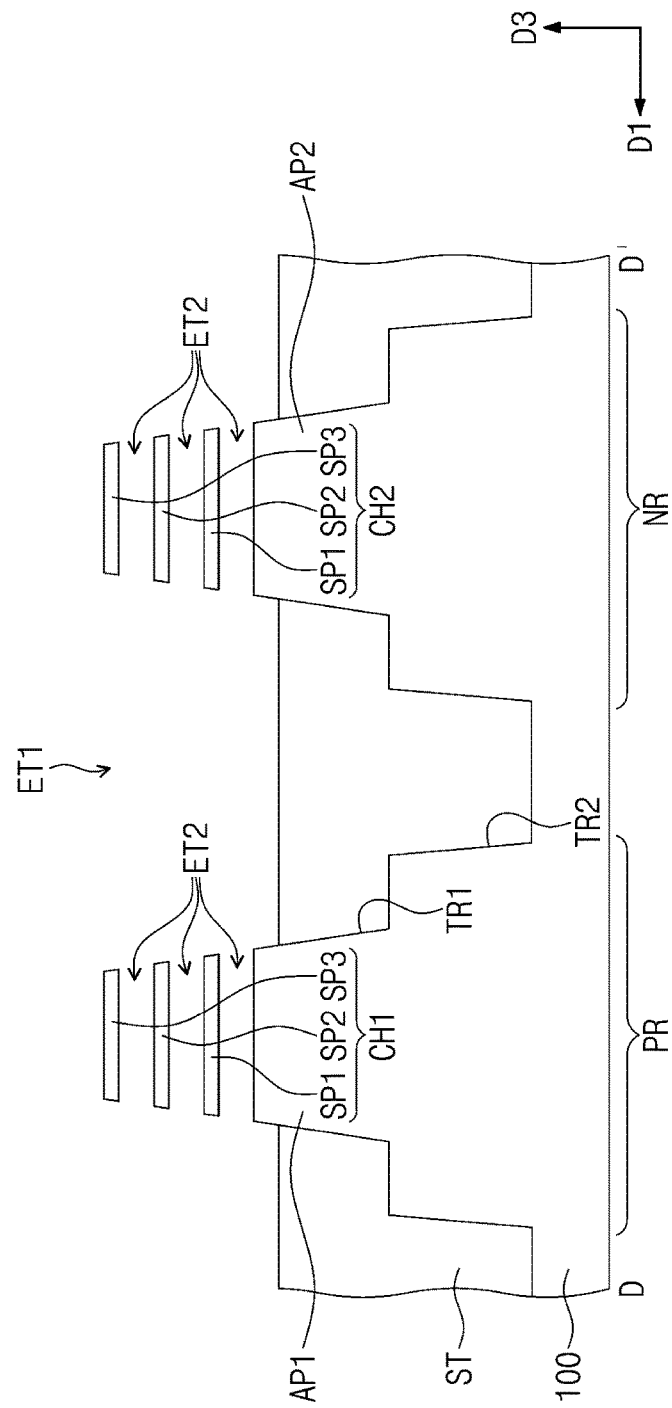
Figure 19A:
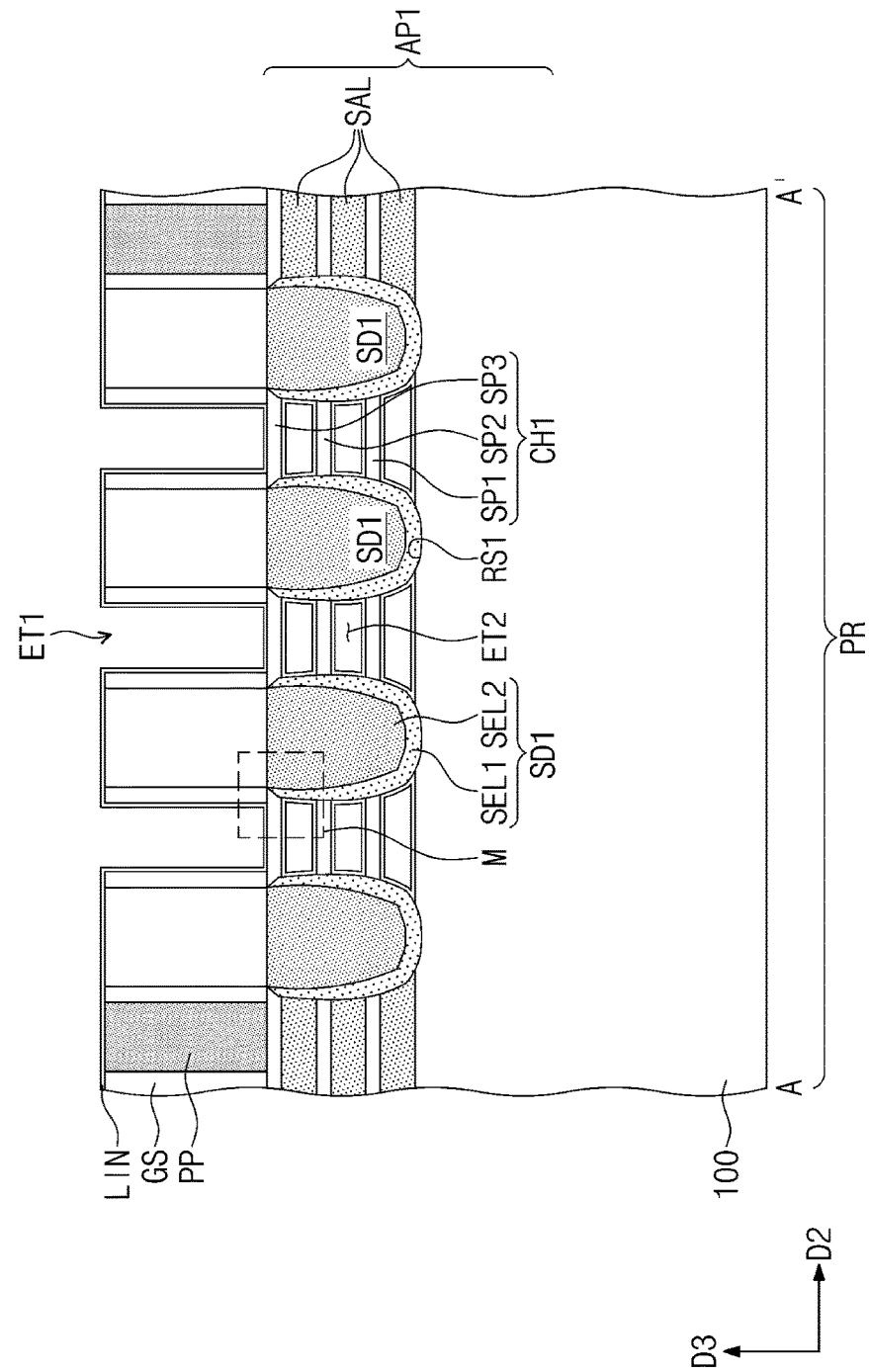
Figure 19B:
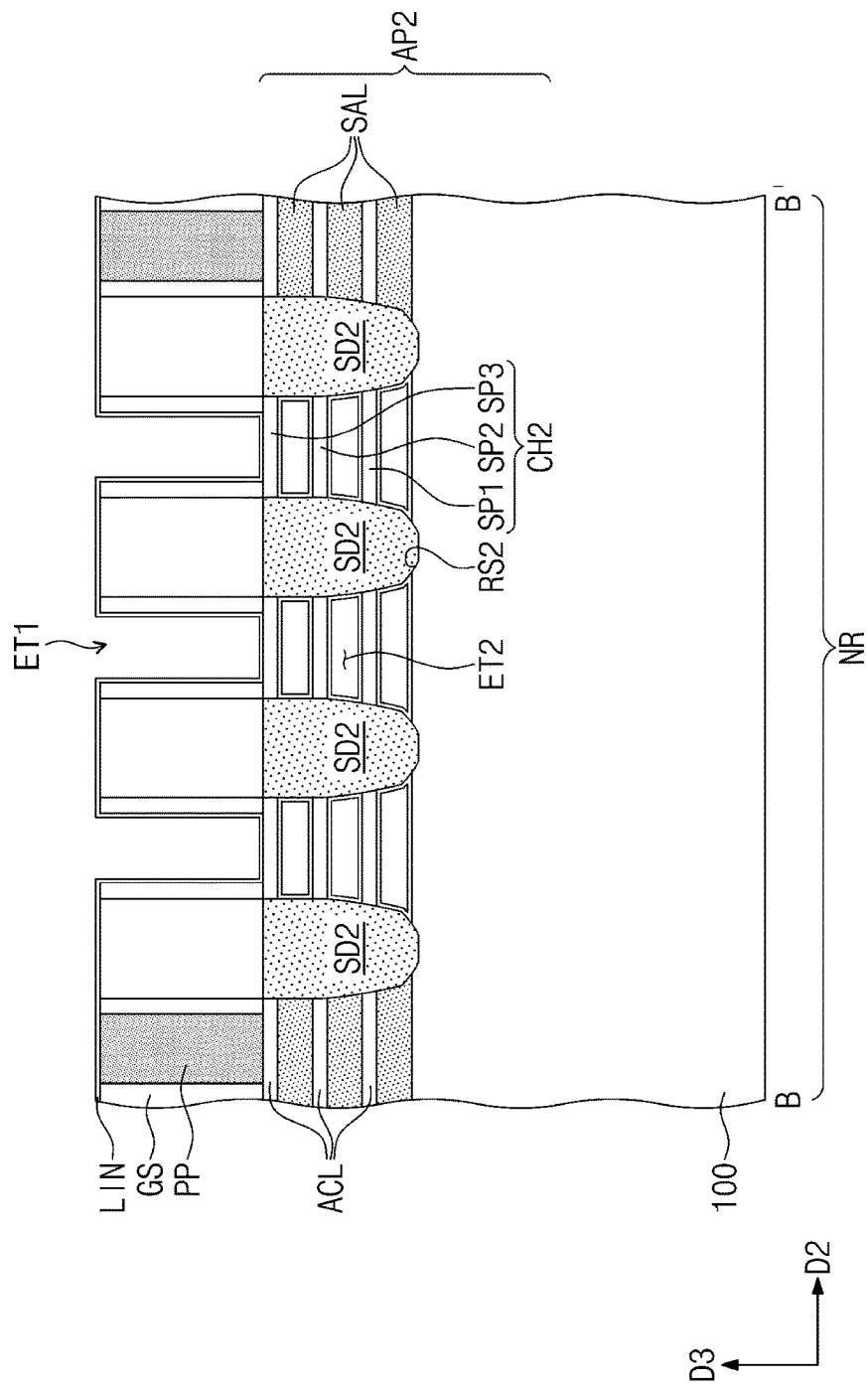
Figure 19C:
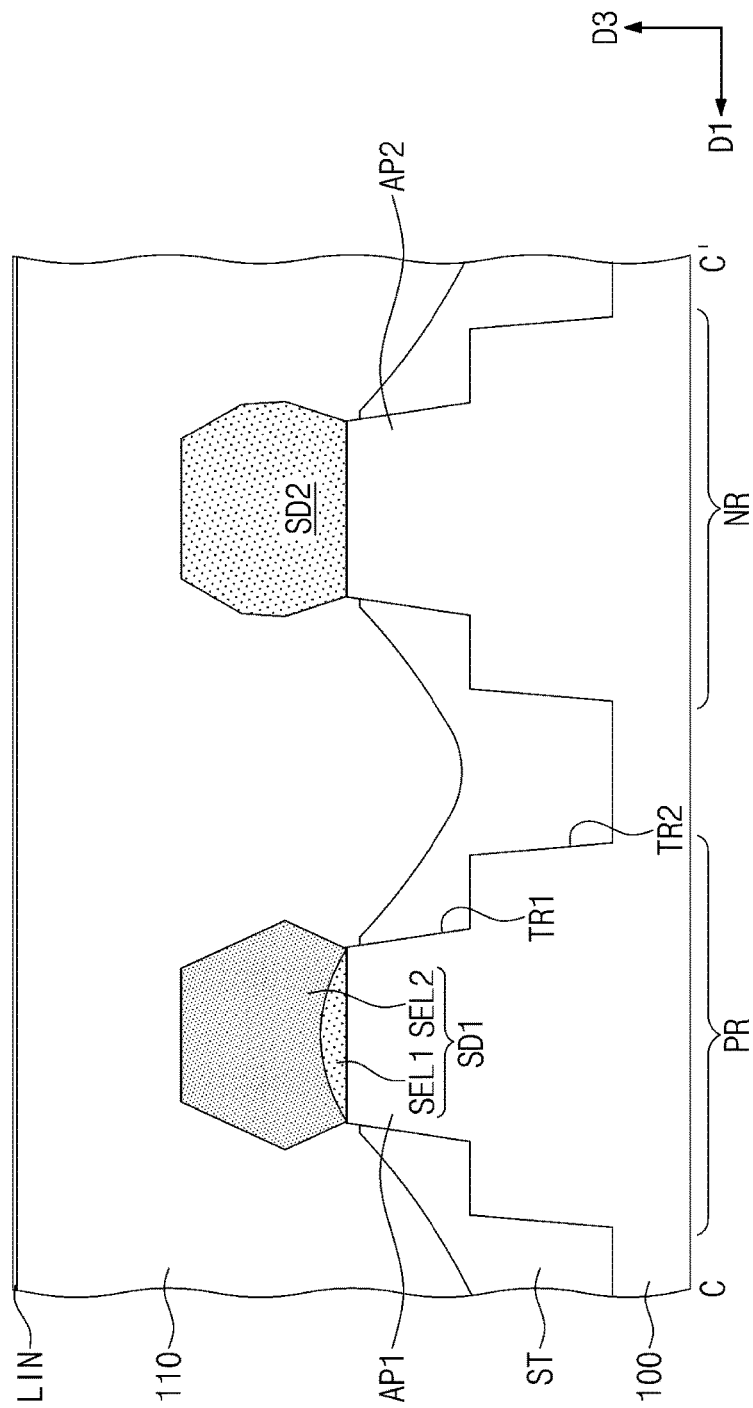
Figure 19D:
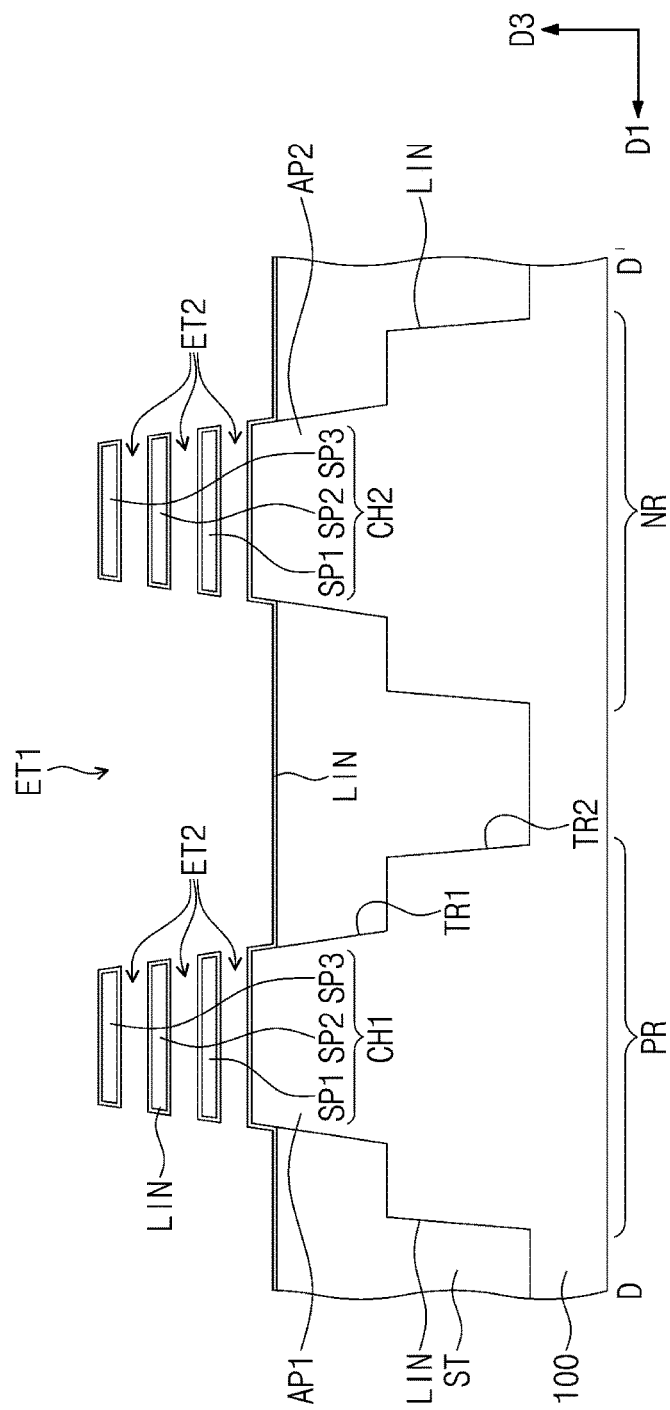

Referring to FIGS. 16A and 16B, the sacrificial layers SAL and the active layers ACL may be alternately formed on the substrate 100. A patterning process may be performed on the substrate 100 to form the first and second active patterns AP1 and AP2 on the PMOSFET and NMOSFET regions PR and NR, respectively. The process of forming the liner layer LIN on the first and second active patterns AP1 and AP2 may be omitted, unlike that described with reference to FIGS. 4A and 4B. Thereafter, the device isolation layer ST may be formed to fill the first and second trenches TR1 and TR2.

According to the present embodiment, the sacrificial layer SAL may be formed to be thicker than the sacrificial layer SAL previously described with reference to FIGS. 4A and 4B. By contrast, the active layer ACL in the present embodiment may be formed to be thinner than the active layer ACL previously described with reference to FIGS. 4A and 4B.

Referring to FIGS. 17A to 17D and 20A, the sacrificial patterns PP may be formed on the substrate 100 to cross the first and second active patterns AP1 and AP2. The first source/drain patterns SD1 may be formed in an upper portion of the first active pattern AP1. The second source/drain patterns SD2 may be formed in an upper portion of the second active pattern AP2.

Referring to FIG. 20A, the sacrificial layer SAL between the second and third semiconductor patterns SP2 and SP3 of the first channel pattern CH1 may cover the fifth side surface SW5 of the first source/drain pattern SD1, contacting the fifth side surface SW5 of the first source/drain pattern SD1.

Referring to FIGS. 18A to 18D and 20B, the first interlayer insulating layer 110 may be formed on the substrate 100. The first interlayer insulating layer 110 may be planarized to expose the top surfaces of the sacrificial patterns PP. The exposed sacrificial patterns PP may be selectively removed to form the first empty spaces ET1 exposing the first and second active patterns AP1 and AP2.

The first empty space ET1 may be formed to expose the sacrificial layers SAL of each of the first and second active patterns AP1 and AP2. The exposed sacrificial layers SAL may be selectively removed through the first empty space ET1. The first to third semiconductor patterns SP1, SP2, and SP3 may not be removed during the removal of the sacrificial layers SAL. That is, as a result of the removal of the sacrificial layers SAL, the second empty spaces ET2 may be formed between the first to third semiconductor patterns SP1, SP2, and SP3.

As described above, the sacrificial layer SAL according to the present embodiment may be formed to have a relatively large thickness. In this case, the sacrificial layer SAL may be more quickly removed by a wet etching process to remove the sacrificial layer SAL. This is because, if the sacrificial layer SAL is thick, an etching material (i.e., an etching solution) for removing the same may be more efficiently supplied into regions between the first to third semiconductor patterns SP1, SP2, and SP3. Since the sacrificial layer SAL according to the present embodiment can be easily and quickly removed, it may be possible to prevent the etching material from being supplied into the second semiconductor layer SEL2, when the etching process is performed in an over-etching manner.

Referring to FIG. 20B, the sacrificial layer SAL between the second and third semiconductor patterns SP2 and SP3 of the first channel pattern CH1 may be removed to form the second empty space ET2. In certain cases, the sacrificial layer SAL may be incompletely removed to form a remnant sacrificial pattern RSA on a surface of the third semiconductor pattern SP3. The remnant sacrificial pattern RSA may be an unremoved portion of the sacrificial layer SAL.

In the case where germanium in the sacrificial layer SAL is diffused into the second semiconductor pattern SP2, at least a portion of the second semiconductor pattern SP2 near the sacrificial layer SAL may have a relatively high germanium concentration (e.g., higher than 5 at %). In this case, the portion of the second semiconductor pattern SP2 may be also removed during the process of removing the sacrificial layer SAL. As a result, dents DE may be formed on a surface of the second semiconductor pattern SP2, as shown in FIG. 20B. Both of the remnant sacrificial pattern RSA and the dent DE may lead to deterioration in electric characteristics of the first channel pattern CH1.

Referring to FIGS. 19A to 19D and 20C, the liner layer LIN may be formed by an epitaxial growth process on the substrate 100. The liner layer LIN may partially fill the first empty space ET1. The liner layer LIN may partially fill each of the second empty spaces ET2. The liner layer LIN may be formed of or may include the same materials (e.g., silicon (Si)) as the first to third semiconductor patterns SP1, SP2, and SP3. The liner layer LIN may be formed to a thickness of 1 nm to 4 nm.

Referring to FIG. 20C, the liner layer LIN formed in the first empty space ET1 may include the first region PA1 covering the top surface of the third semiconductor pattern SP3 and the second region PA2 covering the inner side surface of the gate spacer GS. The first region PA1 may be grown depending on the crystalline structure of the third semiconductor pattern SP3, and the second region PA2 may be grown on the gate spacer GS, which is an insulating layer, to have an amorphous structure.

The liner layer LIN formed in the second empty space ET2 may uniformly cover the surface of each of the second and third semiconductor patterns SP2 and SP3. There may be the remnant sacrificial pattern RSA and the dent DE on the surfaces of the second and third semiconductor patterns SP2 and SP3, as previously described with reference to FIG. 20B, and the liner layer LIN may be formed to cover them.

As a result, the liner layer LIN may be used to cure defects in the semiconductor pattern SP1, SP2, or SP3. Due to the presence of the remnant sacrificial pattern RSA and the dent DE, the semiconductor pattern SP1, SP2, or SP3 may have a relatively high surface roughness. However, according to an example embodiment of the inventive concept, since the liner layer LIN is formed to cover the rough surface of the semiconductor pattern SP1, SP2, or SP3 caused by the remnant sacrificial pattern RSA or the dent DE, a surface roughness of the liner layer LIN may be lowered, compared to the original rough surface of the semiconductor pattern SP1, SP2, or SP3. Furthermore, the semiconductor pattern SP1, SP2, or SP3 in the present embodiment may be formed to have a relatively small thickness, but due to an increase in thickness caused by the liner layer LIN, it may be possible to prevent a channel resistance from being increased. As a result, the electric characteristics of the semiconductor device may be improved.

Subsequent processes may be performed in the same manner as those described with reference to FIGS. 11A to 11D.

In a method of fabricating a semiconductor device according to an example embodiment of the inventive concept, it may be possible to effectively prevent a source/drain pattern from being removed in a process of forming a space, which will be filled with a gate electrode, around a channel. As a result, the reliability of the semiconductor device may be improved. Furthermore, it may be possible to improve an improved surface property of stacked channel patterns and thereby to improve electric characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
    forming an active pattern including sacrificial layers and active layers that are alternately stacked on a substrate in a vertical direction;
    forming a liner layer on the active pattern;
    forming a recess in an upper portion of the active pattern;
    forming a first semiconductor layer in the recess by performing a first selective epitaxial growth process, the first semiconductor layer being grown using the active layers and the liner layer as seed layers; and
    forming a second semiconductor layer in the recess by performing a second selective epitaxial growth process.

2. The method of claim 1,
    wherein the liner layer includes at least one of silicon (Si), germanium (Ge), or silicon-germanium (SiGe), and
    wherein the liner layer is doped with an impurity including B, P, C, Ga, O, or N.

3. The method of claim 1, wherein the liner layer is formed by performing an epitaxial growth process on the active pattern.

4. The method of claim 1, further comprising:
    forming a sacrificial pattern on the active pattern;
    selectively removing the sacrificial pattern;
    selectively removing the liner layer;
    selectively removing the sacrificial layers; and
    forming a gate electrode in a space where the sacrificial layers and the sacrificial pattern are removed.

5. The method of claim 4, wherein a portion of the liner layer remains as a remnant semiconductor pattern.

6. The method of claim 5, further comprising:
    forming a gate spacer on a sidewall of the sacrificial pattern,
    wherein the remnant semiconductor pattern is interposed between the gate spacer and the first semiconductor layer.

7. The method of claim 1, wherein the first semiconductor layer and the second semiconductor layer form a source/drain pattern.

8. The method of claim 1,
    wherein the first and second semiconductor layers include silicon-germanium (SiGe), and
    wherein a germanium concentration of the second semiconductor layer is higher than a germanium concentration of the first semiconductor layer.

9. The method of claim 8,
    wherein the germanium concentration of the first semiconductor layer ranges from 0 at % to 10 at %, and
    wherein the germanium concentration of the second semiconductor layer ranges from 30 at % to 70 at %.

10. The method of claim 1, wherein the first semiconductor layer has a 'U'-shaped section resembling a profile of the recess.

11. A method of fabricating a semiconductor device, the method comprising:
    forming an active pattern including a sacrificial layer and an active layer that are stacked on a substrate;
    forming a sacrificial pattern on the active pattern;

forming a recess in an upper portion of the active pattern;

forming a source/drain pattern in the recess;

selectively removing the sacrificial pattern to form a first empty space;

selectively removing the sacrificial layer to form a second empty space;

forming a liner layer in the second empty space by performing an epitaxial growth process; and forming a gate electrode in the first and second empty spaces.

12. The method of claim 11, wherein the liner layer covers the active layer and the source/drain pattern that are exposed by the second empty space.

13. The method of claim 12, wherein a remnant sacrificial pattern and a dent are formed on a surface of the active layer, by removing the sacrificial layer, and wherein the liner layer covers the remnant sacrificial pattern and the dent.

14. The method of claim 11, wherein the liner layer is formed to lower a surface roughness of the active layer.

15. The method of claim 11, wherein the liner layer is formed to increase a thickness of the active layer, thereby increasing a thickness of a channel.

16. The method of claim 11, wherein the liner layer includes substantially the same material as the active layer.

17. The method of claim 11, wherein the liner layer has substantially the same crystalline structure as the active layer.

18. The method of claim 11, further comprising:

forming a gate spacer on a sidewall of the sacrificial pattern, wherein the liner layer includes a first region covering the active layer and a second region covering the gate spacer, and wherein the first region of the liner layer has a different crystalline structure from the second region of the liner layer.

19. The method of claim 11, further comprising:

forming a gate insulating layer on the liner layer, wherein the gate electrode is formed on the gate insulating layer.

20. The method of claim 11, wherein the gate electrode is formed to surround the active layer.

* * * * *